(12) United States Patent
Park et al.

(10) Patent No.: US 7,069,378 B2
(45) Date of Patent: *Jun. 27, 2006

(54) MULTI-BANK CONTENT ADDRESSABLE MEMORY (CAM) DEVICES HAVING STAGED SEGMENT-TO-SEGMENT SOFT AND HARD PRIORITY RESOLUTION CIRCUITS THEREIN AND METHODS OF OPERATING SAME

(75) Inventors: Kee Park, San Jose, CA (US); Scott Yu-Fan Chu, Cupertino, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 232 days.

This patent is subject to a terminal disclaimer.

(21) Appl. No.: 10/263,258

(22) Filed: Oct. 2, 2002

(65) Prior Publication Data
US 2004/0015652 A1 Jan. 22, 2004

Related U.S. Application Data

(60) Provisional application No. 60/397,639, filed on Jul. 22, 2002.

(51) Int. Cl.
*G06F 12/00* (2006.01)
(52) U.S. Cl. ............................ 711/108; 711/158; 365/49
(58) Field of Classification Search ................ 711/108, 711/158; 365/49
See application file for complete search history.

(56) References Cited

U.S. PATENT DOCUMENTS

| 5,930,359 | A | * | 7/1999 | Kempke et al. ............ 713/160 |
| 6,493,793 | B1 | | 12/2002 | Pereira et al. ............. 711/108 |
| 6,499,081 | B1 | | 12/2002 | Nataraj et al. ............. 711/108 |
| 6,687,785 | B1 | | 2/2004 | Pereira ...................... 711/108 |
| 6,697,276 | B1 | * | 2/2004 | Pereira et al. ................ 365/49 |
| 6,697,912 | B1 | | 2/2004 | Akkary ...................... 711/108 |
| 6,748,484 | B1 | * | 6/2004 | Henderson et al. ......... 711/108 |
| 6,763,426 | B1 | * | 7/2004 | James et al. ............... 711/108 |
| 2002/0161969 | A1 | * | 10/2002 | Nataraj et al. ............. 711/108 |
| 2003/0005146 | A1 | | 1/2003 | Miller et al. ............... 709/238 |

OTHER PUBLICATIONS

Miller et al., "Content Addressable Memory Array Having Flexible Priority Support," U.S. Appl. No. 09/884,797, filed Jun. 18, 2001.
Park et al., "Multi-Bank Content Addressable Memory (CAM) Devices Having Segment-Based Priority Resolution Circuits Therein and Methods of Operating Same," U.S. Appl. No. To Be Assigned, filed Oct. 2, 2002.

* cited by examiner

*Primary Examiner*—Woo H. Choi
(74) *Attorney, Agent, or Firm*—Myers Bigel Sibley & Sajovec PA

(57) ABSTRACT

Content addressable memory (CAM) devices use both hard and soft priority techniques to allocate entries of different priority therein. The allocation of entries may change in response to additions or deletions of entries or as entries are reprioritized. The CAM devices include priority resolution circuits that can resolve competing soft and hard priorities between multiple hit signals that are generated in response to a search operation. Such hit signals may be active to reflect the presence of at least one matching entry within a CAM array block. The resolution of which active hit signal has the highest overall priority among many can be used to facilitate the identification of the location (e.g., array address and row address) of a highest priority matching entry within the entire CAM device. A priority resolution circuit may also resolve competing hard priorities between two or more active hit signals having equivalent soft priority.

17 Claims, 30 Drawing Sheets

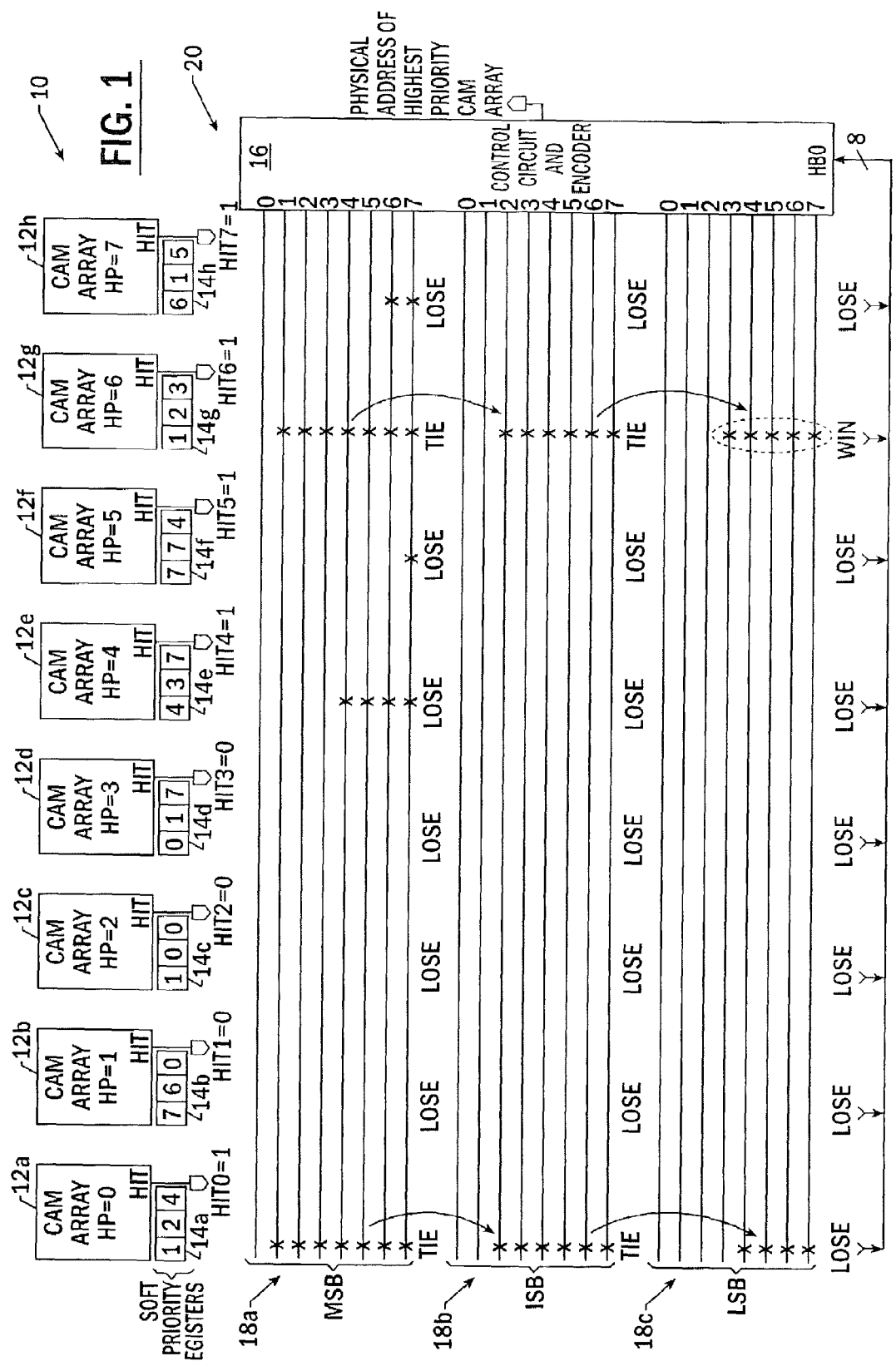

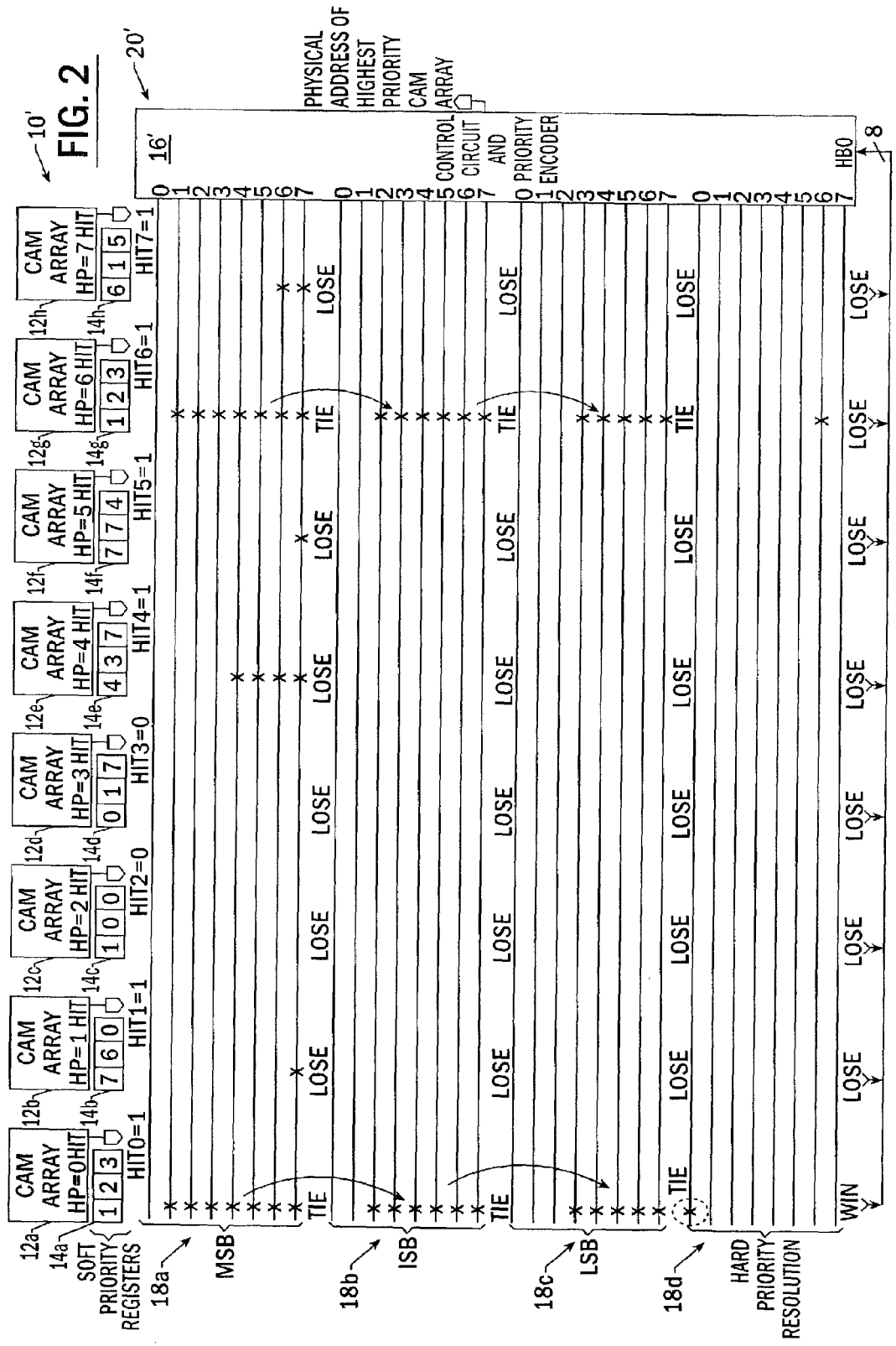

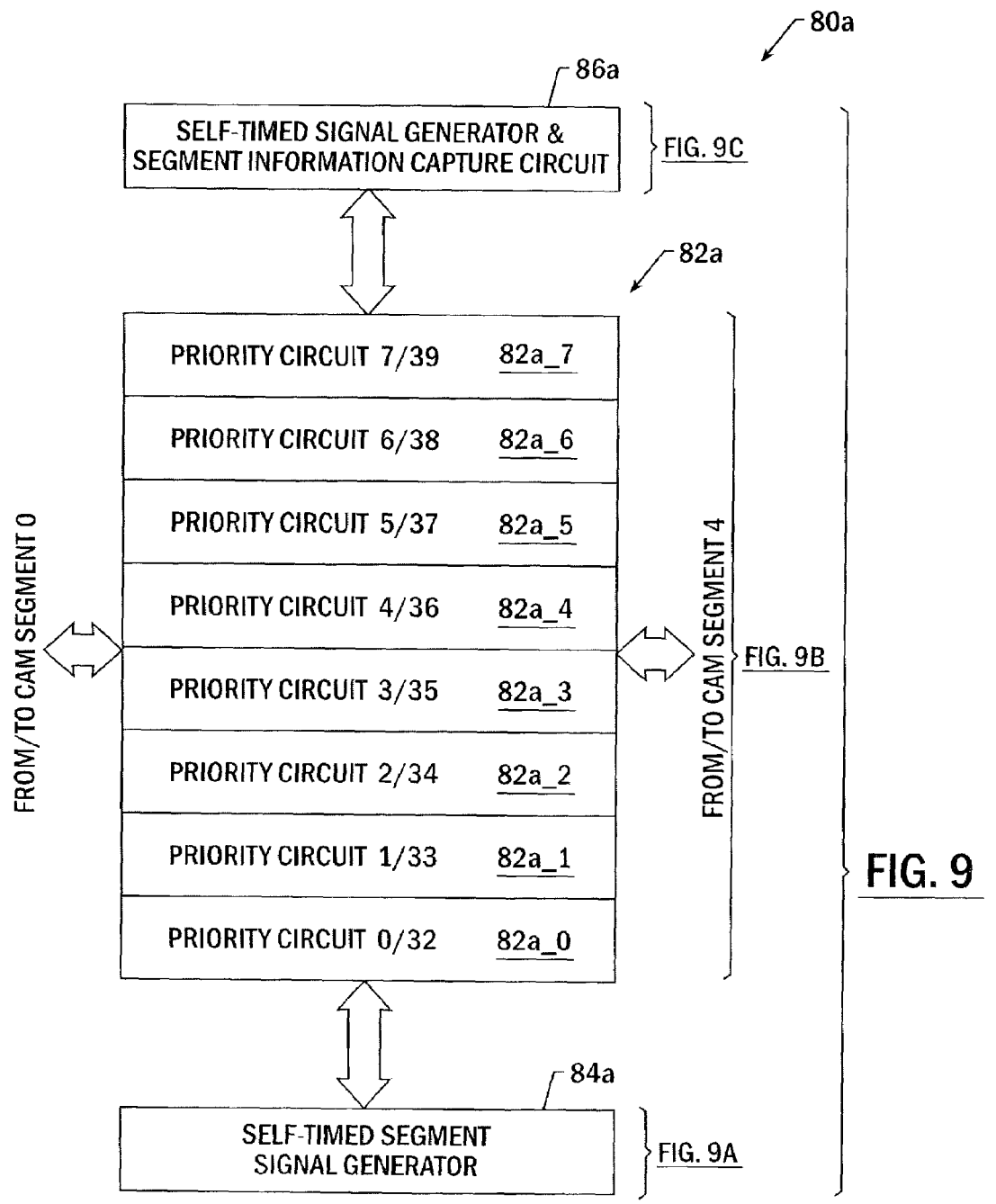

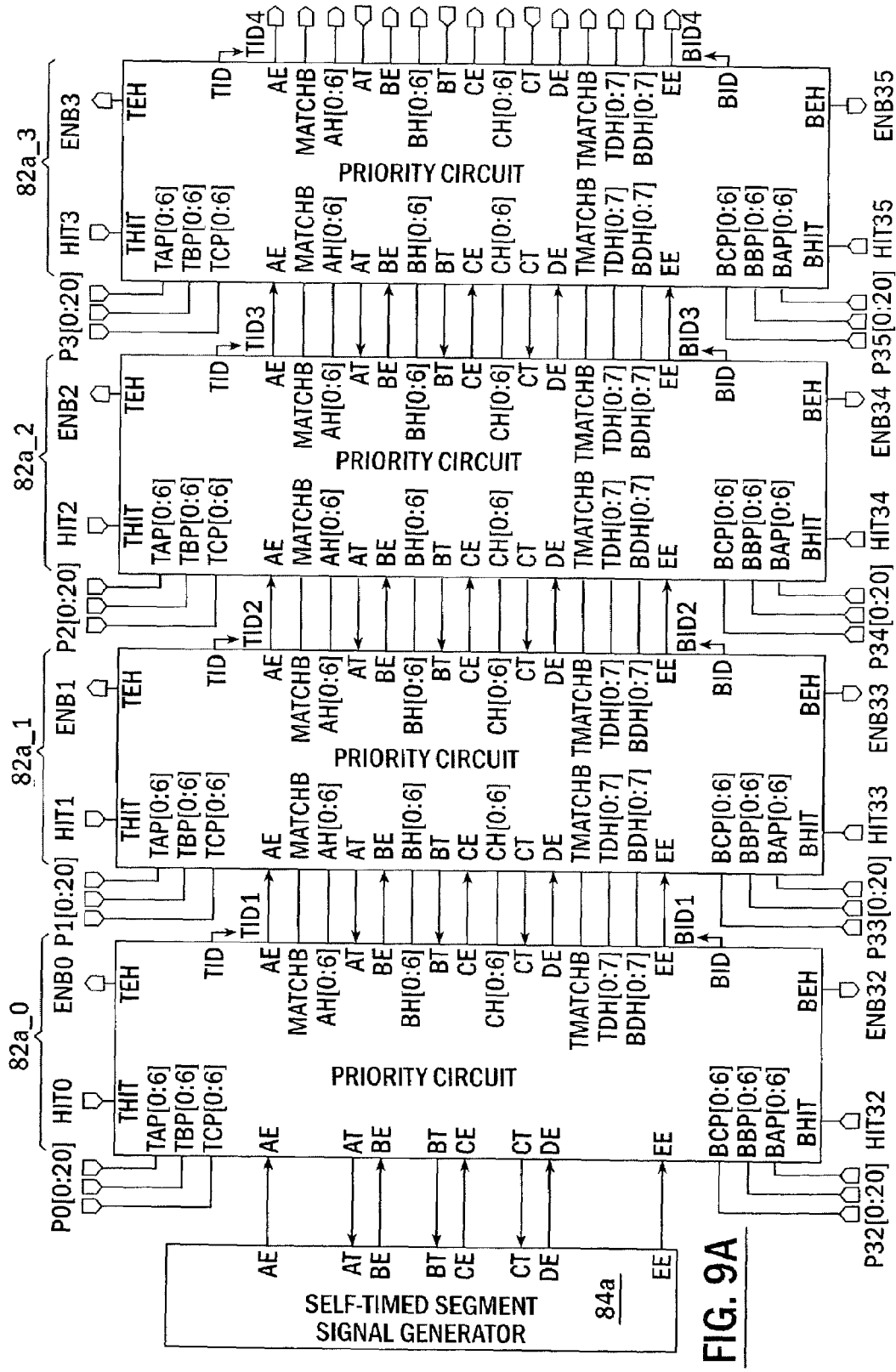

MULTI-BANK CONTENT ADDRESSABLE MEMORY (CAM) DEVICES HAVING STAGED SEGMENT-TO-SEGMENT SOFT AND HARD PRIORITY RESOLUTION CIRCUITS THEREIN AND METHODS OF OPERATING SAME

REFERENCE TO PRIORITY APPLICATION

This application claims priority to U.S. Provisional Application Ser. No. 60/397,639, filed Jul. 22, 2002, the disclosure of which is hereby incorporated herein by reference.

FIELD OF THE INVENTION

The present invention relates to integrated circuit memory devices and, more particularly, to content addressable memory (CAM) devices and methods of operating same.

BACKGROUND OF THE INVENTION

In many memory devices, including random access memory (RAM) devices, data is typically accessed by supplying an address to an array of memory cells and then reading data from the memory cells that reside at the supplied address. However, in content addressable memory (CAM) devices, data within a CAM array is not accessed by initially supplying an address, but rather by initially applying data (e.g., search words) to the array and then performing a search operation to identify one or more entries within the CAM array that contain data equivalent to the applied data and thereby represent a "match" condition. In this manner, data is accessed according to its content rather than its address. Upon completion of the search operation, the identified location(s) containing the equivalent data is typically encoded to provide an address (e.g., block address+row address within a block) at which the matching entry is located. If multiple matching entries are identified in response to the search operation, then local priority encoding operations may be performed to identify a location of a best or highest priority matching entry. Such priority encoding operations frequently utilize the relative physical locations of multiple matching entries within the CAM array to identify a highest priority matching entry. An exemplary CAM device that utilizes a priority encoder to identify a highest priority matching entry is disclosed in commonly assigned U.S. Pat. No. 6,370,613 to Diede et al., entitled "Content Addressable Memory with Longest Match Detect," the disclosure of which is hereby incorporated herein by reference. Additional CAM devices are described in U.S. Pat. Nos. 5,706,224, 5,852,569 and 5,964,857 to Srinivasan et al. and in U.S. Pat. Nos. 6,101,116, 6,256,216 and 6,128,207 to Lien et al., assigned to the present assignee, the disclosures of which are hereby incorporated herein by reference.

High capacity CAM devices may also include large numbers of CAM arrays therein, with one or more CAM arrays being treated as a CAM array block. Each CAM array block may be loaded with entries of a particular priority class or the entries within a particular CAM array block may be arranged in groups (e.g., sectors) having different priority classes. The CAM array blocks may also be treated as having respective "hard" priorities that are based on the physical location of a respective block within the CAM device. In this manner, entries associated with a particular priority class may be loaded into a CAM array block(s) having a corresponding hard priority associated therewith.

Unfortunately, this conventional allocation of entries of different priority classes within a CAM device may use inefficient and time consuming reloading operations in the event previously loaded entries need to be reallocated among the CAM array blocks. Such reallocation operations may be necessary as new entries are added to the CAM device or as the priorities of one or more classes of entries change over time.

Thus, notwithstanding the use of hard priority techniques to allocate entries of different priority classes within high capacity CAM devices, there continues to be a need for improved priority techniques that can allocate entries more efficiently.

SUMMARY OF THE INVENTION

CAM devices according to some embodiments of the present invention use both hard and soft priority techniques to allocate entries of different priority therein. According to some aspects of these embodiments, the priorities of multiple CAM array blocks within the CAM device may be programmed before or as entries are loaded therein and may be reprogrammed during operation as the allocation of entries within the CAM device changes. The allocation of entries may change in response to additions or deletions of entries or as entries are reprioritized, for example. According to other aspects of these embodiments, multiple CAM array blocks may be programmed with equivalent soft priorities during operation and in other embodiments all CAM array blocks may be initially programmed with equivalent soft priorities upon start-up. Each of these soft priorities may be retained by a programmable soft priority register that is associated with each CAM array block.

CAM devices according to other embodiments of the present invention include priority resolution circuits therein that can resolve competing soft and hard priorities between multiple hit signals that are generated in response to a search operation. Such hit signals may be generated as active signals to reflect the presence of at least one matching entry within a CAM array block. Each hit signal may be generated by a respective CAM array block and/or circuitry associated with a respective CAM array block. The resolution of which active hit signal has the highest overall priority among many can be used to facilitate the identification of the location (e.g., block address and row address) of a highest priority matching entry within the entire CAM device. A priority resolution circuit may also resolve competing hard priorities between two or more active hit signals having equivalent soft priority. This aspect of the priority resolution circuit is provided in some embodiments so that an active hit signal having a highest overall priority can be resolved whenever multiple CAM array blocks having the same soft priority are detected as having matching entries therein during a search operation.

According to further embodiments, the priority resolution circuit is a hierarchical priority resolution circuit having at least a MSB soft priority resolution stage and a LSB soft priority resolution stage. These stages may be used to fully resolve competing soft priorities and identify an active hit signal (or possibly multiple active hit signals) having the highest soft priority. The operations performed by the stages may resolve competing soft priorities in descending order (e.g., MSB to LSB) according to numeric significance. To resolve competing hard priorities between multiple active hit signals having highest soft priorities that are equal, a hard priority resolution stage may also be provided. In some embodiments, this hard priority resolution stage is coupled to outputs of the final soft priority resolution stage (e.g., LSB stage).

In additional embodiments of the present invention, the CAM device includes $2^{N+1}$ CAM array blocks therein, where N is an integer (e.g., N=8), and the priority resolution circuit comprises $\log_2 N$ groups of precharged signal lines that are used during a priority resolution operation to resolve competing soft priorities between hit signals generated by the plurality of CAM array blocks. In particular, the priority resolution circuit may include $\log_2 N$ groups of N (or N–1) precharged signal lines, with each group of precharged signal lines being associated with a respective soft priority resolution stage. In these embodiments, the hierarchical priority resolution circuit may process at least first and second active hit signals using wired-OR logic to identify a highest priority one of the first and second active hit signals and selectively block another one of the first and second active hit signals from being further processed as a highest priority hit signal candidate. This wired-OR logic may be coupled to the precharged signal lines.

Still further embodiments of the present invention include CAM devices having first and second segments of CAM array blocks therein and a hierarchical priority resolution circuit that is disposed between the first and second segments of CAM array blocks. The hierarchical priority resolution circuit includes a soft priority resolution circuit that is configured to resolve a parallel soft priority competition between a first plurality of active hit signals generated by the first segment of CAM array blocks and a second plurality of active hit signals generated by the second segment of CAM array blocks. This soft priority resolution circuit may include a plurality of soft priority resolution stages.

First and second independent hard priority resolution circuits may also be provided. These first and second hard priority resolution circuits are electrically coupled to first and second outputs, respectively, of the soft priority resolution circuit. The first hard priority resolution circuit is configured to resolve competing hard priorities between two or more of the first plurality of active hit signals having equivalent highest soft priorities amongst all of the first and second pluralities of active hit signals. The second hard priority resolution circuit is similarly configured to resolve competing hard priorities between two or more of the second plurality of active hit signals having equivalent highest soft priorities amongst all of the first and second pluralities of active hit signals. According to some aspects of these embodiments, all of the CAM array blocks in the first segment of CAM array blocks are treated as having a higher hard priority than any of the CAM array blocks in the second segment of CAM array blocks.

CAM devices according to further embodiments of the present invention may also include multiple banks of CAM array blocks, with each bank including a plurality of first segments of CAM array blocks and a plurality of second segments of CAM array blocks. A soft/hard priority resolution circuit may also be disposed between the plurality of first segments of CAM array blocks and the plurality of second segments of CAM array blocks. This soft/hard priority resolution circuit is configured to resolve a segment-staged priority competition between active hit signals generated by respective CAM array blocks in the bank. The soft/hard priority resolution circuit may be divided into a plurality of segments that are each configured to receive hit signals from a respective one of the plurality of first segments of CAM array blocks and a respective one of the plurality of second segments of CAM array blocks.

The plurality of first segments of CAM array blocks may include at least first and second top segments of CAM array blocks and the plurality of second segments of CAM array blocks may include at least first and second bottom segments of CAM array blocks. The soft/hard priority resolution circuit may be divided into at least a first segment that receives hit signals from the first top and bottom segments of CAM array blocks and a second segment that receives hit signals from the second top and bottom segments of CAM array blocks. The first segment of the soft/hard priority resolution circuit is configured to simultaneously resolve competing soft priorities between active hit signals generated by the first top and bottom segments of CAM array blocks. The second segment of the soft/hard priority resolution circuit is also configured to simultaneously resolve competing soft priorities between active hit signals generated by the second top and bottom segments of CAM array blocks. The second segment of the soft/hard priority resolution circuit may also rely on signals generated by the first segment of the soft/hard priority resolution circuit.

Still further embodiments of the present invention include CAM devices with priority resolution circuits therein that are configured to resolve competing soft priorities between a first plurality of active hit signals that are generated adjacent a first side of the priority resolution circuit and a second plurality of active hit signals that are generated adjacent a second side of the priority resolution circuit that is opposite the first side. The priority resolution circuit is configured to hierarchically resolve competing soft priorities between the first and second pluralities of active hit signals according to numeric significance. The priority resolution circuit is also configured to resolve competing hard priorities between two or more of the first plurality of active hit signals having equivalent highest soft priorities by identifying which of the two or more of the first plurality of active hits signals has the highest relative hard priority. The priority resolution circuit is still further configured to resolve competing hard priorities between two or more of the second plurality of active hit signals having equivalent highest soft priorities by identifying which of the two or more of the second plurality of active hits signals has the highest relative hard priority. In the event the priority resolution circuit comprises a MSB soft priority resolution stage and a LSB soft priority resolution stage, then the priority resolution circuit may also include a first hard priority resolution stage that is electrically coupled to a first plurality of outputs of the LSB soft priority resolution stage and a second hard priority resolution stage that is electrically coupled to a second plurality of outputs of the LSB soft priority resolution stage. The first and second pluralities of outputs of the LSB soft priority resolution stage may be arranged in alternating sequence.

Staged segment-to-segment priority resolution operations may also be performed by embodiments of the present invention. For example, a CAM device may be provided that includes first and second pluralities of CAM array blocks, which are configured to generate first and second pluralities of active hit signals, respectively, in response to a search operation. First and second soft/hard priority resolution circuits are also provided. The first soft/hard priority resolution circuit is configured to resolve a first soft/hard priority competition between the first plurality of active hit signals and the second soft/hard priority resolution circuit is configured to resolve a second soft/hard priority competition between the second plurality of active hit signals. According to aspects of these embodiments, the second soft/hard priority competition is resolved in a manner that relies on an outcome of the first soft/hard priority competition to identify whether any of the second plurality of active hit signals has a higher priority than a highest priority one of the first plurality of active hit signals. According to other aspects of these embodiments, the first soft/hard priority resolution circuit is responsive to a first plurality of soft priority signals and is configured to generate a first plurality of hierarchical control signals in response to the first soft/hard priority competition. The second soft/hard priority resolution circuit is responsive to these hierarchical controls signals and treats them as soft priority signals during the second priority competition. The second soft/hard priority resolution circuit may also include a repeater circuit that is configured to receive the first plurality of hierarchical control signals. The repeater circuit may also be responsive to a match signal that indicates a detection of at least one matching entry in the first plurality of CAM array blocks. The repeater circuit may also be configured to generate an ID signal that can be used to enable or disable a hard priority resolution stage within the second soft/hard priority resolution circuit. The repeater may also be electrically coupled by a plurality of hierarchical control signal lines to a plurality of priority circuits within the second soft/hard priority resolution circuit.

Still further embodiments of the present invention include methods of operating content addressable memory (CAM) devices by applying a comparand to a plurality of CAM array blocks during a search operation to thereby detect a plurality of matching entries in the plurality of CAM array blocks. The search operation may also include generating a plurality of active hit signals having respective soft and hard priorities associated therewith that correspond to soft and hard priorities of respective ones of the plurality of CAM array blocks. The competing soft priorities between the plurality of active hit signals are then resolved before resolving competing hard priorities between at least two of the active hit signals having equal soft priorities. Other embodiments of the present invention are also provided, as described more fully hereinbelow.

BRIEF DESCRIPTION OF THE DRAWINGS

FIG. 6 is a block diagram of a hierarchical priority resolution circuit according to an embodiment of the present invention.

DESCRIPTION OF PREFERRED EMBODIMENTS

Figure 3:
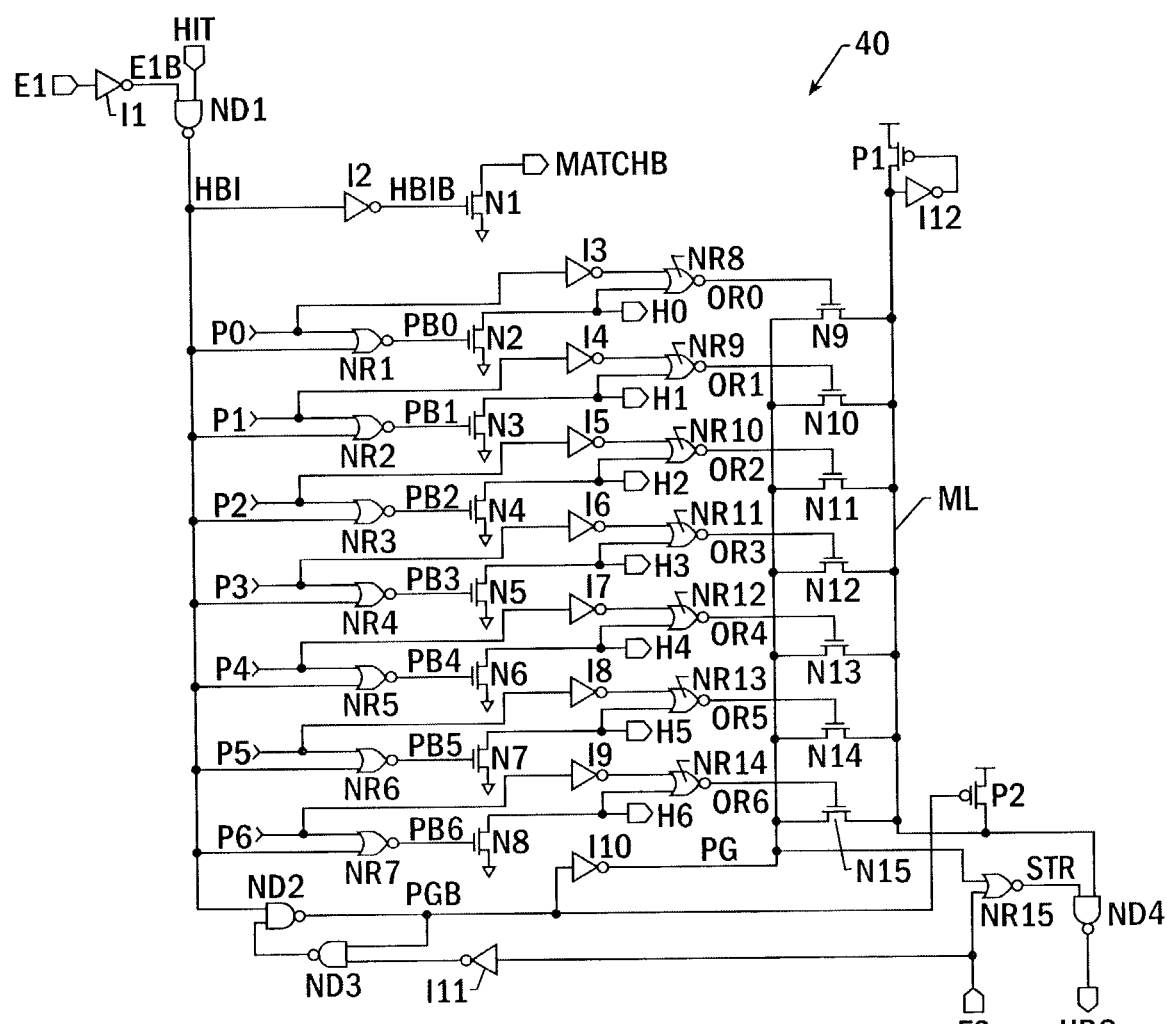
FIG. 3 is an electrical schematic of one column of one stage of a soft priority resolution circuit according to an embodiment of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals.

Figures 1, 6A:
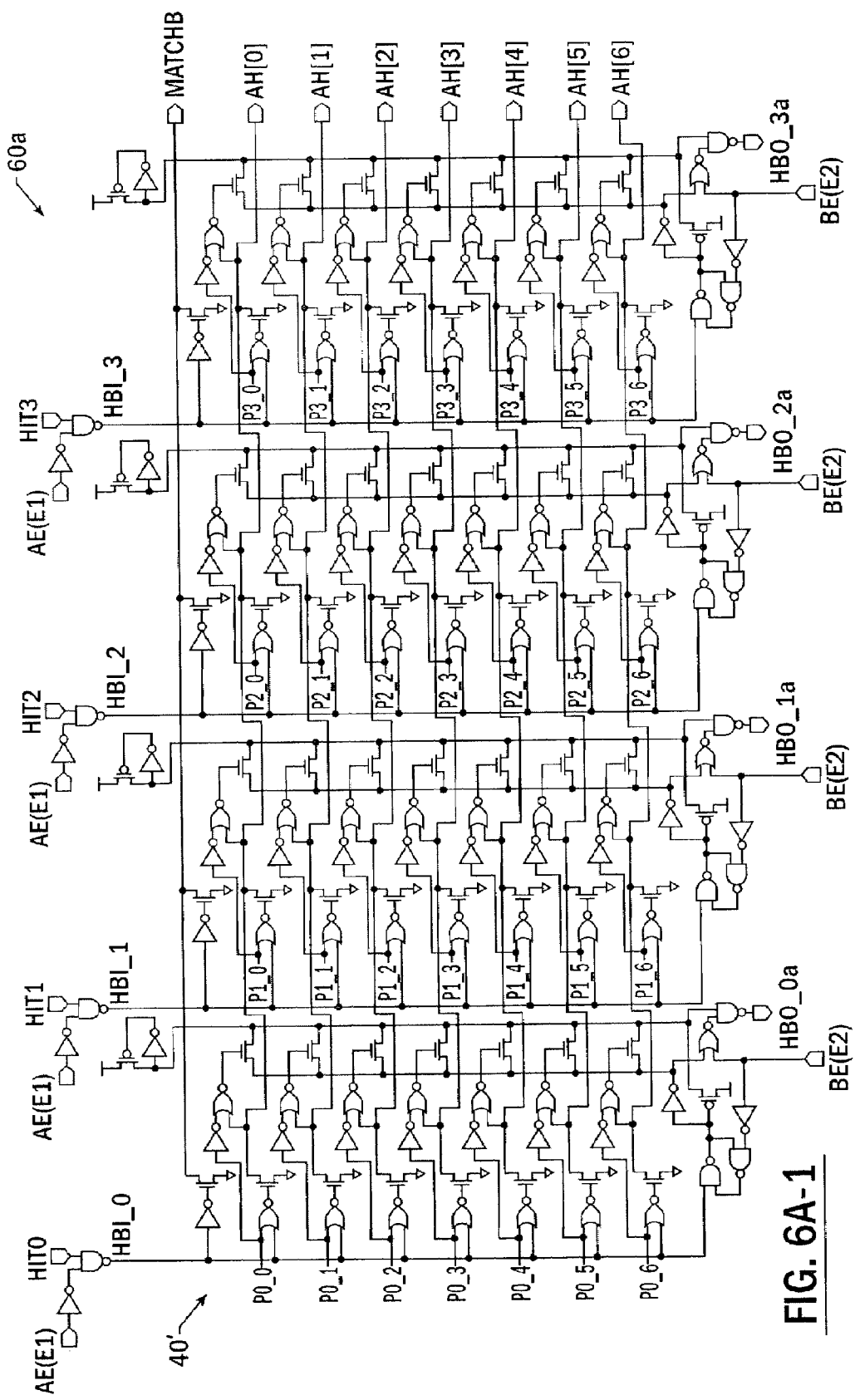
FIG. 1 is a block diagram of a CAM device according to an embodiment of the present invention.
FIG. 6A is an electrical schematic that illustrates a first soft priority resolution stage of the hierarchical priority resolution circuit of FIG. 6 according to embodiments of the present invention.

Referring now to FIG. 1, a block diagram of a content addressable memory (CAM) device 10 according to some embodiments of the present invention will be described. As illustrated by FIG. 1, the CAM device 10 includes a segment of CAM array blocks 12a–12h that are arranged according to physical/positional priority. In particular, the leftmost CAM array block 12a is illustrated as the block having the highest physical/positional priority of "0" and the rightmost CAM array block 12h is illustrated as the block having the lowest physical/positional priority of "7". These physical/positional priorities are treated herein as "hard" priorities (HP) that have been assigned to respective CAM array blocks 12a–12h according to their physical location on an integrated circuit chip containing the CAM device 10. The designation of "0" as the highest priority and "7" as the lowest priority is arbitrary. The illustrated arrangement of hard priorities may also be arbitrary or may depend on the wiring and positional requirements of a particular design or layout. Accordingly, the illustrated left-to-right sequence of decreasing hard priority is provided solely as one possible example for ease of understanding. The hard priority value associated with a CAM array block may also correspond to its physical address. This physical address of the CAM array block may be combined with a row address of a matching entry within the CAM array block to provide a complete address of the matching entry.

Each of the CAM array blocks 12a–12h is described herein as having a logical width of 72 columns (with possibly one or more redundant columns) and a logical depth of 512 rows (with possibly one or more redundant rows). Thus, the illustrated segment of the CAM device 10 has a capacity of 8×512 entries, with each entry having a width of 72 bits. The performance of a search operation between an applied x72 search word (i.e., comparand) and the entries in the CAM array blocks 12a–12h may result in the detection of one or more matching entries therein, with the detection of at least one matching entry within a respective CAM array block being identified with an active high "HIT" signal (i.e., HITn=1, where n is an integer that designates a hard priority). As will be understood by those skilled in the art, each matching entry within a CAM array block may be identified by a corresponding match line (MATCH) that remains precharged at the end of a search operation. Accordingly, each CAM array block may include wired-OR circuitry and/or other circuitry that receives the match lines as inputs (e.g., MATCH0–MATCH511) and generates an active hit signal (HIT=1) at an output thereof whenever one or more of the match lines remain high at the end of a search operation. An active hit signal may also be referred to herein as an asserted hit signal.

The CAM device 10 may also support longer search words, including x144, x288 and x576 search words by linking entries across 2, 4 or 8 CAM array blocks, for example. The illustrated portion of the CAM device 10 may represent one segment of a bank of CAM array blocks within a multi-bank CAM device. An exemplary CAM device may have a capacity of 18 million bits (18 Meg) that are stored within eight (8) banks of CAM array blocks, with each bank having eight (8) segments (i.e., 18 Meg bits=(72 bits/entry) (512 entries/block)×(8 blocks/segment)×(8 segments/bank)×(8 banks)=512 CAM array blocks with 512 entries/block). In alternative embodiments, each CAM array block may have more than one CAM array therein. For example, a CAM array block may comprise a pair (or quad grouping) of CAM arrays that are arranged side-by-side relative to each other. Other arrangements and capacities may also be provided. The CAM device 10 may also be incorporated as a sub-circuit into an integrated circuit chip having additional functionality. For example, the CAM device 10 may be incorporated within a router look-up table that receives Classless Inter-Domain Routing (CIDR) addresses and passes these addresses as applied search words (i.e., comparands) to the CAM device 10. These CIDR addresses may have variable prefix lengths, with the length of a prefix establishing an entry's relative priority. As another example, the CAM device 10 may be incorporated within internet protocol (IP) co-processor devices.

The CAM device 10 also includes a plurality of soft priority registers 14a–14h, which are each associated with a respective one of the CAM array blocks 12a–12h and any active hit signals (HITn) generated by these CAM array blocks 12a–12h. Thus, an active hit signal generated by a CAM array block may be treated herein as having a soft and hard priority associated therewith that matches the soft and hard priority of the corresponding CAM array block. These soft priority registers 14a–14h may be of conventional design. Each soft priority register 14a–14h is illustrated as storing a numeric soft priority value. In some embodiments, these soft priority values may be within a programmable range from 0 to 511, with each value being shown in an octal format (e.g., $511=777|_8=7(8^2)+7(8)+7$). As explained more fully hereinbelow with respect to FIG. 5, each soft priority register may be formed by 3 groups of seven (7) latches (e.g., D-type flip-flops) that are arranged in descending order by numeric significance (MSB→ISB→LSB) and are programmed to retain respective bits of soft priority data. For example, a string of twenty-one (21) logic zero values may be stored as a representation of a highest soft priority of 0 (i.e., $000|_8$) and a string of twenty-one (21) logic one values may be stored as a representation of a lowest soft priority of 511 (i.e., $777|_8$). In the event the CAM device 10 includes 512 CAM array blocks, each block may be assigned a unique soft priority value. Software programming constraints may or may not be present that preclude any two blocks from having the same soft priority.

CAM devices that use registers to provide soft priority management are also disclosed in U.S. application Ser. No. 09/884,797, entitled "Content Addressable Memory Array Having Flexible Priority Support," filed Jun. 18, 2001, assigned to the present assignee, the disclosure of which is hereby incorporated herein by reference. In particular, the '797 application discloses embodiments of CAM devices that utilize a plurality of routing values to establish the soft priorities of a respective plurality of hit signals. Each of these routing values may be selectively stored at a desired location within a programmable register and used to select the soft priority to be assigned to a respective hit signal. These routing values may, in some embodiments, constitute CAM array block addresses. These block addresses may also correspond to hard priority values associated with the CAM array blocks. The '797 application also discloses a priority encoder within encoding logic. This encoding logic may comprise a cross-point switch having a plurality of multiplexers therein that are responsive to signals generated by the programmable register. The priority encoder is configured to identify an activated hit signal having a highest soft priority from a plurality of activated hit signals having different soft priorities. Upon identification of the activated hit signal having the highest soft priority, a routing value associated with the corresponding CAM array block that generated the activated hit signal having the highest soft priority, is provided as a CAM array block address to an output of the encoding logic. The routing value is also used to select an index signal generated by the corresponding CAM array block. This index signal may constitute a row address of a highest priority matching entry within a highest priority CAM array block and may be provided along with the CAM array block address as an output index signal. This output index signal may then be used as a pointer or index into a table (e.g., SRAM-based table). This table may contain routing information that designates an output port of an output switch that receives data packets, for example.

According to some embodiments of the CAM device 10 of FIG. 1, an array priority encoder 20 is provided. The array priority encoder 20 is illustrated as including a control circuit and encoder 16 and a plurality of groups of signal lines 18a–18c. The control circuit and encoder 16 and the signal lines 18a–18c may operate as one embodiment of a hierarchical priority resolution circuit that identifies a highest priority one of the CAM array blocks 12a–12h having at least one matching entry therein, in response to a search operation. Operations performed by the hierarchical priority resolution circuit according to some embodiments of the invention are illustrated at a conceptual level by the plurality of groups of signal lines 18a–18c. As described more fully hereinbelow, in some embodiments these signal lines 18a–18c are biased (or floated) at precharged high levels at a commencement of an appropriate stage of a priority resolution operation. Each priority resolution operation may be performed in response to a search or look-up operation that performs a comparison between an applied search word (i.e., comparand) and entries in a plurality of CAM array blocks.

The plurality of CAM array blocks 12a–12h may be searched in parallel during one or more consecutive cycles of a search operation (e.g., pipelined search operation), to identify whether at least one matching entry is present within the CAM device 10. Operations to identify matching entries within CAM array blocks are well known to those skilled in the art and need not be described further herein. The identification of at least one matching entry within a CAM array block may be designated by a respective active HIT signal, shown as HIT0–HIT7. Then, during first, second and third consecutive "soft" phases of a hierarchical priority resolution operation, the array priority encoder 20 may operate to determine which of the active HIT signals is associated with a CAM array block having a highest soft priority. The number of soft phases within a hierarchical priority resolution operation may vary depending on application and need not be limited to three or more phases. For example, if the CAM device 10 includes 256 CAM array blocks, then the soft priority values may range from 0 to 255, with the lowest priority value of 255 being represented as $3333_4$. This four-bit expression of soft priority translates to the use of four soft phases within the hierarchical priority resolution operation. Under these circumstances, four groups of precharged signal lines with four (or three) signal lines per group may be used, as explained more fully hereinbelow. Alternatively, if the CAM device 10 includes 64 CAM array blocks, then the soft priority values may range from 0 to 63, with the lowest priority value of 63 being represented as $77_8$ in octal format. This two-bit expression of soft priority translates to the use of two soft phases within the hierarchical priority resolution operation. Under these circumstances, two groups of precharged signal lines with eight (or seven) signal lines per group may be used.

By evaluating the numeric values of the soft priority data stored within the soft priority registers 14a–14h of FIG. 1, the seventh CAM array block 12g can be identified as the block having the highest soft priority in the illustrated example. This result is achieved because the numeric value "123" in the seventh soft priority register 14g is higher than all the other numeric values associated with soft priority registers 14a, 14e, 14f and 14h (i.e., 123 is higher in priority than 124, 437, 774 or 615).

The first soft phase of the priority resolution operation may be treated as a "competition" that includes comparing the most significant bits of the soft priority data stored within the first, fifth, sixth, seventh and eighth soft priority registers 14a, 14e, 14f, 14g and 14h, respectively, and blocking all soft priority data associated with inactive HIT signals (i.e., HITn=0). As explained more fully hereinbelow with respect to the soft priority resolution circuit of FIG. 3, the comparison of the most significant bits may be performed by discharging one or more precharged signal lines within the first group 18a. As illustrated, a most significant bit equal to "1" causes signal lines 1–7 in the first group 18a to be discharged if the corresponding CAM array block contains at least one matching entry. Likewise, a most significant bit equal to "4" may cause signal lines 4–7 in the first group 18a to be discharged if the corresponding CAM array block contains at least one matching entry. The same operations are also applied to all other most significant bits of the soft priority data in order to resolve which one(s) of the CAM array blocks having at least one matching entry therein has a soft priority with a highest most significant bit. Because the most significant bits (MSB) of the numeric values 124 and 123 stored within the first and seventh soft priority registers 14a and 14g are the highest, they both win the competition over all other most significant bits and tie each other. Detailed circuitry to perform these soft priority resolution operations according to some embodiments of the present invention is described more fully hereinbelow with respect to FIGS. 3–6.

The second soft phase of the priority resolution operation may include comparing the intermediate significant bits (ISB) of the numeric values stored within the first and seventh soft priority registers 14a and 14g and blocking all competition with "losers" from the first stage. Because the intermediate significant bits of the numeric values 124 and 123 stored within the first and seventh soft priority registers 14a and 14g are the same (i.e., both ISB values equal "2"), a tie will be present at the end of the second phase. This tie is evidenced by the fact that both the first CAM array block 12a and the seventh CAM array block 12g have soft priorities that cause signals lines 2–7 in the second group 18b to be pulled down from precharged high levels.

The priority competition then passes to the third stage where the least significant bit (LSB) of the numeric value stored within the seventh soft priority register 14g wins out over the least significant bit of the numeric value stored within the first soft priority register 14a. In other words, the least significant bit "3" in the seventh soft priority register 14g wins the competition because it is higher in priority than the least significant bit "4" in the first soft priority register 14a.

Finally, treating the priority resolution operations from a conceptual standpoint, output signals "WIN" and "LOSE" may be passed from the last phase of the competition to the control circuit and encoder 16. In response to these output signals, the control circuit and encoder 16 may then generate the physical address of the highest priority CAM array blocks having at least one matching entry therein. As will be understood by those skilled in the art, additional circuitry (not shown) may be used to resolve the highest priority row address of one or more matching entries within the identified highest priority CAM array. This additional circuitry may be of conventional design and may be provided as an additional encoding stage that is electrically coupled to an output of the illustrated control circuit and encoder 16.

Operation of the CAM device 10 of FIG. 1 may be constrained by a requirement that no two (or more) CAM array blocks may be programmed to have the same soft priority. Thus, upon start up, when a CAM device is being loaded with new entries, each CAM array block may be required to have a unique soft priority value in a range from 0 (highest) to 511 (lowest), for example. Moreover, additional "insert", "shift" and "replace" operations may be performed by the CAM device 10 in the event the priorities of entries within a particular CAM array block change and/or the priorities of multiple CAM array blocks are rearranged. These additional operations may also be performed in the event new entries of a given priority being loaded into a partially full CAM array device spill over from one full CAM array block into an unused CAM array block and the soft priority of that newly active CAM array block is reprogrammed to reflect an intermediate soft priority that is next in sequence to the soft priority of the full CAM array block. Such additional operations may be difficult to implement in a CAM device.

Figures 2, 6A:
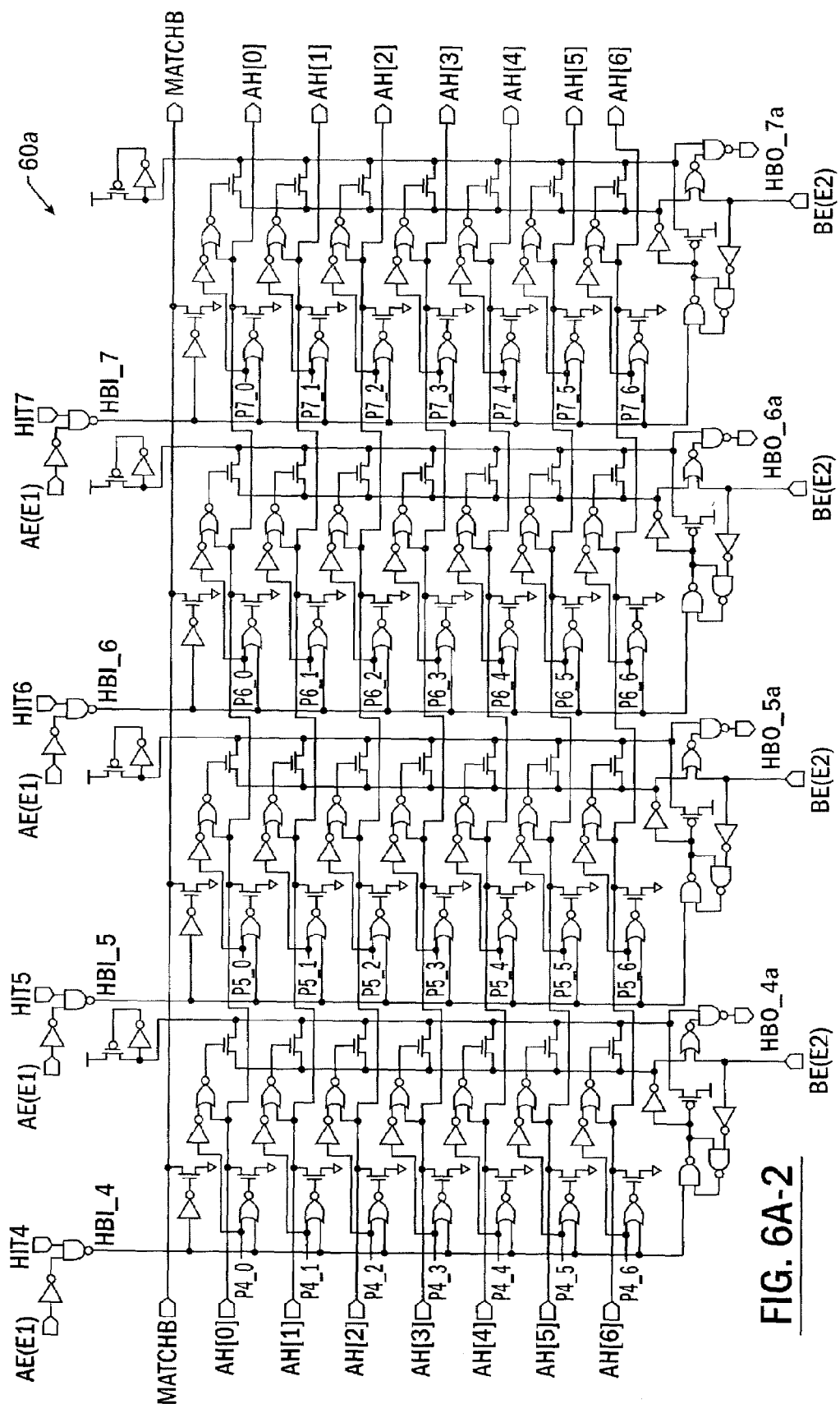
FIG. 2 is a block diagram of a CAM device according to an embodiment of the present invention.
Figures 1, 6B:
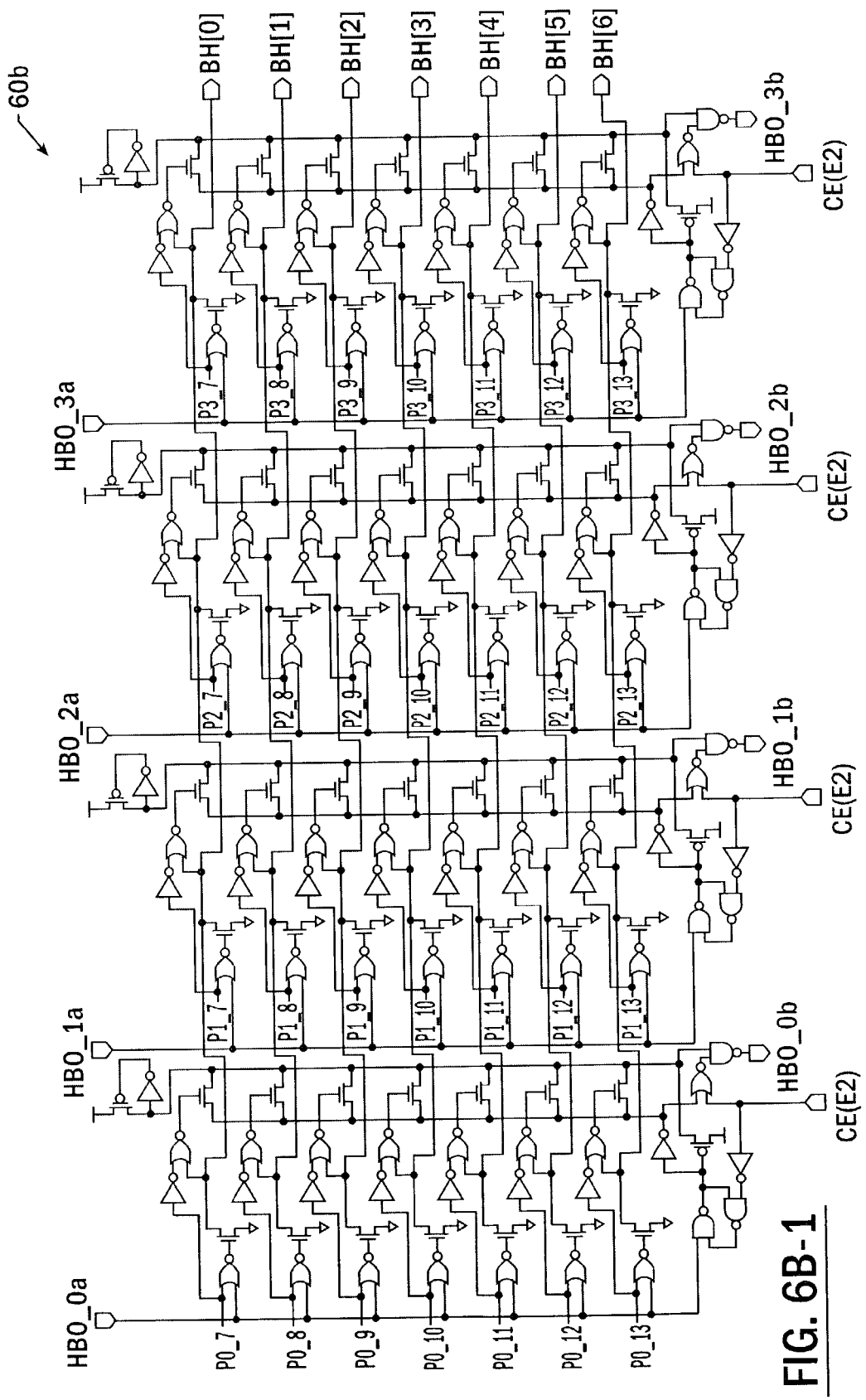
FIG. 6B is an electrical schematic that illustrates a second soft priority resolution stage of the hierarchical priority resolution circuit of FIG. 6 according to embodiments of the present invention.
Figures 2, 6B:
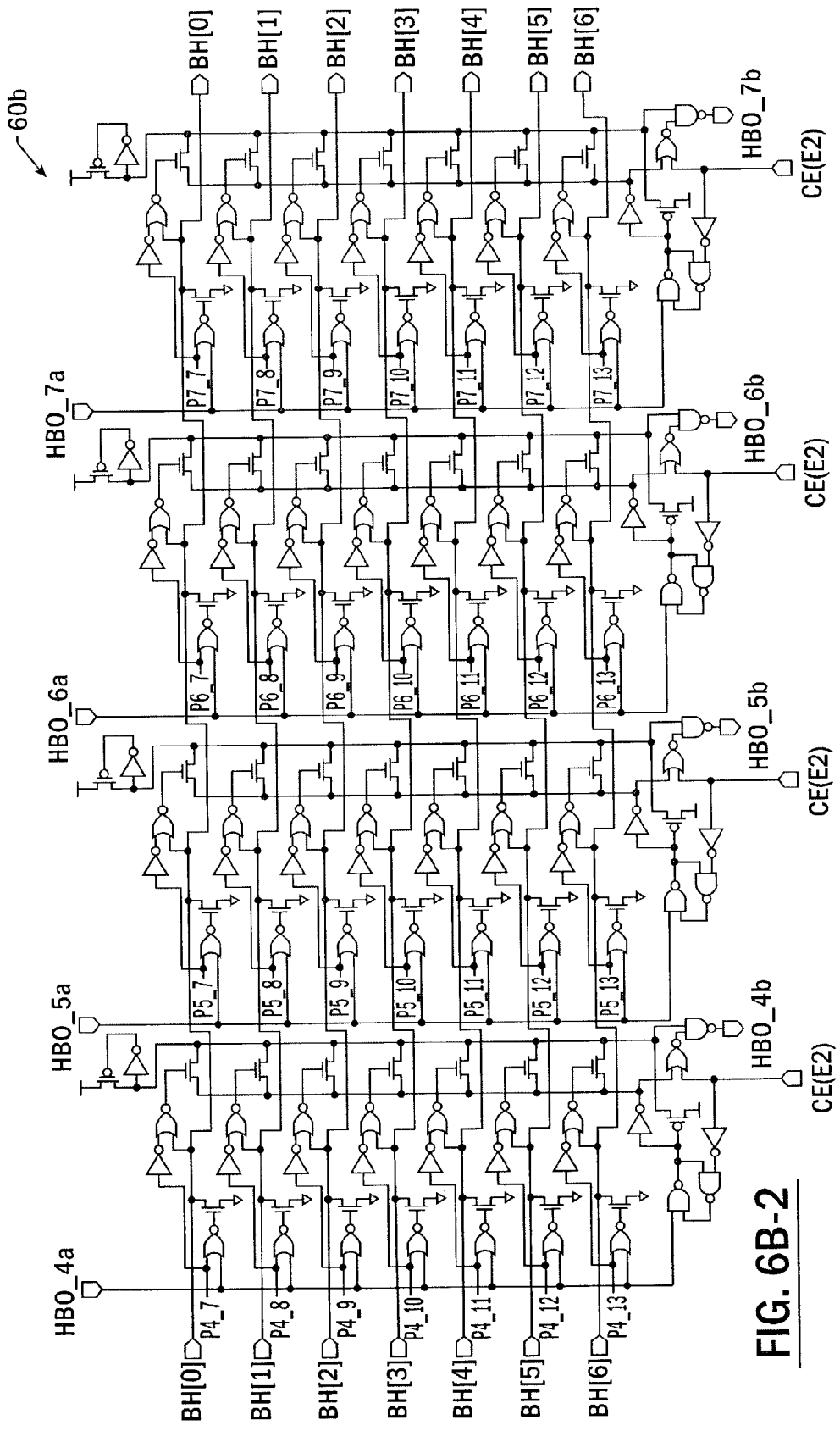
Figures 1, 6C:
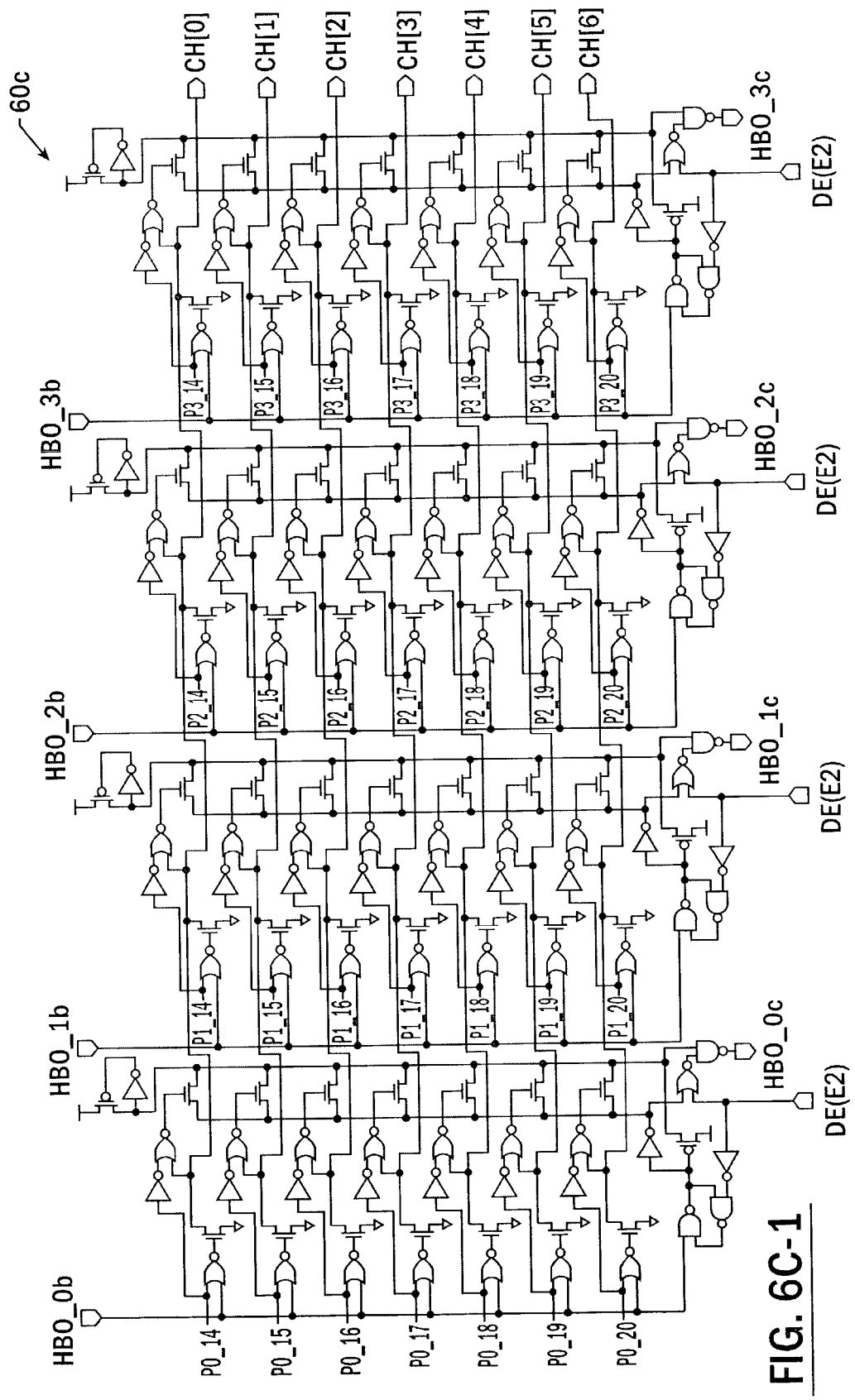
FIG. 6C is an electrical schematic that illustrates a third soft priority resolution stage of the hierarchical priority resolution circuit of FIG. 6 according to embodiments of the present invention.
Figures 2, 6C:
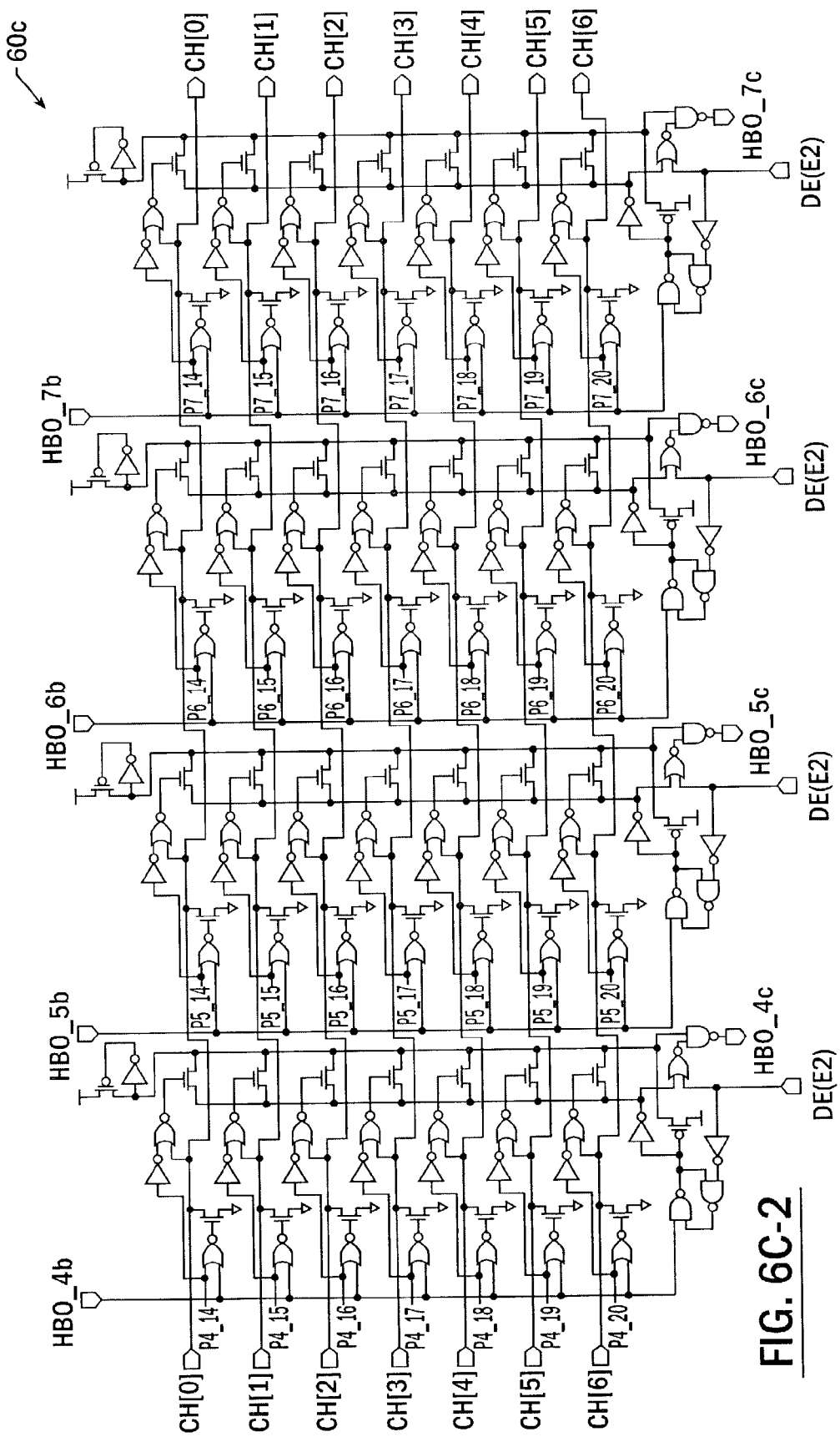

The CAM device 10' of FIG. 2 addresses the potential constraints associated with operating the CAM device 10 of FIG. 1 in certain applications, by including a final hard priority resolution phase to the hierarchical priority resolution operation. In particular, the CAM device 10' of FIG. 2 includes an array priority encoder 20' having a fourth group of signal lines 18d that may be used to resolve which one of two or more active hit signals having equivalent highest soft priorities has the highest hard priority. As illustrated by the numeric values stored within the first and the seventh soft priority registers 14a and 14g in FIG. 2, the hit signals generated by the first and seventh CAM array blocks 12a and 12g will be tied at the end of the third soft phase of the priority resolution operation. To resolve this tie condition in the soft priorities, a fourth phase of the priority resolution operation may be performed to identify the first CAM array block 12a as having a higher hard priority (HP=0) relative to the seventh CAM array block 12g (HP=6). In this manner, only one winner will be passed to the control circuit and encoder 16'. Circuitry that can perform this final phase of the priority resolution operation according to some embodiments of the invention is more fully illustrated by the hard priority resolution circuits of FIGS. 6D-1 and 6D-2.

The conceptual descriptions of the hierarchical priority resolution operations provided above with respect to FIGS. 1-2 will now be described in greater detail and include specific references to circuit components for carrying out the operations in a preferred manner. For example, FIG. 3 is an electrical schematic of a soft priority resolution circuit 40 that is used as one of a plurality of soft priority resolution circuits 40. These circuits 40 may be arranged side-by-side as columns within a first stage or tier of a hierarchical priority resolution circuit. As illustrated by FIG. 6, additional soft (and/or hard) priority resolution circuits within lower stages may also be provided. The illustrated soft priority resolution circuit 40 of FIG. 3 is responsive to an active high hit signal HIT that may be generated by a CAM array block during a search operation to reflect the presence of at least one matching entry within the CAM array block.

As illustrated by FIG. 3, a first input of a first NAND gate ND1 is provided to receive the hit signal HIT and to generate an active low complementary hit signal HBI ("hit bar in") at an output thereof. The first NAND gate ND1 also includes a second input that receives a complementary first enable signal E1B ("enable one bar"). The signal E1B is generated by a first inverter I1 that is responsive to an active low first enable signal E1. Based on the illustrated connections between the first inverter I1 and the first NAND gate ND1, a high-to-low transition of the first enable signal E1 will cause the first NAND gate ND1 to switch the complementary hit signal HBI high-to-low upon receipt of an active high hit signal HIT. The transition of the complementary hit signal HBI to an active low level will enable a plurality of NOR gates NR1–NR7 to be responsive to a plurality of soft priority signals, shown as P[0:6]. These soft priority signals P[0:6] are provided as inputs to a respective column within a stage of the hierarchical priority resolution circuit. The soft priority signals P[0:6] may have the numeric values illustrated below by TABLE 1.

As will be understood by those skilled in the art, the generation of an active low complementary hit signal HBI will cause the NOR gates NR1–NR7 to operate as inverters that drive a plurality of NMOS pull-down transistors N2–N8 with complementary soft priority signals PB0–PB6. As explained more fully hereinbelow with respect to FIG. 6, each of the complementary soft priority signal lines PB0–PB6 represents an input to a respective 8-input NOR gate having an output that is precharged high. The generation of an active low complementary hit signal HBI will also cause a second inverter I2 to turn on an NMOS pull-down transistor N1. When the NMOS pull-down transistor N1 is turned on, a complementary match line MATCHB will be discharged to a logic 0 level from a previously precharged logic 1 level. Pull-up and hold (or float) circuitry (not shown) for precharging the complementary match line MATCHB may be of conventional design. (See, e.g., FIG. 6, which illustrates circuitry for holding match lines ML0–ML7 at precharged levels).

Accordingly, if HBI=0, then based on the illustrated configuration of the NOR gates NR1–NR7, the receipt of any soft priority signals P[0:6] at logic 0 levels will cause previously precharged hierarchical control signal lines H[0:6] to be pulled high-to-low by respective NMOS pull-down transistors N2–N8. The hierarchical control signal lines, also referred to herein as "H" signal lines H[6:0], may have the values illustrated below by TABLE 2. Thus, when HBI=0, the receipt of a soft priority signal P[0:6] equal to 0, 1, 2, 3, 4, 5, 6 or 7 may cause the H signal lines H[0:6] to achieve a matching value equal to 0, 1, 2, 3, 4, 5 or 7, respectively. Alternatively, if the contributions of other soft priority resolution circuits are considered in accordance with FIGS. 6A-1 and 6A-2, described hereinbelow, the receipt of a soft priority signal P[0:6] equal to 0, 1, 2, 3, 4, 5, 6 or 7 will cause the H signal lines H[0:6] to achieve an equal or higher value of 0, ≧1, ≧2, ≧3, ≧4, ≧5, ≧6 or ≧7, respectively, where the H values H[0:6] are ordered so that 0>1>2>3>4>5>6>7.

TABLE 1

| P [0:6] | P0 | P1 | P2 | P3 | P4 | P5 | P6 |
|---|---|---|---|---|---|---|---|
| 0 | 0 | 0 | 0 | 0 | 0 | 0 | 0 |
| 1 | 1 | 0 | 0 | 0 | 0 | 0 | 0 |
| 2 | 1 | 1 | 0 | 0 | 0 | 0 | 0 |
| 3 | 1 | 1 | 1 | 0 | 0 | 0 | 0 |
| 4 | 1 | 1 | 1 | 1 | 0 | 0 | 0 |
| 5 | 1 | 1 | 1 | 1 | 1 | 0 | 0 |
| 6 | 1 | 1 | 1 | 1 | 1 | 1 | 0 |
| 7 | 1 | 1 | 1 | 1 | 1 | 1 | 1 |

TABLE 2

| H [0:6] | H0 | H1 | H2 | H3 | H4 | H5 | H6 |
|---|---|---|---|---|---|---|---|
| 0 | 0 | 0 | 0 | 0 | 0 | 0 | 0 |
| 1 | 1 | 0 | 0 | 0 | 0 | 0 | 0 |
| 2 | 1 | 1 | 0 | 0 | 0 | 0 | 0 |
| 3 | 1 | 1 | 1 | 0 | 0 | 0 | 0 |
| 4 | 1 | 1 | 1 | 1 | 0 | 0 | 0 |
| 5 | 1 | 1 | 1 | 1 | 1 | 0 | 0 |
| 6 | 1 | 1 | 1 | 1 | 1 | 1 | 0 |
| 7 | 1 | 1 | 1 | 1 | 1 | 1 | 1 |

The soft priority resolution circuit 40 of FIG. 3 also includes a plurality of NOR gates NR8–NR14. These NOR gates NR8–NR14 are provided for driving a plurality of OR signal lines, shown as OR[6:0]. A plurality of inverters I3–I9 are also provided to drive first inputs of the NOR gates NR8–NR14 with signals that equal /P[6:0], where the reference character "/" designates an inversion operation. Based on the illustrated configuration of the NOR gates NR8–NR14 and inverters I3–I9, each of the OR signal lines OR[0:6] will be held low whenever the corresponding one of the H signal lines H[0:6] is held high at its precharged level or the corresponding one of the soft priority signals P[0:6] is set low. Thus, signal line ORn will be held low whenever Pn=0 and/or Hn=1, where "n" is an integer. The H signal lines H[0:6] will also be treated herein as electrically coupled to outputs of the soft priority resolution circuit 40. These outputs are represented by the drain terminals of NMOS pull-down transistors N2–N8. The H signal lines H[0:6] are also electrically coupled to inputs of the soft priority resolution circuit 40. These inputs are represented as inputs to NOR gates NR8–NR14. Accordingly, the H signal lines H[0:6] operate both as inputs and outputs of a soft priority resolution circuit 40.

Referring still to FIG. 3, the OR signal lines OR[0:6] are provided to gate terminals of a plurality of NMOS pull-down transistors N9–N15, which are electrically connected in parallel between a "match" line ML and a pseudo-ground line PG. The match line ML is precharged high by operation of PMOS pull-up transistor P2, which has a gate terminal electrically connected to a complementary pseudo-ground line PGB. Upon becoming precharged at a high level, the match line ML is held (i.e., biased) high by operation of the PMOS pull-up transistor P1 and inverter I12. The PMOS pull-up transistor P1 is a narrow transistor that provides a weak pull-up and holding force on the match line ML. Under appropriate conditions, this weak pull-up force may be readily overcome by a stronger pull-down force provided by at least one wider and more highly conductive NMOS pull-down transistor (e.g., N9–N15). In other embodiments, the match line ML may be precharged high and then floated at a high level. However, a match line ML that is floated at a high level may be susceptible to switching noise if the parasitic capacitance between the match line ML and one or more adjacent (e.g., crossing) signal lines is substantial enough to pull the match line ML low through capacitive coupling.

The complementary pseudo-ground line PGB is controlled by the output of NAND gate ND2 and the pseudo-ground line PG. is controlled by the output of inverter I10. The inverter I10 has an input that is responsive to the complementary pseudo-ground signal PGB. The complementary pseudo-ground signal PGB is also provided as a first input to NAND gate ND3. An inverter I11, which is responsive to a second enable signal E2, drives a second input of the NAND gate ND3. Based on the illustrated configuration of the NAND gates ND2–ND3 and the inverter I11, the complementary pseudo-ground signal PGB and the pseudo-ground signal PG. will switch in accordance with the following truth table (TABLE 3). The designation "X" in TABLE 3 represents a "don't care" condition whereby the signal may be at a logic 0 level or a logic 1 level.

TABLE 3

| STATE | HBI | E2 | PGB | PG |
|---|---|---|---|---|
| LOAD HIT | 0 | X | 1 | 0 |
| IGNORE MISS | 1 | 1 | 0 | 1 |
| RESOLVE | 1 | 1 → 0 | 0 | 1 |
| INVALID | 1 | 0 | 1 | 0 |

The soft priority resolution circuit 40 of FIG. 3 generates an active low output hit signal, shown as HBO ("hit bar out"), whenever the following signal conditions are simultaneously met: E2=PG.=0 and ML=1. The output hit signal HBO is generated by a NAND gate ND4 that receives a strobe signal STR at one input and a match line signal ML at a second input. The NAND gate ND4 generates HBO=/ML (or MLB, where the suffix "B" designates the complementary state of the signal to which it pertains), whenever the strobe signal line STR is driven low-to-high by the NOR gate NR15.

Operation of the soft priority resolution circuit 40 of FIG. 3 will now be described more fully with reference to TABLE 4, which shows the logic states of various signals illustrated by FIG. 3 during four designated modes of operation. These modes of operation include an "inactive" mode, an "ignore miss" mode, a "load hit" mode and a "resolve hit" mode. The "ignore miss" mode may also be treated as a "block miss" mode.

TABLE 4

| STATE | E1 | E1B | HIT | HBI | E2 | PGB | PG | ML | STR | HBO | MATCHB |
|---|---|---|---|---|---|---|---|---|---|---|---|
| Inactive | 1 | 0 | X | 1 | 1 | 0 | 1 | 1 | 0 | 1 | 1 |
| Ignore Miss | 0 | 1 | 0 | 1 | 1 | 0 | 1 | 1 | 0 | 1 | 1/0 |
| Load Hit | 0 | 1 | 1 | 0 | 1 | 1 | 0 | 1/0 | 0 | 1 | 0 |
| Resolve Hit | 0 | 1 | 1 | 0 | 0 | 1 | 0 | 1/0 | 1 | 0/1 | 0 |

As illustrated by TABLE 4, the inactive mode is achieved by setting both the first and second enable signals high at logic 1 levels (i.e., E1=E2=1). When the first enable signal E1 is set to a logic 1 level, the soft priority resolution circuit 40 will not be responsive to any active high hit signal HIT because the NAND gate ND1 will be disposed in a blocking mode that is controlled by the value of the complementary first enable signal E1B. When the first NAND gate ND1 is disposed in the blocking mode, the value of the complementary hit signal HBI will be set to a logic 1 level and the outputs of the NOR gates NR1–NR7 will be held low. During the inactive mode, the complementary match line MATCHB will remain precharged at a high level along with the hierarchical control signal lines H[0:6]. The complementary match line MATCHB and H signal lines H[0:6] may be precharged and held at a high level (e.g., Vdd) by conventional circuitry (not shown). The second enable signal E2 will also be set to a logic 1 level and this level will cause the output of inverter I11 to be held low at a logic 0 level and the output of NAND gate ND3 to be held high at a logic 1 level. Under these conditions, both inputs of the NAND gate ND2 will be set high, the complementary pseudo-ground line at the output of the NAND gate ND2 will be set low, the pseudo-ground line PG. will be set high by inverter I10 and the match line ML will be precharged and held high by PMOS pull-up transistors P1 and P2. Holding the second enable signal line E2 at a logic 1 level during the inactive mode will also cause the NOR gate NR15 to hold the strobe signal line STR low. When the strobe signal line STR is held low, the output hit signal line HBO will be held inactive at a high level. Thus, during the inactive mode, the soft priority resolution circuit 40 will operate to block any active or inactive hit signal HIT from influencing the value of the output hit signal line HBO. The complementary match line MATCHB, the pseudo-ground line PG., the match line ML and the hierarchical control signal lines H[0:6] will also remain high at precharged levels during the inactive mode.

The second row of TABLE 4 shows the states of various signals within the soft priority resolution circuit 40 when an inactive hit signal HIT=0 is received and the first enable signal E1 is active (i.e., E1=0). In particular, the receipt of an inactive hit signal will cause the complementary hit signal line HBI to be held high at its previously high level (during the inactive mode). Under these conditions, none of the NMOS pull-down transistors N1–N8 will be operative to actively pull-down the complementary match line MATCHB or any of the hierarchical control signal lines H[0:6] from their precharged levels. However, one or more of the hierarchical control signal lines H[0:6] and the complementary match line MATCHB may be pulled high-to-low by one or more other columns of soft priority resolution circuits in the same stage or tier, as explained more fully hereinbelow with respect to FIG. 6.

The third row of TABLE 4 shows the states of various signals when an active hit signal HIT=1 is loaded into the soft priority resolution circuit 40. Under these conditions, the complementary hit signal line HBI is set low at a logic 0 level and the NOR gates NR1–NR7 are enabled to respond to the soft priority signals P[6:0]. The complementary pseudo-ground line PGB will also be switched high by NAND gate ND2 and the pseudo-ground line PG. will be pulled low by inverter I10. The signal line HBIB at the output of the inverter I2 will also be switched high and the complementary match line MATCHB will be pulled low by NMOS pull-down transistor N1 (and possibly other corresponding pull-down transistors in adjacent soft priority resolution circuits). In the event the soft priority signals P[0:6] are all represented by logic 0 levels (i.e., P[0:6]=0), then all H signal lines H[0:6] will be pulled low and all OR signal lines [0:6] will be held low by NOR gates NR8–NR14. Under these conditions, none of the NMOS pull-down transistors N9–N15 will be operative to discharge the match line ML from its precharged high level. The logic high level on the match line ML will nonetheless be blocked from influencing the output hit signal line HBO because the strobe signal line STR at the output of the NOR gate NR15 will be held low. The strobe signal line STR is held low because the second enable signal E2 is held at an inactive logic 1 level during an operation to load an active hit signal HIT.

If, on the other hand, the corresponding soft priority signals P[0:6] are not all represented by logic 0 levels when a hit is loaded, then the states of the H signal lines H[0:6] will need to be known in order to determine whether the match line ML is to be pulled high-to-low during an operation to load a hit. This is best illustrated by TABLE 5, which further identifies the states of the match line ML and the output hit signal line HBO when an active hit signal is initially loaded into the soft priority resolution circuit 40 and then resolved by switching the second enable signal E2 high-to-low (so that the strobe signal STR switches low-to-high and enables the output of NAND gate ND4).

TABLE 5

| | P [0:6] | H [0:6] | STATUS | HIT | E1 | E2 | HBI | ML | HBO |
|---|---|---|---|---|---|---|---|---|---|
| Case 1 | 0 | 0 | WIN/TIE | 1 | 0 | 0 | 0 | 1 | 0 |
| Case 2 | 1 | 0 | LOSE | 1 | 0 | 0 | 0 | 0 | 1 |
| Case 3 | 1 | 1 | WIN/TIE | 1 | 0 | 0 | 0 | 1 | 0 |
| Case 4 | 2 | <2 | LOSE | 1 | 0 | 0 | 0 | 0 | 1 |
| Case 5 | 2 | =2 | WIN/TIE | 1 | 0 | 0 | 0 | 1 | 0 |
| Case 6 | 3 | <3 | LOSE | 1 | 0 | 0 | 0 | 0 | 1 |
| Case 7 | 3 | =3 | WIN/TIE | 1 | 0 | 0 | 0 | 1 | 0 |
| Case 8 | 4 | <4 | LOSE | 1 | 0 | 0 | 0 | 0 | 1 |
| Case 9 | 4 | =4 | WIN/TIE | 1 | 0 | 0 | 0 | 1 | 0 |
| Case 10 | 5 | <5 | LOSE | 1 | 0 | 0 | 0 | 0 | 1 |
| Case 11 | 5 | =5 | WIN/TIE | 1 | 0 | 0 | 0 | 1 | 0 |
| Case 12 | 6 | <6 | LOSE | 1 | 0 | 0 | 0 | 0 | 1 |
| Case 13 | 6 | =6 | WIN/TIE | 1 | 0 | 0 | 0 | 1 | 0 |
| Case 14 | 7 | <7 | LOSE | 1 | 0 | 0 | 0 | 0 | 1 |
| Case 15 | 7 | =7 | WIN/TIE | 1 | 0 | 0 | 0 | 1 | 0 |

As illustrated by TABLE 5, when an active hit signal HIT=1 is resolved by a respective soft priority resolution circuit 40, one of fifteen (15) possible conditions may be present that influence whether the active hit signal HIT wins, ties or loses relative to another active hit signal HIT associated with another CAM array block. Under the conditions set forth by Case 1 in TABLE 5, if the soft priority signals received by a particular soft priority resolution circuit 40 represent the highest soft priority associated with a corresponding most significant bit class, intermediate significant bit class or least significant bit class, for example, then a win or tie is the only possible resolution because all other active hit signals HIT must be of equal or lower soft priority. Accordingly, in Case 1, the output hit signal line HBO will be set low whenever an active hit signal HIT having a soft priority equal to P[0:6]=0 is resolved. In Case 2, the active hit signal HIT will lose out to another hit signal HIT having a higher soft priority because P[0:6]=1 is less than H[0:6]=0.

The condition that H[0:6]=0 means that another active hit signal HIT having a higher soft priority is present in another column in the same stage.

Referring again to the soft priority resolution circuit 40 of FIG. 3, the signal conditions reflected by Case 2 mean that during loading of the active hit signal HIT, P0 will be at a logic 1 level, P1–P6 will be at logic 0 levels and all the hierarchical control signal lines H0–H6 will also be at logic 0 levels. Accordingly, both inputs to NOR gate NR8 will be set to logic 0 levels and the signal line OR0 will be set to a logic 1 level to thereby turn on NMOS pull-down transistor N9. In response to the turn on of the NMOS pull-down transistor N9, the match line ML will become discharged (NMOS pull-down transistor N9 will overcome the weak pull-up provided by PMOS pull-up transistor P1). The discharge of the match line ML to a logic 0 level will operate to hold the output hit signal line HBO at the output of NAND gate ND4 at a logic 1 level, to thereby reflect a loss vis-a-vis another active hit signal HIT associated with another soft priority resolution circuit 40 within the same stage or tier of soft priority resolution circuits.

In Case 3, the equivalency between the soft priority value P[0:6]=1 and the value of the hierarchical controls signal lines H[0:6]=1 represents a win or tie condition. If a tie is present, then all active hit signals HIT associated with the tie will be passed to the next tier of soft (or hard) priority resolution circuits. In Case 4, the soft priority value P[0:6] equals 2 and the hierarchical controls signal lines H[0:6] equal 0 or 1. In this case, the active hit signal HIT loses to one or more other active hit signals HIT having a soft priority equal to 0 or 1. The other illustrated cases are resolved in a similar manner.

Figure 4:
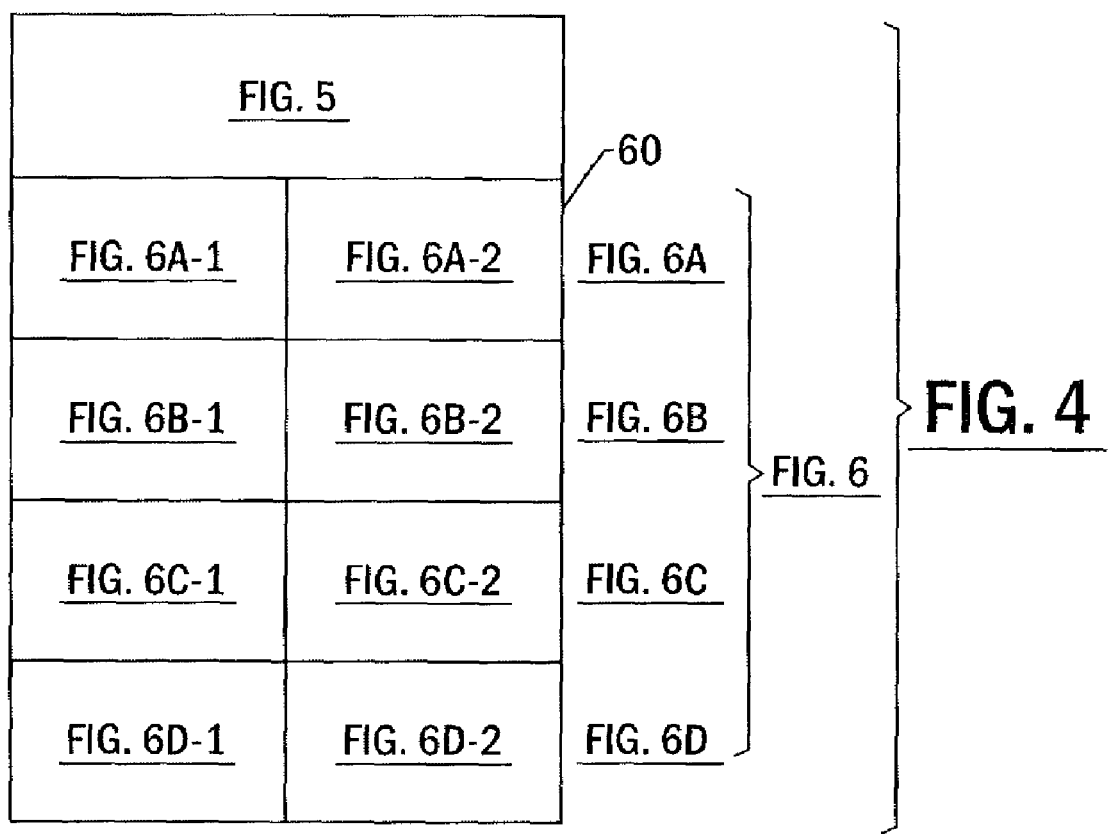
FIG. 4 is a block diagram that illustrates the relative placement of the components of FIGS. 5 and 6 relative to each other according to embodiments of the present invention.
Figure 5:
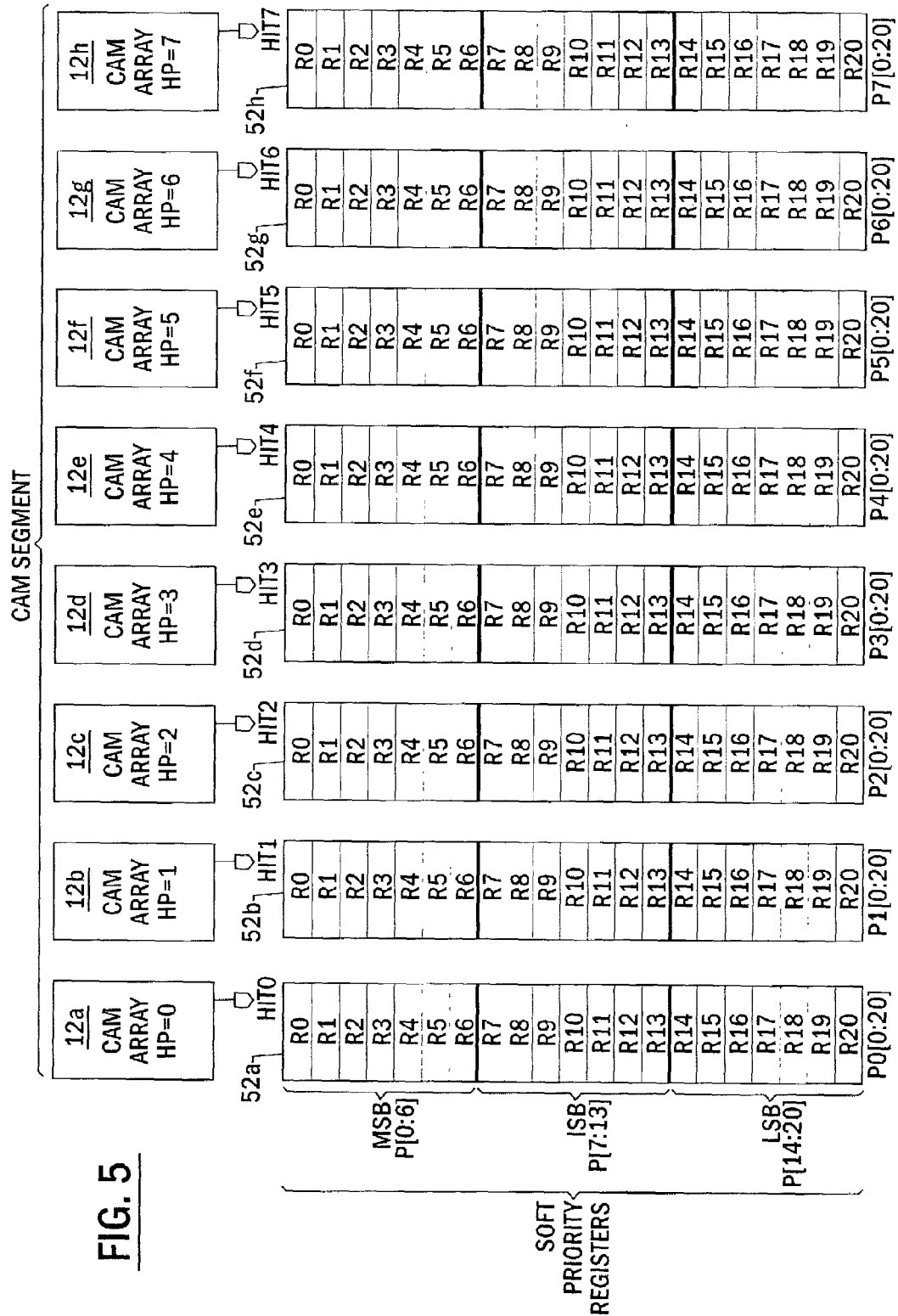
FIG. 5 is a block diagram of a segment of CAM array blocks having positional-based hard priorities and programmable soft priorities assigned thereto according to embodiments of the present invention.

The operations and circuit components described above with respect to FIGS. 1–3 will now be more fully described with reference to FIGS. 4–6. In FIG. 5, a block diagram that illustrates an entire segment of CAM array blocks having positional-based hard priorities and programmable soft priorities assigned thereto is provided. In FIG. 6, an electrical schematic of a 4-stage hierarchical priority resolution circuit that services the segment of CAM array blocks illustrated by FIG. 5 is provided. This 4-stage circuit includes three soft priority resolution stages and one hard priority resolution stage. In FIG. 4, a block diagram that illustrates the relative placement of the electrical components of FIGS. 5 and 6 is provided for ease of understanding. In the event the CAM device 10 includes 256 CAM array blocks having soft priorities in a range between 0000|$_4$ to 3333|$_4$ (i.e., 0 to 255), then the hierarchical priority resolution circuit may include four soft priority resolution stages (preferably with 3 H signal [0:2] per stage) and one hard priority resolution stage. Alternatively, in the event the CAM device 10 includes 64 CAM array blocks having soft priorities in a range between 00|$_8$ to 77|$_8$ (i.e., 0 to 63), then the hierarchical priority resolution circuit may include two soft priority resolution stages (preferably with 7 H signal lines H[0:6] per stage) and one hard priority resolution stage.

In particular, FIG. 5 illustrates a segment of CAM array blocks 12a–12h that are arranged in a left-to-right sequence according to their hard priority. As illustrated, each CAM array block 12a–12h (or circuitry associated with a block) generates a respective hit signal. The hit signals, shown as HIT0–HIT7, may be active high signals that reflect the presence of at least one matching entry within a respective CAM array block that is detected in response to a search operation. Techniques for generating active hit signals HIT and resolving competing row priorities between multiple matching entries within a CAM array block are more fully described in U.S. Provisional Application Ser. No. 60/364,696, filed Mar. 15, 2002, entitled "Content Addressable Memory (CAM) Devices that Utilize Priority Class Detectors to Identify Highest Priority Matches in Multiple CAM Arrays and Methods of Operating Same," the disclosure of which is hereby incorporated herein by reference. As described by the '696 application, row priority encoders may be provided to resolve competing row priorities between multiple matching entries within a CAM array block or blocks. FIG. 5 also illustrates a plurality of soft priority registers 52a–52h that retain soft priority data for each of the CAM array blocks 12a–12h. Conventional programming circuitry (not shown) may be used for writing respective soft priority values into each of the soft priority registers 52a–52h. These soft priority values need not be unique to each priority register because multiple CAM array blocks can be assigned the same soft priority upon start-up or thereafter, as described above with respect to FIG. 2.

These soft priority registers 52a–52h are illustrated as comprising 21 latches (e.g., D-type flip-flops), which are arranged into three groups of seven latches (shown as R0–R20). The three groups include a most significant bit (MSB) group, an intermediate significant bit (ISB) group and a least significant bit (LSB) group. Each MSB group of latches (R0–R6) generates seven soft priority signals (shown as P0[0:6], . . . , P7[0:6]) that are provided to a first stage or tier of the hierarchical priority resolution circuit 60. Similarly, each ISB group of latches (R7–R13) generates seven soft priority signals (shown as P0[7:13], . . . P7[7:13]) that are provided to a second stage of the hierarchical priority resolution circuit 60. Finally, each LSB group of latches (R14–R20) generates seven soft priority signals (shown as P0[14:20], . . . , P7[14:20]) that are provided to a third stage of the hierarchical priority resolution circuit 60. From a layout standpoint, these soft priority registers 52a–52h of FIG. 5 may be interspersed between columns of the hierarchical priority resolution circuit 60 illustrated by FIGS. 6A–6C, and may be treated herein as part of the hierarchical priority resolution circuit 60.

Referring now to FIG. 6A, a first stage 60a of a preferred hierarchical priority resolution circuit 60 includes eight (8) columns of soft priority resolution circuits. The leftmost column is designated by the reference numeral 40' to reflect its similarity to the soft priority resolution circuit 40 of FIG. 3. The first stage 60a of the hierarchical priority resolution circuit receives eight (8) hit signals, shown as HIT0–HIT7, and generates eight (8) output hit signals, shown as HBO_0a–HBO_7a. These hit signals may be derived from a segment of CAM array blocks. The first enable signal E1 and the second enable signal E2 described above with reference to FIG. 3 are reflected in FIG. 6A as signals AE and BE, respectively. These enable signals may be generated by a self-timed signal generator (see, e.g., FIG. 9A) that first switches signal AE high-to-low and then, after a predetermined amount of time necessary to load one or more of the hit signals, switches signal BE high-to-low so that any active hit signals may be resolved.

The first stage 60a may also operate to switch a complementary match line MATCHB high-to-low from a precharged high level, upon loading of at least one active hit signal (HIT0–HIT7). The logic state of the complementary match line MATCHB may be monitored to determine whether or not at least one match condition (of any priority) is present in any one of the CAM array blocks 12a–12h within a segment. Based on the MSB soft priority signals P0[6:0]–P7[0:6] and the receipt of at least one active hit signal, the first stage 60a may also operate to switch one or more hierarchical control signal lines low from respective precharged levels in order to resolve competing soft priorities between two or more active hit signals. These hierarchical control signal lines, which are shown as AH[0:6] in FIG. 6A, are connected in a wired-OR manner to outputs from the eight columns of soft priority resolution circuits 40'. These outputs are best illustrated by the drain terminals of NMOS pull-down transistors N2–N8 in the soft priority resolution circuit 40 of FIG. 3. In particular, the NMOS pull-down transistors N2 in the eight columns of soft priority resolution circuits 40' represent an 8-input NOR gate having an output represented by a respective hierarchical control signal line (shown as AH[0]). As described herein, reference to "wired-OR" connections include wired-OR and wired-NOR connections. The complementary match line MATCHB and the hierarchical control signal lines AH[0:6] may be precharged high by a signal generation and capture circuit (see, e.g., FIG. 9C) that may be positioned to the right of the circuit elements illustrated by FIG. 6A-2. This signal capture circuit may also be used to latch the logic states of the complementary match line MATCHB and the hierarchical control signal lines AH[0:6] after the hit signals associated with the first stage 60a are resolved.

The resolution of the MSB portion of the soft priority of one or more active hit signals HIT0–HIT7 by the first stage 60a will manifest itself as one or more active low output hit signals HBO_0a–HBO_7a from the first stage 60a. As illustrated by the second stage 60b of the hierarchical priority resolution circuit 60, which represents the ISB portion of the hierarchical priority resolution circuit 60, the output hit signals HBO_0a–HBO_7a from the first stage 60a are transferred directly as inputs to the second stage 60b and thereby loaded if active at logic 0 levels. The second stage 60b need not include eight copies of the inverter I1 and the NAND gate ND1 illustrated by the soft priority resolution circuit 40 of FIG. 3. The second stage 60b is responsive to a third enable signal CE. This third enable signal CE performs the same function as the second enable signal E2 illustrated by FIG. 3 and may be generated by the self-timed signal generator. In particular, the third enable signal CE may transition high-to-low a predetermined amount time after the second enable signal BE switches high-to-low. The second stage 60b resolves competing soft priorities at the ISB level by evaluating the ISB soft priority signals P0[7:13]–P7[7:13] and possibly generating one or more active low output hit signals HBO_0b–HBO_7b and one or more active low hierarchical control signals BH[0:6], in response to the output hit signals HBO_0a–HBO_7a received from the first stage 60a. The logic states of the hierarchical control signal lines BH[0:6] may be captured by the signal generation and capture circuit.

The resolution of the ISB portion of the soft priority of one or more active hit signals HIT0–HIT7 by the second stage 60b will manifest itself as one or more active low output hit signals HBO_0b–HBO_7b from the second stage 60b. As illustrated by the third stage 60c of the hierarchical priority resolution circuit 60, which represents the LSB portion of the hierarchical priority resolution circuit 60, the output hit signals HBO_0b–HBO_7b from the second stage 60b are transferred directly as inputs to the third stage 60c. The third stage 60c is responsive to a fourth enable signal DE. This fourth enable signal DE performs the same function as the second enable signal E2 illustrated by FIG. 3 and may be generated by the self-timed signal generator. In particular, the fourth enable signal DE may transition high-to-low a predetermined amount time after the third enable signal CE switches high-to-low. The third stage 60c resolves competing soft priorities at the LSB level by evaluating the LSB soft priority signals P0[14:20]–P7[14:20] and possibly generating one or more active low output hit signals HBO_0c–HBO_7c and one or more active low hierarchical control signals CH[6:0], in response to the output hit signals HBO_0b–HBO_7b received from the second stage 60b. The logic states of the hierarchical control signal lines CH[0:6] may be captured by the signal generation and capture circuit.

Figures 1, 6D:
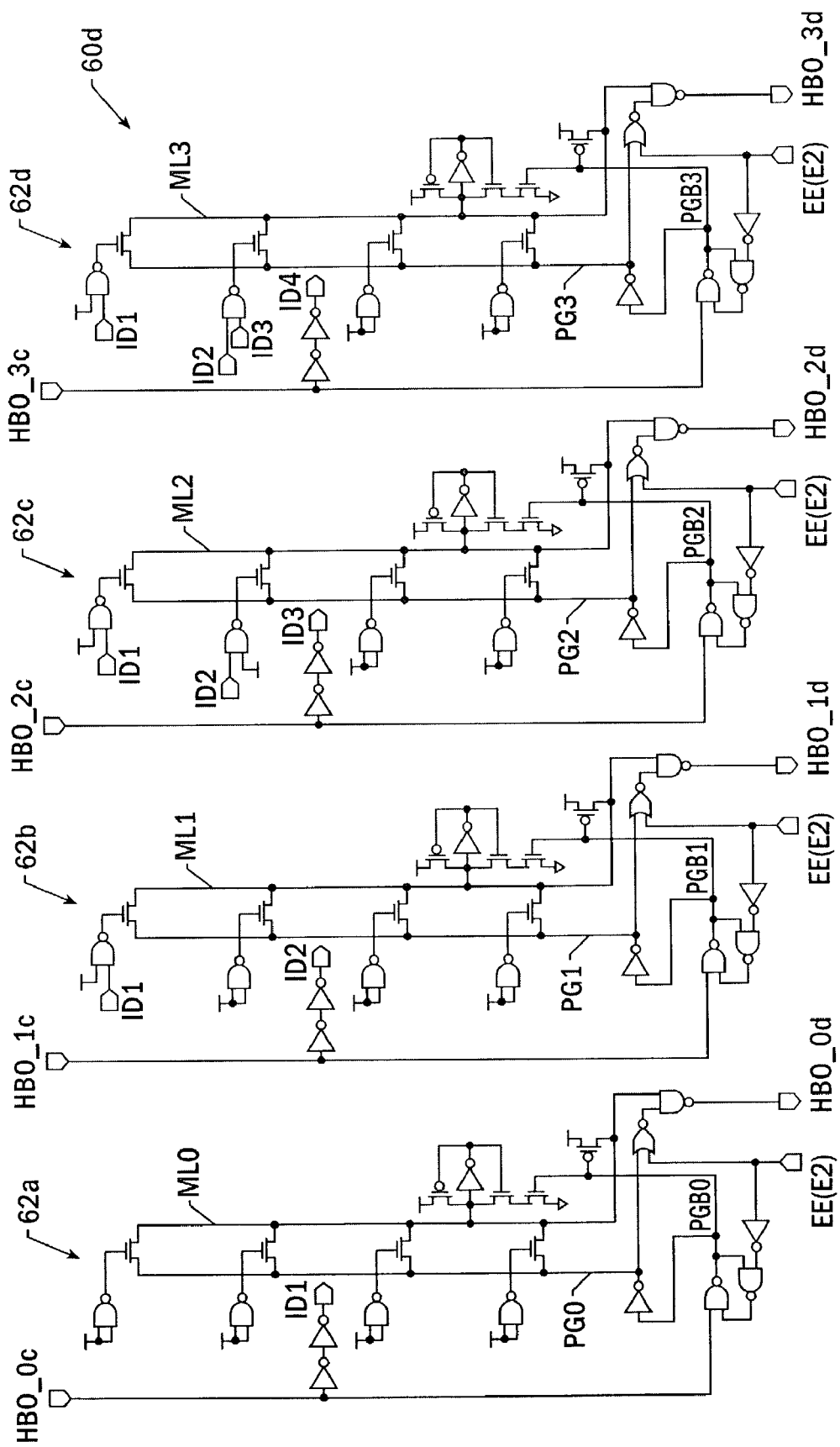
FIG. 6D is an electrical schematic that illustrates a fourth hard priority resolution stage of the hierarchical priority resolution circuit of FIG. 6 according to embodiments of the present invention.
Figures 2, 6D:
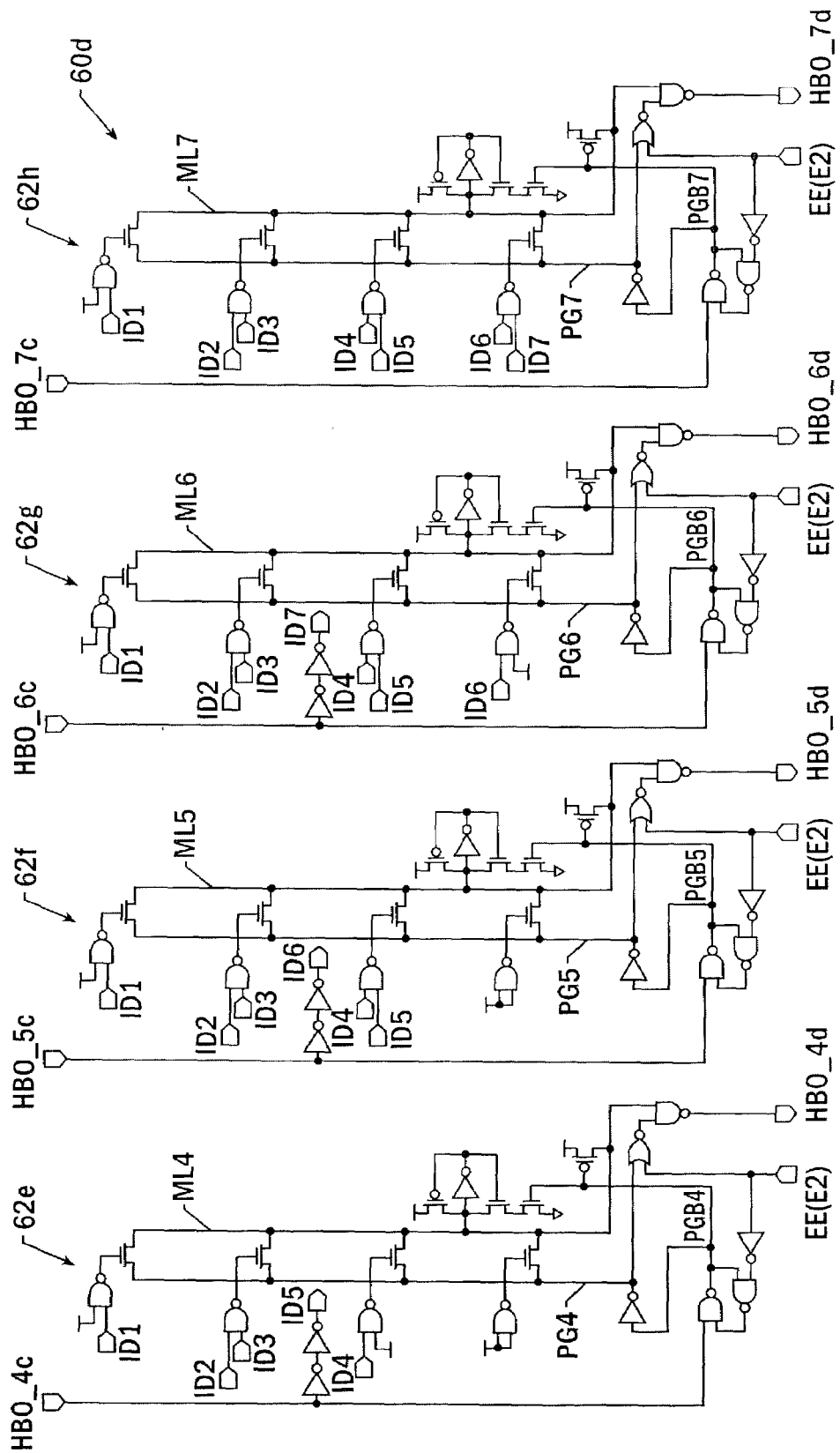

The output hit signals HBO_0c–HBO_7c from the third stage 60c may be encoded directly to identify which of the CAM array blocks 12a–12h containing at least one matching entry therein is of highest soft priority. This scenario may apply in applications where each CAM array block is required to have a unique soft priority. However, in other embodiments, the output hit signals HBO_0c–HBO_7c are provided directly to a fourth stage 60d that resolves competing hard priorities between hit signals associated with multiple CAM array blocks having the same soft priority. This fourth stage 60d, which is responsive to a fifth enable signal EE, is illustrated by FIG. 6D. The fifth enable signal EE may be generated by a self-timed signal generator and may transition high-to-low a predetermined amount time after the fourth enable signal DE switches high-to-low. The outputs of the fourth stage 60d are illustrated as HBO_0d–HBO_7d.

The entries in TABLE 6 illustrate the nine possible ways in which the output hit signals HBO_0c–HBO_7c received at the inputs of the fourth stage 60d may be resolved when multiple hit signals having the same highest soft priority are present. The designation "X" in TABLE 6 represents a "don't care" condition whereby the signal may be at a logic 0 level or a logic 1 level. In Case 1, an active hit signal HIT associated with the first CAM array block 12a wins out over all other active hit signals if the first CAM array has the highest soft priority. Thus, in Case 1, the outputs HBO_0d–HBO_7d of the fourth stage 60d will equal {0111111} whenever the inputs to the fourth stage 60d equal {0XXXXXX}. In Case 2, an active hit signal HIT associated with the second CAM array block 12b wins out over all other active hit signals if the second CAM array has the highest soft priority and no active hit signal of equivalent soft priority is present in the first CAM array block 12a. Thus, in Case 2, the outputs HBO_0d–HBO_7d of the fourth stage 60d will equal {10111111} whenever the inputs to the fourth stage 60d equal {10XXXXX}. In Case 3, an active hit signal HIT associated with the third CAM array block 12c wins out over all other active hit signals if the third CAM array has the highest soft priority and no active hit signal of equivalent soft priority is present in either the first CAM array block 12a or the second CAM array block 12b. Thus, in Case 3, the outputs HBO_0d–HBO_7d of the fourth stage 60d will equal {110111111} whenever the inputs to the fourth stage 60d equal {10XXXX}. Cases 4–8 operate in a similar manner. In the last case, Case 9, no active hit signals of any priority make it to the fourth stage 60d and, therefore, no active hit signals are present in any of the illustrated CAM array blocks 12a–12g upon completion of a search operation.

TABLE 6

| | HBO | | | | | | | | | | | | | | | |
|---|---|---|---|---|---|---|---|---|---|---|---|---|---|---|---|---|
| | Input to Fourth Stage | | | | | | | | Output from Fourth Stage | | | | | | | |
| | 0c | 1c | 2c | 3c | 4c | 5c | 6c | 7c | 0d | 1d | 2d | 3d | 4d | 5d | 6d | 7d |
| Case 1 | 0 | X | X | X | X | X | X | X | 0 | 1 | 1 | 1 | 1 | 1 | 1 | 1 |
| Case 2 | 1 | 0 | X | X | X | X | X | X | 1 | 0 | 1 | 1 | 1 | 1 | 1 | 1 |
| Case 3 | 1 | 1 | 0 | X | X | X | X | X | 1 | 1 | 0 | 1 | 1 | 1 | 1 | 1 |
| Case 4 | 1 | 1 | 1 | 0 | X | X | X | X | 1 | 1 | 1 | 0 | 1 | 1 | 1 | 1 |
| Case 5 | 1 | 1 | 1 | 1 | 0 | X | X | X | 1 | 1 | 1 | 1 | 0 | 1 | 1 | 1 |
| Case 6 | 1 | 1 | 1 | 1 | 1 | 0 | X | X | 1 | 1 | 1 | 1 | 1 | 0 | 1 | 1 |
| Case 7 | 1 | 1 | 1 | 1 | 1 | 1 | 0 | X | 1 | 1 | 1 | 1 | 1 | 1 | 0 | 1 |
| Case 8 | 1 | 1 | 1 | 1 | 1 | 1 | 1 | 0 | 1 | 1 | 1 | 1 | 1 | 1 | 1 | 0 |
| Case 9 | 1 | 1 | 1 | 1 | 1 | 1 | 1 | 1 | 1 | 1 | 1 | 1 | 1 | 1 | 1 | 1 |

The conditions illustrated by Case 1 in TABLE 6 reflect the condition whereby the inputs HBO_0c–HBO_7c to the fourth stage 60*d* equal {0XXXXXXX}. In Case 1, the hit signal HIT0 illustrated by FIG. 5 represents a hit signal generated by a first CAM array block 12*a* having a highest soft priority relative to all other CAM array blocks within the same segment. Under these conditions, an active first ID signal (ID1=0) is generated by the first column 62*a* of the fourth stage 60*d*. As illustrated in FIG. 6D-1, this first ID signal ID1 represents the output of a two-stage buffer (shown as two inverters) that receives signal HBO_0c at an input. When signal HBO_0c is switched high-to-low, the complementary pseudo-ground signal PGB0 is switched low-to-high and the pseudo-ground signal PG0 is switched high-to-low. The precharged match line ML0 associated with the first column 62*a* will not be discharged because the four NAND gates in the first column 62*a* have inputs that are hard-wired to a logic 1 level (shown as Vdd). Thus, the outputs of the four NAND gates in the first column 62*a* will all be held at logic 0 levels and the four NMOS pull-down transistors that are connected between the pseudo-ground line PG0 and the match line ML0 will remain off. Accordingly, if the signal HBO_0c received by the fourth stage 60*d* is active at a logic 0 level, then the transition of the fifth enable signal EE from high-to-low will enable the output NAND gate in the first column 62*a* to generate an active low output signal HBO_0d, which designates the first hit signal HIT0 as the hit signal having the highest soft priority through the third stage 60*c* and the highest hard priority through the fourth stage 60*d*.

As illustrated by the second-eighth columns 62*b*–62*h*, the active first ID signal (ID1=0) generated by the first column 62*a* is provided as an input to the uppermost NAND gates in the second-eighth columns 62*b*–62*h*. This active first ID signal ID1 causes the precharged match line ML1 to become discharged in the event the signal HBO_1c is active at a logic 0 level. In this manner, the active first ID signal ID1 blocks the signal HBO_1c into the second column 62*b* from being transferred as an active signal to the output HBO_1d of the second column 62*b* when the fifth enable signal EE switches high-to-low. Similarly, the active first ID signal ID1 causes the precharged match line ML2 to become discharged in the event the signal HBO_2c into the third column 62*c* is active at a logic 0 level. In this manner, the active first ID signal ID1 blocks the signal HBO_2c from being transferred as an active signal to the output HBO_2d of the second column 62*c* when the fifth enable signal EE switches high-to-low. The active first ID signal ID1 operates in a similar manner to block signals HBO_3c–HBO_7c.

Likewise, an active second ID signal ID2 (ID2=0) operates to block signals HBO_2c–HBO_7c. Thus, if signal HBO_1c is passed to the fourth stage 60*d* as an active low signal, then signal HBO_1d will always be switched low when the fifth enable signal EE switches high-to-low, unless ID1=0. The third-seventh seventh ID signals ID3–7 operate in a similar manner to block all input signals to the fourth stage 60*d* that are of lower hard priority.

Thus, as described above, content addressable memory (CAM) devices use both hard and soft priority techniques to allocate entries of different priority. The priorities of multiple CAM array blocks within the CAM device may be programmed before or as entries are loaded therein and may be reprogrammed during operation as the allocation of entries within the CAM device changes. The allocation of entries may change in response to additions or deletions of entries or as entries are reprioritized. The CAM devices include priority resolution circuits that can resolve competing soft and hard priorities between multiple hit signals that are generated in response to a search operation. Such hit signals may be treated as a "block" hit signals that are active to reflect the presence of at least one matching entry within a CAM array block. The resolution of which active hit signal has the highest overall priority among many can be used to facilitate the identification of the location (e.g., array address and row address) of a highest priority matching entry within the entire CAM device. A priority resolution circuit may also resolve competing hard priorities between two or more active hit signals having equivalent soft priority. This aspect of the priority resolution circuit is provided so that an active hit signal having a highest overall priority can be resolved whenever multiple CAM array blocks having the same soft priority are detected as having matching entries therein during a search operation.

Figure 7:
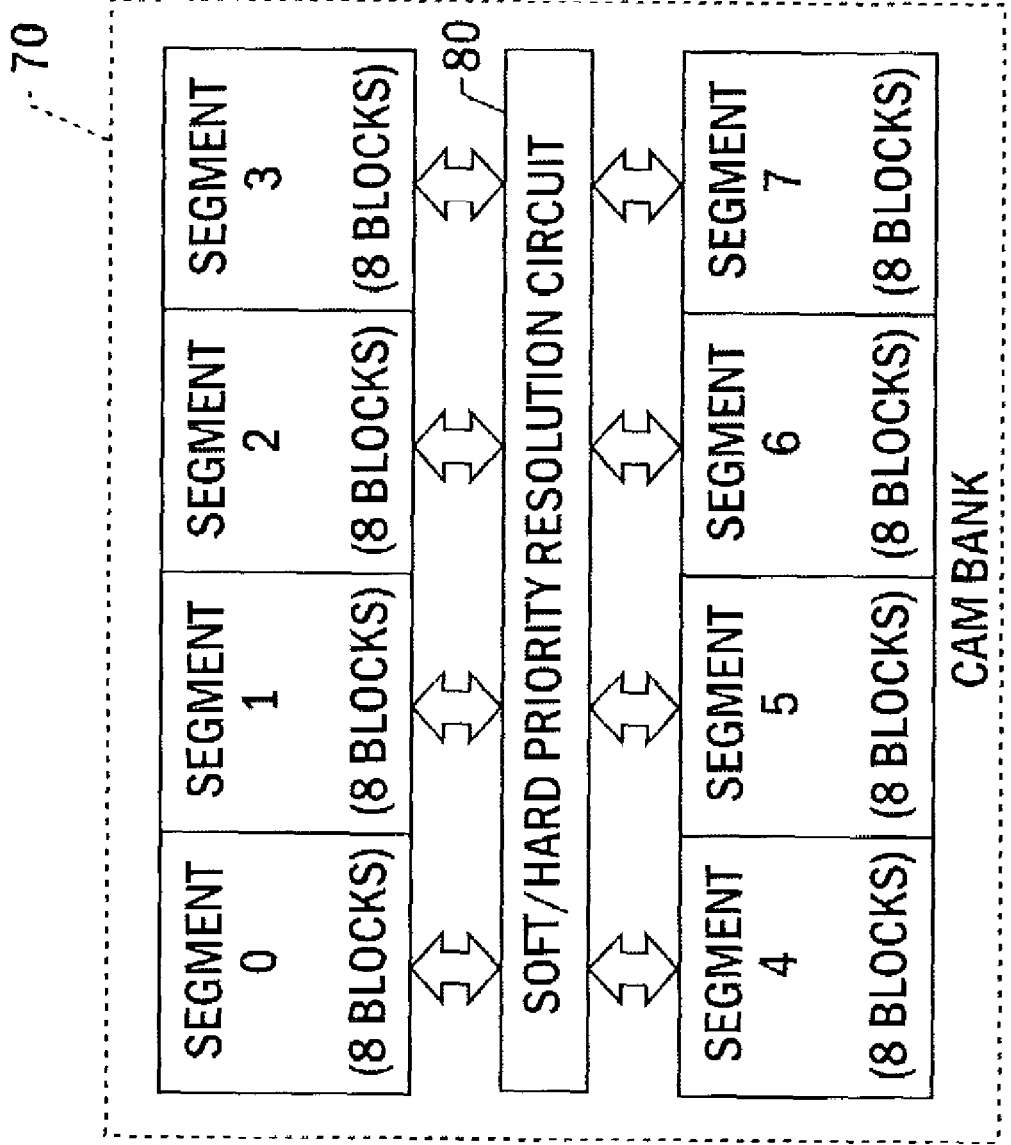
FIG. 7 is a block diagram of a CAM bank that includes a plurality of segments of CAM array blocks and a multi-segment soft/hard priority resolution circuit according to embodiments of the present invention.

According to still further embodiments of the present invention, the CAM segment and hierarchical priority resolution circuit of FIGS. 1–6 may be utilized within a CAM device having a plurality of banks of CAM array blocks therein. As illustrated by FIG. 7, an exemplary CAM array bank 70 of a multi-bank CAM device may include four top segments of CAM array blocks located adjacent one side of a soft/hard priority resolution circuit 80, shown as SEGMENTS 0–3, and four bottom segments of CAM array blocks located adjacent another side of the soft/hard priority resolution circuit 80, shown as SEGMENTS 4–7. Additional banks (not shown) may also be provided at adjacent locations on an integrated circuit chip. For example, additional banks may be provided above/and or below the illustrated bank 70 and to the right and/or left of the illustrated bank 70.

Each segment of CAM array blocks is shown as including eight CAM array blocks. Segments having a fewer or greater number of CAM array blocks and banks having a fewer or greater number of segments are also possible. The CAM array blocks within a segment may be arranged side-by-side as illustrated by the CAM array blocks 12a–12h of FIG. 5 and may have respective hard priorities assigned thereto based on physical location. Each segment of CAM array blocks may also be associated with a respective hard segment priority. For example, an upper leftmost segment of CAM array blocks, shown as SEGMENT 0, may represent the segment having the highest relative hard priority within the illustrated bank 70 and the bottom rightmost segment of CAM array blocks, shown as SEGMENT 7, may represent the segment having the lowest relative hard priority within the illustrated bank 70. Moreover, if the illustrated bank 70 represents a bank having the highest hard bank priority (e.g., BANK 0) within a multi-bank CAM device, then the CAM array blocks within the illustrated top and bottom segments of this highest priority bank 70 may be treated as having the hard priorities illustrated by TABLE 7.

TABLE 7

| SEGMENT | CAM Array Blocks | Hard Priority (HP) |
|---|---|---|
| 0 | 0–7 | 0–7 |
| 1 | 8–15 | 8–15 |
| 2 | 16–23 | 16–23 |
| 3 | 24–31 | 24–31 |
| 4 | 32–39 | 32–39 |
| 5 | 40–47 | 40–47 |
| 6 | 48–55 | 48–55 |
| 7 | 56–63 | 56–63 |

As described more fully hereinbelow with respect to FIG. 8, the illustrated soft/hard priority resolution circuit 80 may be configured to recognize all of the top segments of CAM array blocks, shown as SEGMENTS 0–3, as having higher hard priorities than any of the bottom segments of CAM array blocks, shown as SEGMENTS 4–7. Other configurations are also possible. For example, in the event a soft priority programming constraint is present that precludes multiple CAM array blocks from having the same soft priority, then the illustrated soft/hard priority resolution circuit 80 may be modified to eliminate the final hard priority resolution stage. In this case, the illustrated soft/hard priority resolution circuit 80 is treated solely as a multi-segment soft priority resolution circuit (not shown).

The soft/hard priority resolution circuit 80 may be partitioned into a plurality of segments that are aligned with corresponding segments of CAM array blocks within the illustrated bank 70. Thus, the soft/hard priority resolution circuit 80 may be partitioned into: a first segment that is responsive to active hit signals generated by SEGMENTS 0 and 4, a second segment that is responsive to active hit signals generated by SEGMENTS 1 and 5, a third segment that is responsive to active hit signals generated by SEGMENTS 2 and 6, and a fourth segment that is responsive to active hit signals generated by SEGMENTS 3 and 7. (See, also, FIGS. 16A–16B). Thus, as illustrated by FIG. 9, the soft/hard priority resolution circuit 80 may be partitioned into a first segment 80a that is coupled to one segment of CAM array blocks from the top of the bank 70 (i.e., SEGMENT 0) and also coupled to one segment of CAM array blocks from the bottom of the bank 70 (i.e., SEGMENT 4). Moreover, if the first segment 80a of the soft/hard priority resolution circuit 80 of FIG. 7 utilizes the hierarchical priority resolution circuit 60 of FIG. 6, then eight columns of the hierarchical priority resolution circuit 60 may be utilized to process eight hit signals generated by the eight CAM array blocks within SEGMENT 0 and eight additional columns of the hierarchical priority resolution circuit 60 may be utilized to process eight hit signals generated by the eight CAM array blocks within SEGMENT 4, as described more fully hereinbelow. These sixteen columns may be arranged in alternating sequence, with one column processing a hit signal generated by a CAM array block within SEGMENT 4 and the next adjacent column processing a hit signal generated by a CAM array block within SEGMENT 0.

Figure 9B:
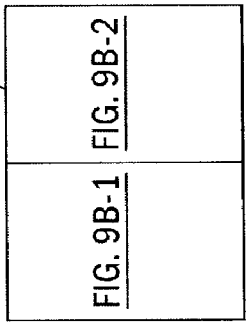
FIG. 9 is a block diagram of a first segment of the soft/hard priority resolution circuit illustrated by FIG. 7.
Figure 9C:
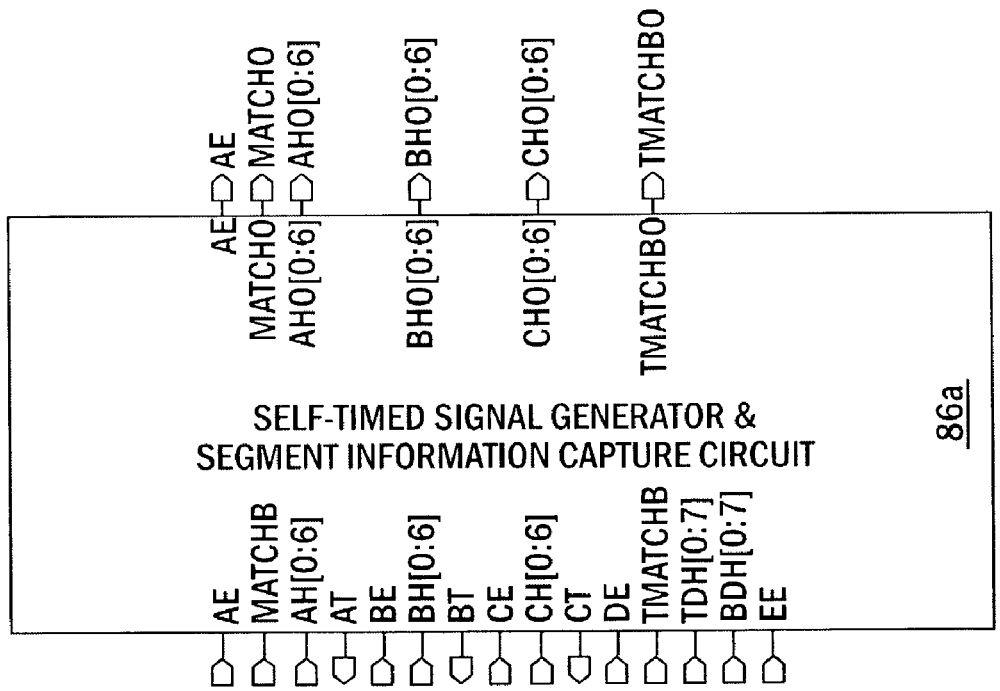
Figures 2, 9B:
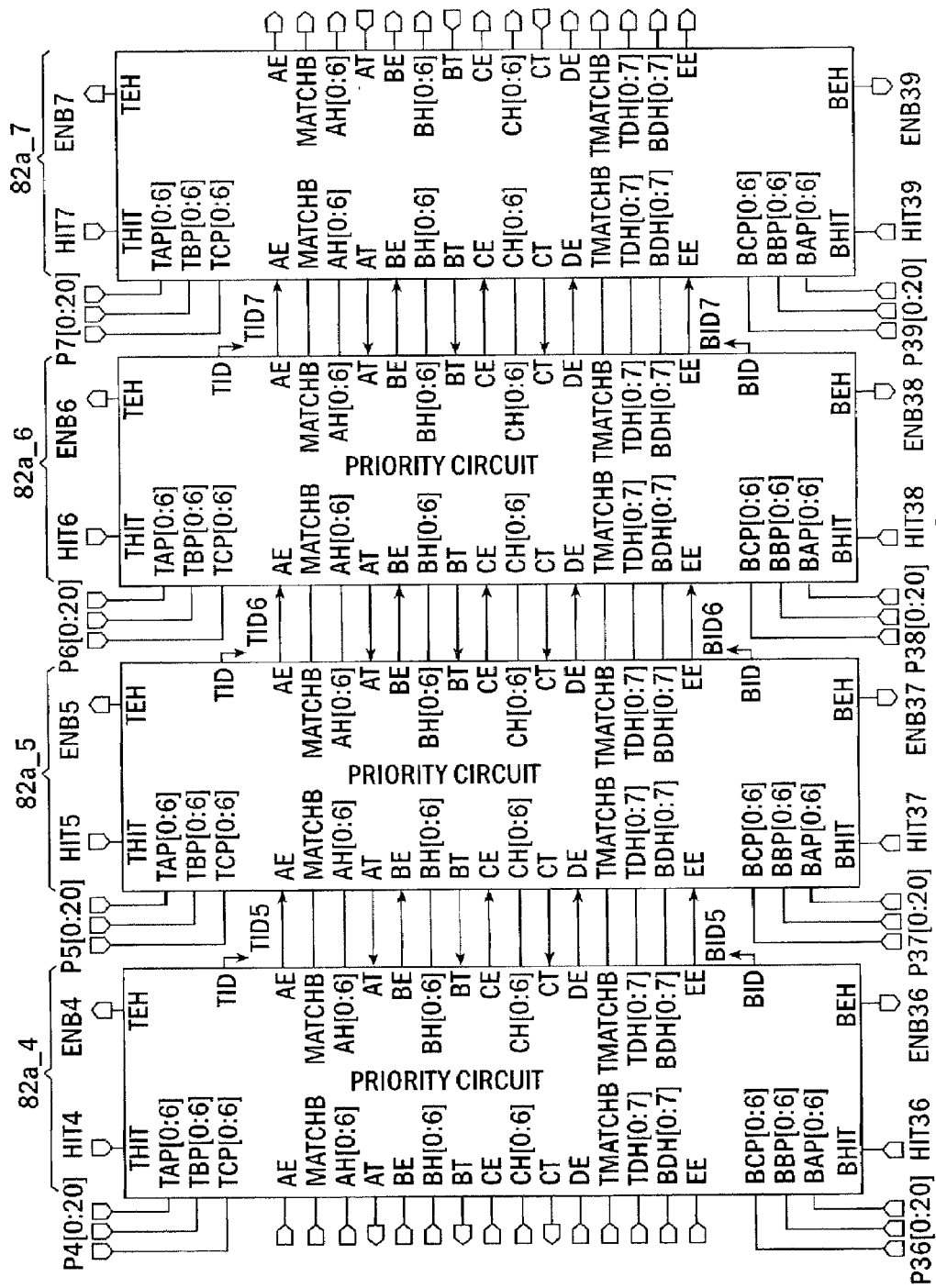
Figures 1, 10:
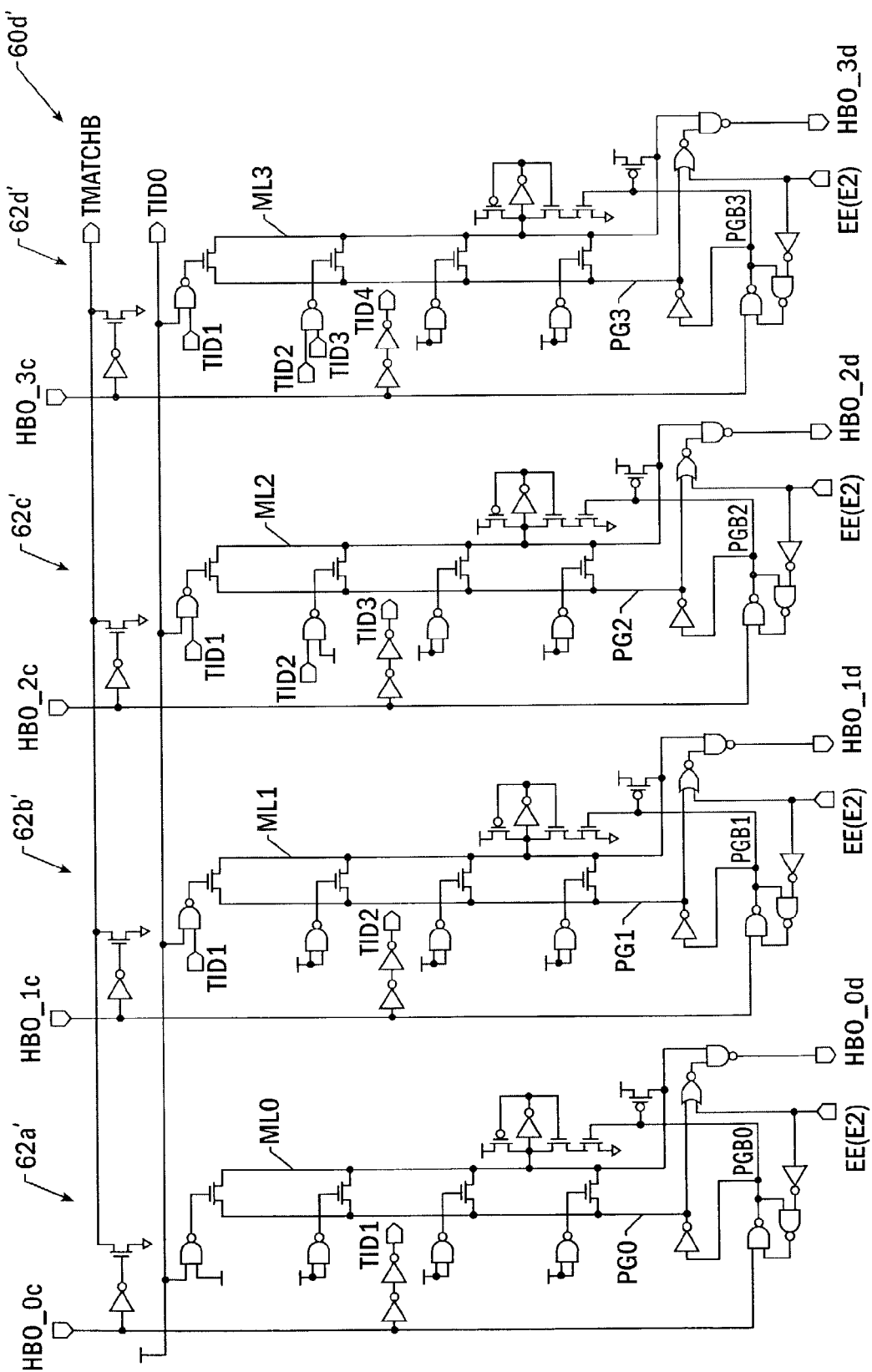
Figures 2, 10:
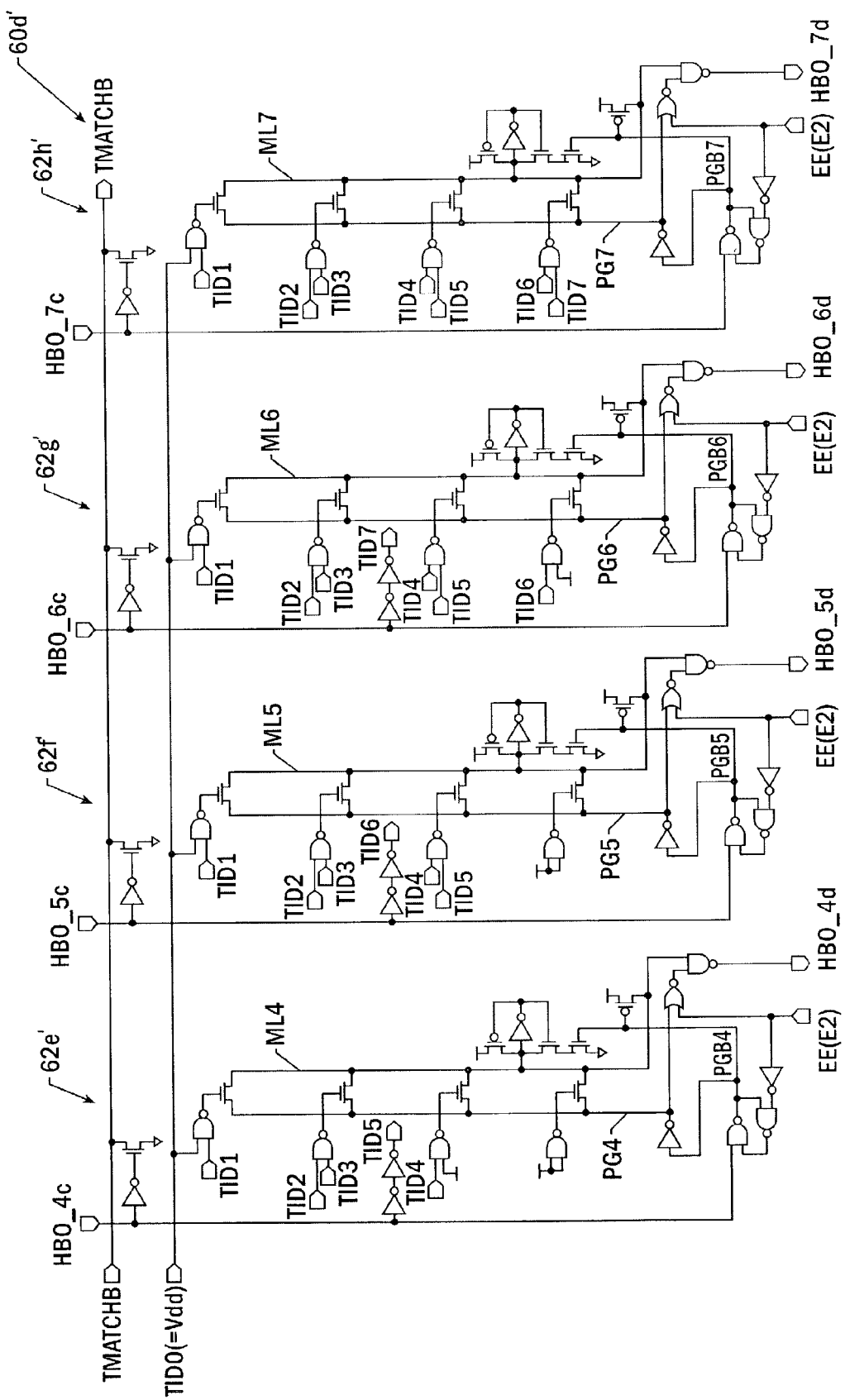

The first segment 80a of the soft/hard priority resolution circuit 80, which is illustrated by FIG. 9, includes a self-timed segment signal generator 84a, a hierarchical priority resolution circuit 82a and a self-timed signal generator and segment information capture circuit 86a, connected as illustrated. As illustrated by FIG. 9B, the hierarchical priority resolution circuit 82a may be partitioned into eight (8) hierarchical priority resolution sub-circuits 82a_0 to 82a_7. Each of the eight hierarchical priority resolution sub-circuits 82a_0 to 82a_7 includes the equivalent of two columns of the hierarchical priority resolution circuit 60 illustrated by FIG. 6 (with distinct fourth stages 60d that do not share the same hierarchical control signal lines). As illustrated more fully by FIG. 9A, the self-timed segment signal generator 84a generates the first through fifth self-timed enable signals AE–EE in response to a plurality of self-timed timing (e.g., tracking) signals, shown as AT, BT and CT. The sequential generation of the leading edges of the first through fifth self-timed enable signals AE–EE are more fully described above with respect to the sequential operations performed by the hierarchical priority resolution circuit 60 of FIG. 6. The timing signals AT, BT and CT are generated by the self-timed signal generator and segment information capture circuit 86a illustrated by FIG. 9C. For example, self-timed signal AT comes from the far end of the segment to the beginning of the segment to indicate that operations associated with the first stage are completed and operations associated with the second stage can begin. The timing sequence (of active low signals) is: AE→AT→BE→BT→CE→CT→DE→EE.

The first hierarchical priority resolution sub-circuit 82a_0 illustrated by FIG. 9B-1 is responsive to the first through fifth self-timed enable signals AE–EE. The timing of these enable signals controls the timing of the priority resolution operations, as described above with respect to FIG. 6. The first hierarchical priority resolution sub-circuit 82a_0 include inputs THIT and BHIT that receive top and bottom hit signals, shown as HIT0 and HIT32. In the illustrated embodiment, the hit signal HIT0 represents the hit signal generated by the leftmost CAM array block within SEGMENT 0 of the bank 70 and the hit signal HIT32 represents the hit signal generated by the leftmost CAM array block within SEGMENT 4 of the bank 70. Thus, as illustrated by TABLE 7, the hit signal HIT0 may be assigned a highest hard priority equal to "0" and the hit signal HIT32 may be assigned a lower hard priority of "32". The first hierarchical priority resolution sub-circuit 82a_0 also include outputs TEH and BEH that generate enable signals ENB0 and ENB32. Each of these enable signals ENB0 and ENB32 corresponds to a respective output signal (e.g., HBO_0d) generated by a respective fourth stage 60d of the hierarchical priority resolution circuit 60 of FIG. 6. These enable signals provide the output enable for row priority information generated by a respective CAM array block.

The inputs TAP[6:0], TBP[0:6] and TCP[0:6] of the first hierarchical priority resolution sub-circuit 82a_0 receive respective "top" soft priority signals. These soft priority signals are shown as P0[0:20], where TAP[0:6]=P0[0:6], TBP[0:6]=P0[7:13] and TCP[0:6]=P0[14:20]. The inputs BAP[6:0], BBP[0:6] and BCP[0:6] of the first hierarchical priority resolution sub-circuit 82a_0 also receive respective "bottom" soft priority signals. As described more fully hereinbelow with respect to FIG. 8, these top and bottom soft priority signals may be programmed into respective priority registers 52' (see also, registers 52a–52h illustrated by FIG. 5). These soft priority signals are shown as P8[0:20], where BAP[0:6]=P32[6:0], BBP[0:6]=P32[7:13] and BCP[0:6]=P32[14:20]. The soft priority signals P32[0:20] represent the soft priority signals associated with the leftmost CAM array block within SEGMENT 4 of the illustrated bank 70. As will be readily appreciated from the reference labels provided by FIG. 9B, the other hierarchical priority resolution sub-circuits 82a_1 to 82a_7 are similarly configured to respond to corresponding top and bottom CAM array blocks within SEGMENT 0 and SEGMENT 4 of the bank 70. Thus, the eighth hierarchical priority resolution sub-circuit 82a_7 is responsive to hit signals generated by the rightmost CAM array block within SEGMENT 0 and the rightmost CAM array block within SEGMENT 4. As illustrated by TABLE 7, the hit signal generated by the rightmost CAM array block within SEGMENT 0 of the bank 70 has a hard priority equal to "7" and the hit signal generated by the rightmost CAM array block within SEGMENT 4 of the bank 70 has a hard priority equal to "39". The signals generated at terminals TID, BID, MATCHB, AH[6:0], BH[6:0], CH[0:6], TMATCHB, TDH[0:7] and BDH[0:7] of the hierarchical priority resolution sub-circuits circuits 82a_0 to 82a_7 will now be more fully described with reference to FIGS. 6, 8 and 10.

Figure 8:
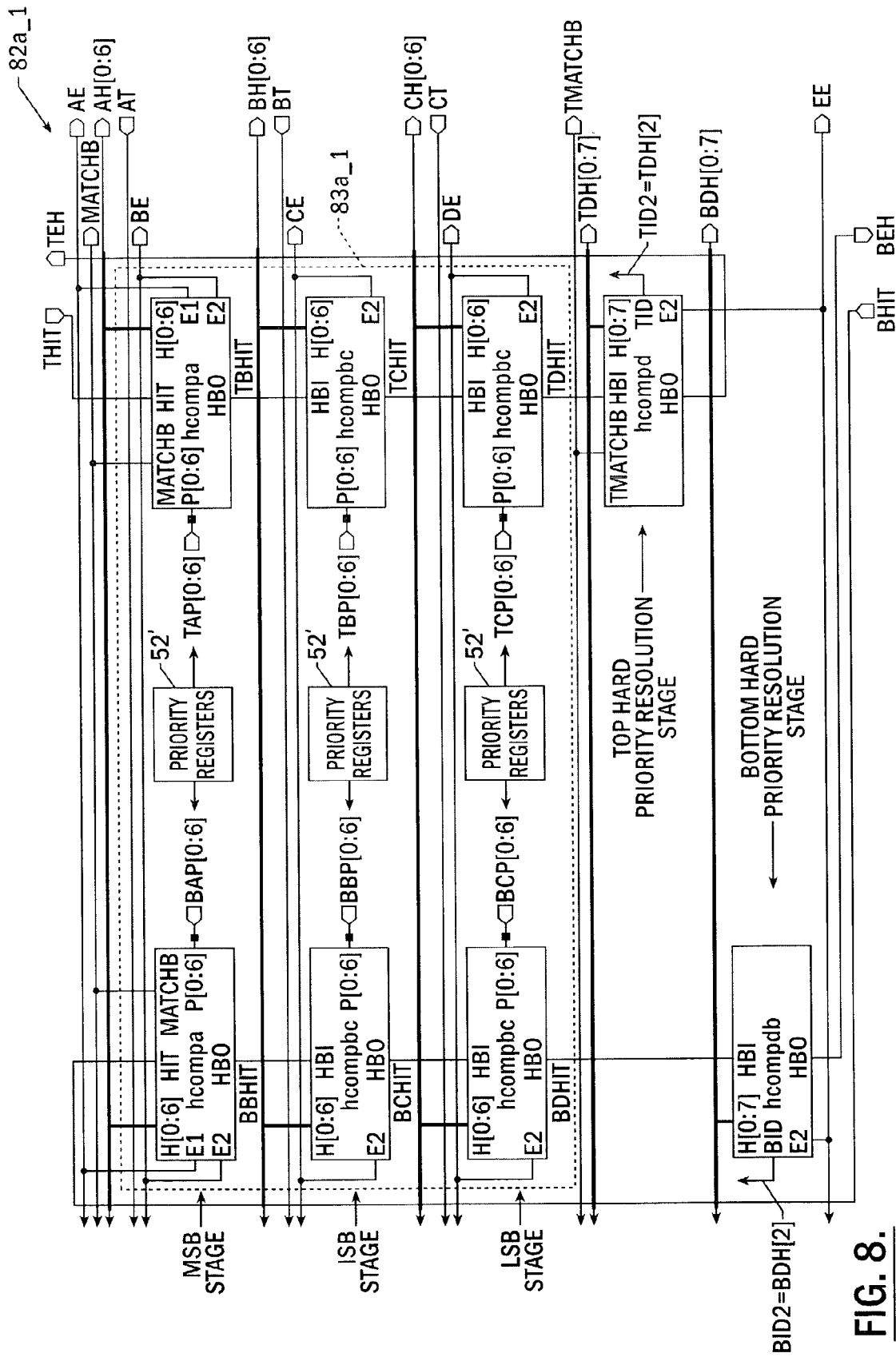
FIG. 8 is a detailed block diagram of two columns of a multi-staged hierarchical priority resolution circuit according to embodiments of the present invention.

In particular, FIG. 8 provides a more detailed schematic of a one eighth portion of the second hierarchical priority resolution sub-circuit 82a_1 of FIG. 9B. This schematic illustrates: (i) one "left side" column of a hierarchical priority resolution circuit that is associated with a second leftmost CAM array block within SEGMENT 4 of the bank 70 having a hard priority equal to "33", and (ii) one "right side" column of a hierarchical priority resolution circuit that is associated with a second leftmost CAM array block within SEGMENT 0 of the bank 70 having a hard priority of "1". Thus, the priority resolution circuit 82a of FIG. 9 may be represented by eight side-by-side copies of the hierarchical priority resolution circuit illustrated by FIG. 8.

The left side column of the hierarchical priority resolution circuit illustrated by FIG. 8 includes three "bottom" soft priority resolution stages (shown as MSB, ISB and ISB) and one final "bottom" hard priority resolution stage. These three soft priority resolution stages in the left side column are illustrated by the blocks labeled "hcompa", "hcompbc" and "hcompbc" and the final hard priority resolution stage in the left side column is illustrated by the block labeled "hcomdb". The top left side block labeled "hcompa" represents a portion of the MSB stage of the hierarchical priority resolution circuit and includes circuitry that matches a column of the hierarchical priority resolution circuit 60a illustrated by FIG. 6A-1 in a preferred embodiment. In particular, the top left side block labeled "hcompa" matches the second leftmost column illustrated by FIG. 6A-1. Similarly, the two left side blocks labeled "hcompbc" preferably include circuitry that matches the second leftmost columns illustrated by FIGS. 6B-1 and 6C-1. Accordingly, the "bottom" output signals BBHIT, BCHIT and BDHIT generated by blocks "hcompa" and "hcompbc" on the left side of FIG. 8 correspond to signals HBO_0a, HBO_0b and HBO_0c illustrated by FIGS. 6A-1, 6B-1 and 6C-1.

The bottom left side block labeled "hcompdb" preferably includes circuitry that matches the second leftmost column (column 62b) illustrated by FIG. 6D-1, which generates an ID signal BID2 at an output labeled BID (see also, Block 82a_1 in FIG. 9B-1). The ID signal BID2 generated by the bottom left side block "hcompdb" corresponds to one bit of an 8-bit bottom control signal BDH[0:7], which is shown as BDH[2]. As described more fully hereinbelow with respect to FIG. 10, the first bit of the 8-bit bottom control signal may be held at a power supply voltage (i.e., BDH[0]=Vdd). The three left side blocks labeled "hcompa" and "hcompbc" are responsive to 21 soft priority signals shown as BAP[0:6], BBP[0:6] and BCP[6:0], which are supplied by respective soft priority registers 52'. The soft priority signals BAP[6:0], BBP[0:6] and BCP[0:6] correspond to soft priority signals P1[6:0], P1[7:13] and P1[14:20] illustrated by the second leftmost columns of FIGS. 6A-1, 6B-1 and 6C-1.

Similarly, the right side column of the hierarchical priority resolution circuit illustrated by FIG. 8 includes three "top" soft priority resolution stages and one final "top" hard priority resolution stage. These three soft priority resolution stages in the right side column are illustrated by the blocks labeled "hcompa", "hcompbc" and "hcompbc" and the final hard priority resolution stage in the right side column is illustrated by the block labeled "hcompd". The top right side block labeled "hcompa" represents a portion of the MSB stage of the hierarchical priority resolution circuit and includes circuitry that matches a column of the hierarchical priority resolution circuit 60a illustrated by FIG. 6A-1 in a preferred embodiment. In particular, the top right side block labeled "hcompa" matches the second leftmost column illustrated by FIG. 6A-1. Similarly, the two right side blocks labeled "hcompbc" preferably includes circuitry that matches the second leftmost columns illustrated by FIGS. 6B-1 and 6C-1. Accordingly, the "top" output signals TBHIT, TCHIT and TDHIT generated by blocks "hcompa" and "hcompbc" on the right side of FIG. 8 correspond to signals HBO_0a, HBO_0b and HBO_0c illustrated by FIGS. 6A-1, 6B-1 and 6C-1.

Figure 10:
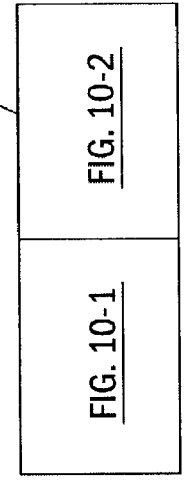
FIG. 10 is an electrical schematic of a fourth hard priority resolution stage of a hierarchical priority resolution circuit that is similar to the fourth hard priority resolution stage of FIG. 6D.

The bottom right side block labeled "hcompd" preferably includes circuitry that matches the second leftmost column (column 62b') illustrated by FIG. 10-1, which generates an ID signal TID2 at an output labeled TID (see also, Block 82a_1 in FIG. 9B-1). The ID signal TID2 generated by the bottom right side block "hcompd" corresponds to one bit of an 8-bit top control signal TDH[0:7], which is shown as TDH[2]. As described more fully hereinbelow with respect to FIG. 10, the first bit of the 8-bit bottom control signal may be held at a power supply voltage (i.e., TDH[0]=Vdd). The three right side blocks labeled "hcompa" and "hcompbc" in FIG. 8 are responsive to 21 soft priority signals shown as TAP[6:0], TBP[0:6] and TCP[6:0], which are supplied by respective soft priority registers 52'. The soft priority signals TAP[6:0], TBP[0:6] and TCP[0:6] correspond to soft priority signals P1[6:0], P1[7:13] and P1[14:20] illustrated by the second leftmost columns of FIGS. 6A-1, 6B-1 and 6C-1. Accordingly, the "soft" priority resolution circuitry associated with two of the sixteen columns of the hierarchical priority resolution circuit 82a of FIG. 9 is illustrated by the reference numeral 83a_1 in FIG. 8.

Preferred circuitry for carrying out the hard priority resolution operations of the fourth stage block "hcompd" of FIG. 8 is more fully illustrated by the second leftmost column 62b' of the fourth stage 60d' of the hierarchical priority resolution circuit of FIG. 10. The 8-bit top control signal TDH[0:7] of FIGS. 8–9 is represented by "top" ID signals TID0–TID7 in FIG. 10, where TID0=Vdd. The columns within the fourth stage 60$d'$ of FIG. 10 are similar to the columns within the fourth stage 60$d$ of FIG. 6D and the columns within the fourth stage block "hcompdb" of FIG. 8, however, an additional "top" complementary match signal line TMATCHB is provided to indicate the presence of at least one "winning" active hit signal generated by a top segment of CAM array blocks relative to a corresponding bottom segment of CAM array blocks. Thus, with respect to the first segment 80$a$ of the soft/hard priority resolution circuit 80 of FIGS. 7 and 9, which receives eight "top" hit signals THIT (i.e., HIT0–HIT7 in FIG. 9B) from the eight CAM array blocks within SEGMENT 0 and eight "bottom" hit signals BHIT (i.e., HIT32–HIT39 in FIG. 9B) from the eight CAM array blocks within SEGMENT 4, the transition of the "top" complementary match signal line TMATCHB from a precharged high level to an active low level signifies that at least one of the eight top hit signals HIT0–HIT7 has a highest soft priority relative to all of the eight bottom hit signals HIT32–HIT39 (or ties for the highest soft priority). The signal lines MATCHB and TMATCHB may be precharged high by the self-timed signal generator and segment information capture circuit 86$a$.

Accordingly, if the "top" complementary match signal line TMATCHB is switched low at the completion of a priority resolution operation, then the self-timed signal generator and segment information capture circuit 86$a$ of FIG. 9C may be configured to latch the state of the "top" complementary match signal line TMATCHB and generate an output signal (shown as TMATCHBO) that signifies whether the active hit signal having the highest overall priority (soft and hard) was generated by the top segment of CAM array blocks (when TMATCHBO=0) or the bottom segment of CAM array blocks (when TMATCHBO=1). As explained more fully hereinbelow with respect to FIGS. 11–15, additional repeater circuitry may be provided to evaluates the state of the output signal TMATCHBO when performing additional priority resolution operations on SEGMENTS 1–3 and 5–7 of the bank 70 illustrated by FIG. 7.

The self-timed signal generator and segment information capture circuit 86$a$ of FIG. 9C (and FIG. 11) may also be configured to latch in the complementary match line signal MATCHB and the hierarchical control signals AH[0:6], BH[0:6] and CH[0:6] and output these signals as input signals to the repeater circuitry. These hierarchical control signals may be treated as soft priority signals P[0:20] to a repeater circuit 88 associated with an adjacent segment(s) of CAM array blocks. This aspect of the soft/hard priority resolution circuit 80 of FIG. 7 is more fully illustrated by FIG. 11. The complementary match signal MATCHO generated at the output of the capture circuit 86$a$ illustrated by FIGS. 9C and 11 may be an active high signal that signifies the receipt by the capture circuit 86$a$ of an active low complementary match line signal MATCHB (see FIG. 6A). In particular, the capture circuit 86$a$ may latch signal MATCHB into a flip-flop and generate signal MATCHO at a complementary output of the flip-flop. In this manner, the soft/hard priority resolution circuit 80 not only resolves competing soft/hard priorities between active hit signals generated by one segment of CAM array blocks like the priority resolution circuit 60 of FIG. 6, it also resolves competing soft/hard priorities between active hit signals generated by multiple distinct segments of CAM array blocks having different segment priorities. This latter resolution may be done in a staged segment-to-segment manner across the bank 70.

Figure 11:
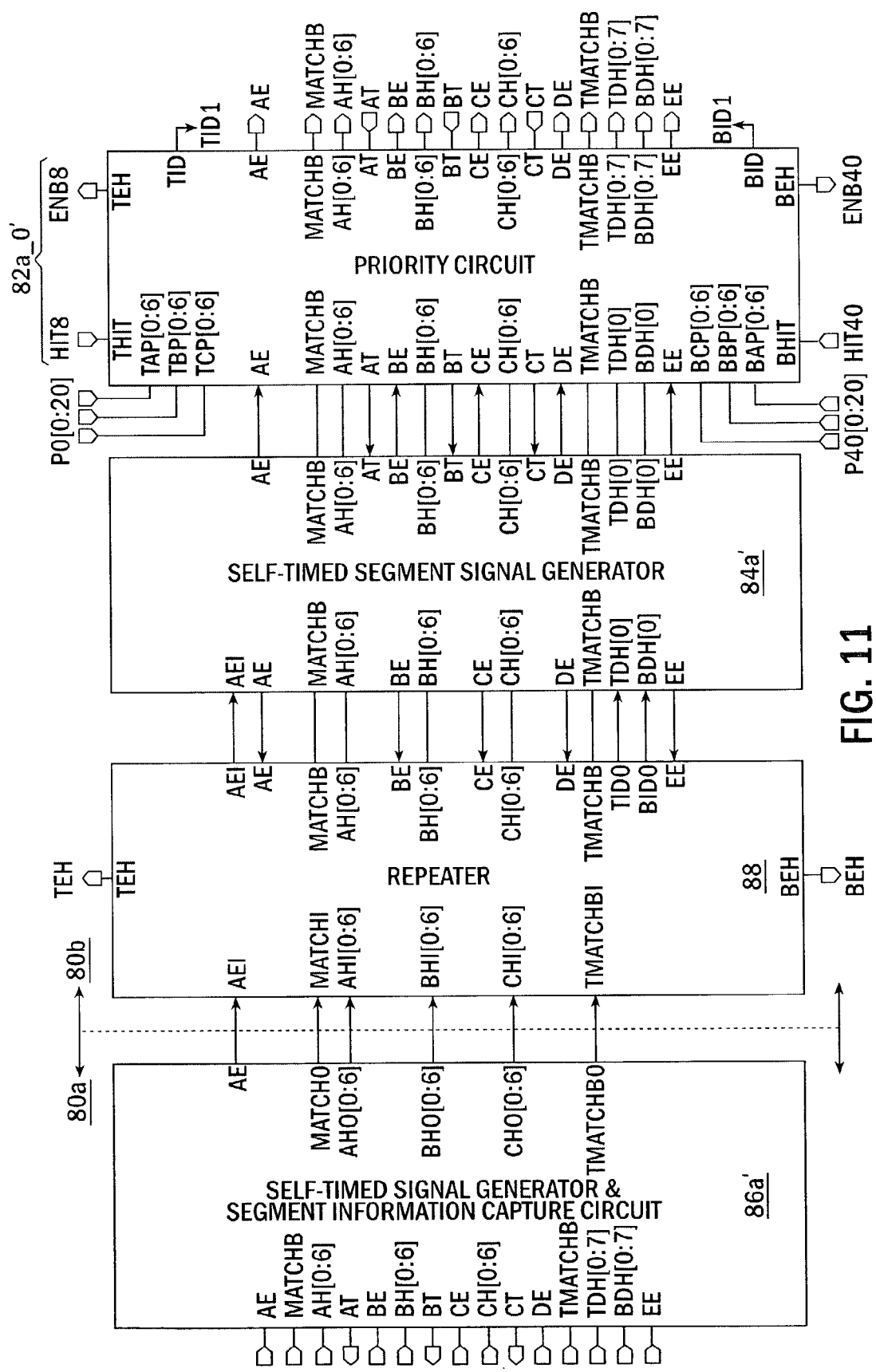
FIG. 11 is a block diagram of a portion of a second segment of the soft/hard priority resolution circuit of FIG. 7, which accepts hierarchical control signals generated by the first segment of the soft/hard priority resolution circuit of FIG. 9.
Figure 16A:
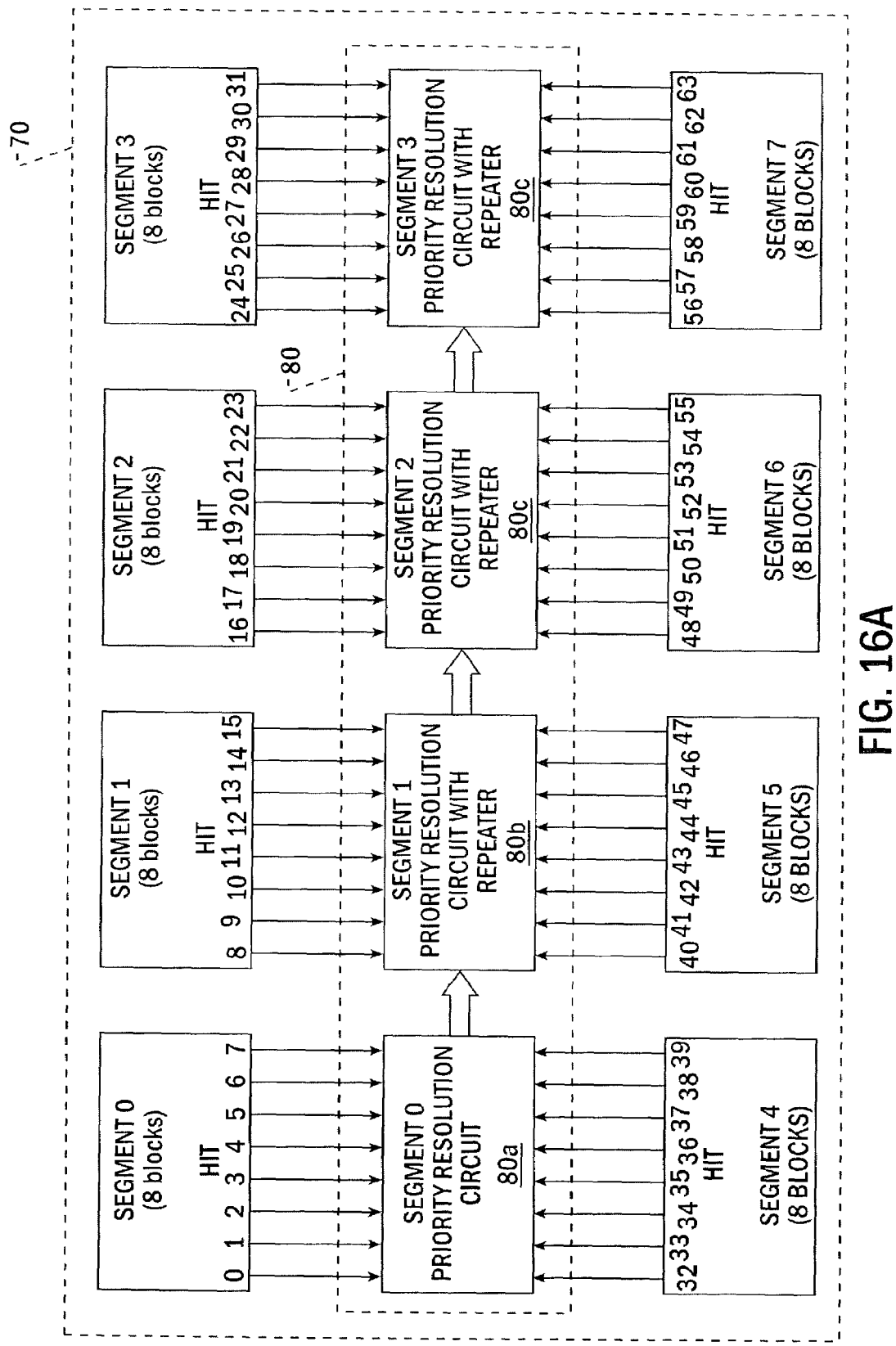
FIG. 16A is a block diagram of a CAM bank that includes a plurality of segments of CAM array blocks and a plurality of segments of a soft/hard priority resolution circuit that includes repeater circuits therein, according to embodiments of the present invention.

FIG. 11 illustrates the passing of signals (AE, MATCHO, AHO[0:6], BHO[0:6], CHO[0:6] and TMATCHBO) from the capture circuit 86$a$ associated with the first segment 80$a$ of the soft/hard priority resolution circuit 80 of FIG. 7 to a repeater circuit 88 within a second segment 80$b$ of the soft/hard priority resolution circuit 80. This second segment 80$b$ is treated herein as being associated with SEGMENTS 1 and 5 within the bank 70 of FIG. 7. Third and fourth segments 80$c$ and 80$d$ of the soft/hard priority resolution circuit 80 may be associated with SEGMENTS 2 and 6 and SEGMENTS 3 and 7, respectively, as illustrated by FIG. 16A. The illustrated portion of the second segment 80$b$ receives the three groups of hierarchical control signals AHO[6:0], BHO[0:6], CHO[0:6] from the capture circuit 86$a$ within the first segment 80$a$ and processes these signals as soft priority signals where: AHO[0:6]=P[0:6], BHO[0:6]=P[7:13] and CHO[0:6]=P[14:20].

Figures 13, 14, 15:
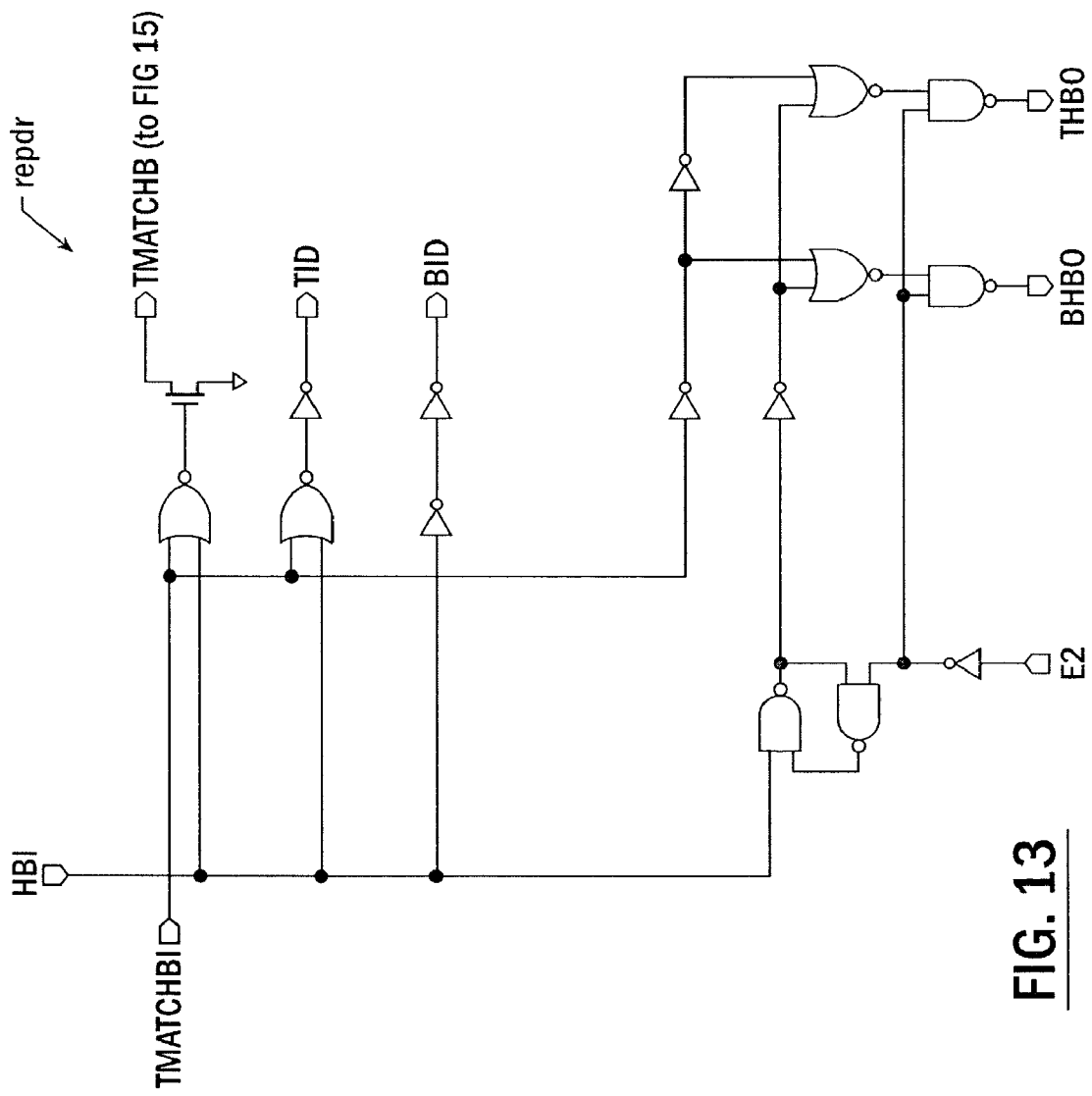
FIG. 13 is an electrical schematic of a final stage of the repeater circuit of FIG. 12.
FIG. 14 is an electrical schematic of a fourth hard priority resolution stage of the priority circuit of FIG. 11 that may be used to process active hit signals generated by CAM array blocks in a bottom segment of the CAM bank illustrated by FIG. 7.
FIG. 15 is an electrical schematic of a fourth hard priority resolution stage of the priority circuit of FIG. 11 that may be used to process active hit signals generated by CAM array blocks in a top segment of the CAM bank illustrated by FIG. 7.
Figures 1, 14:
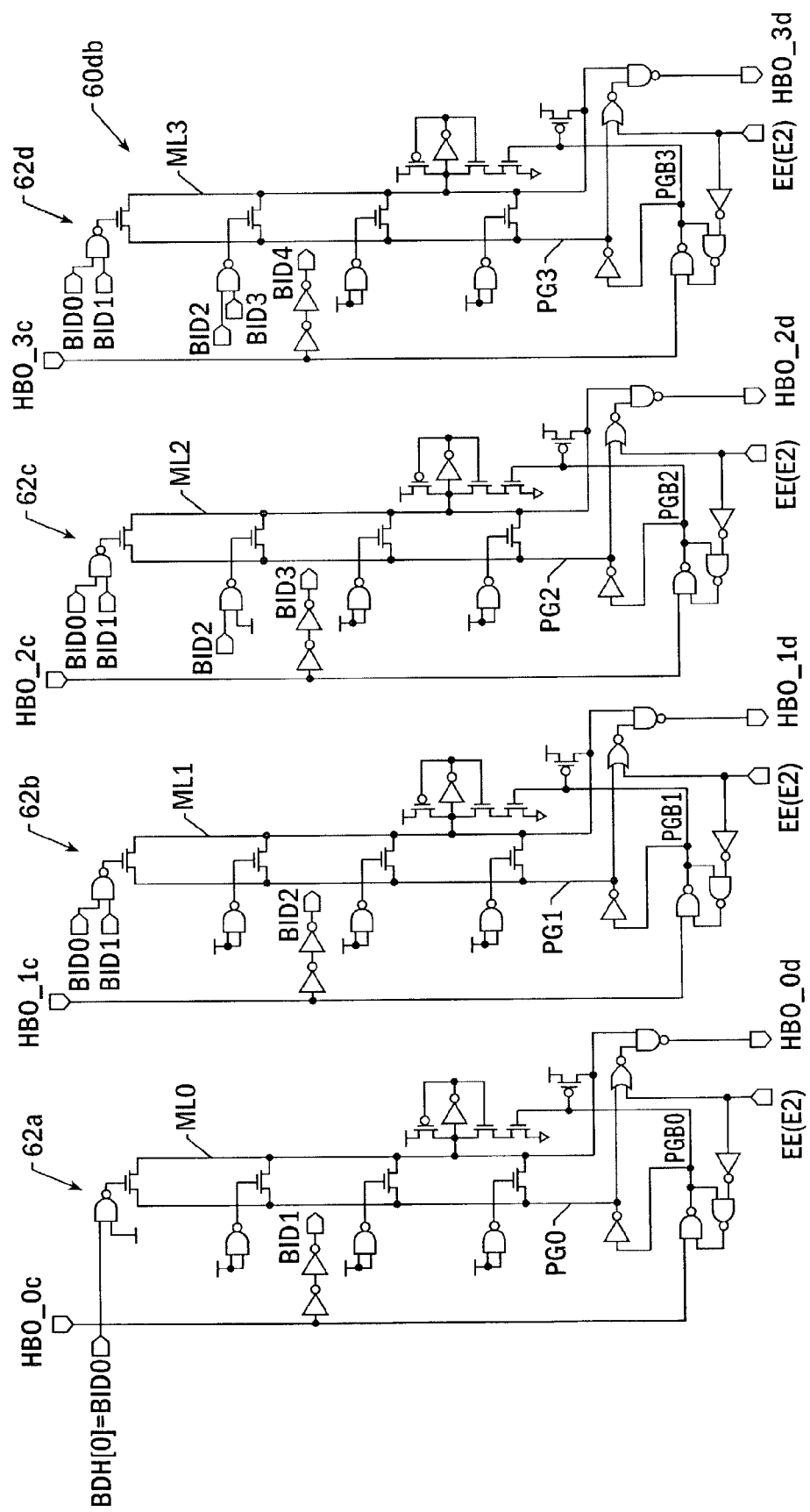
Figures 2, 14:
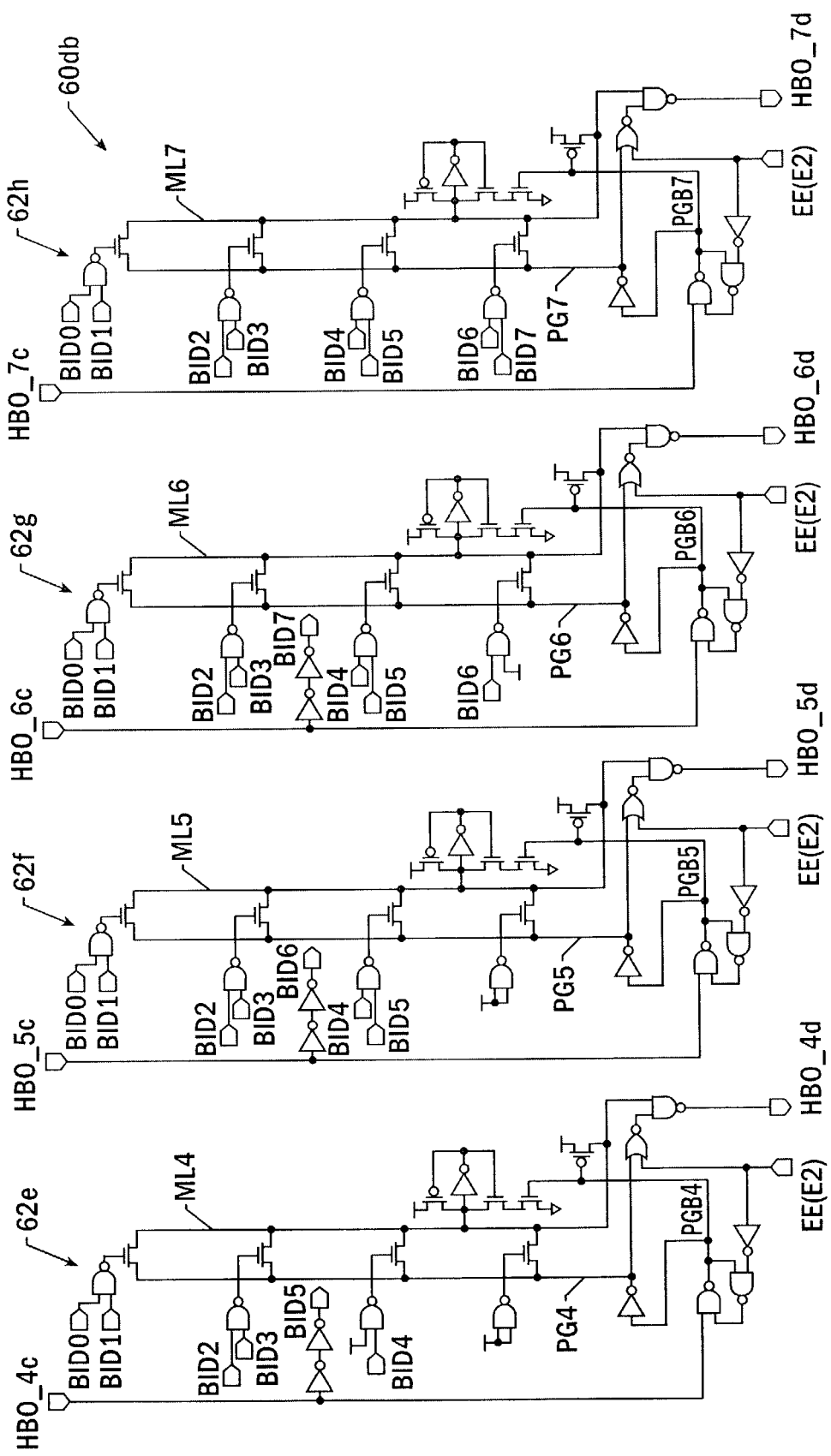
Figures 1, 15:
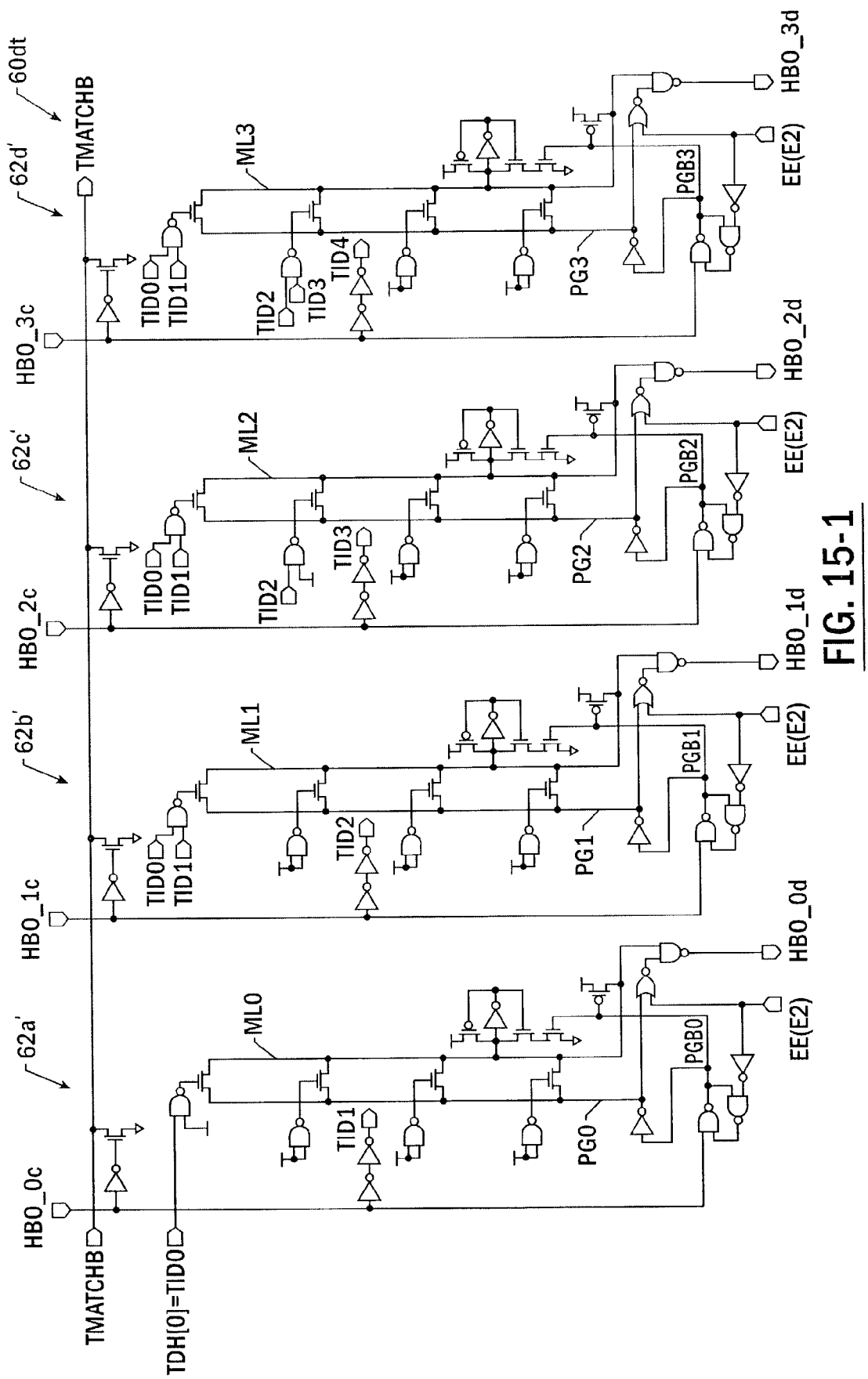
Figures 2, 15:
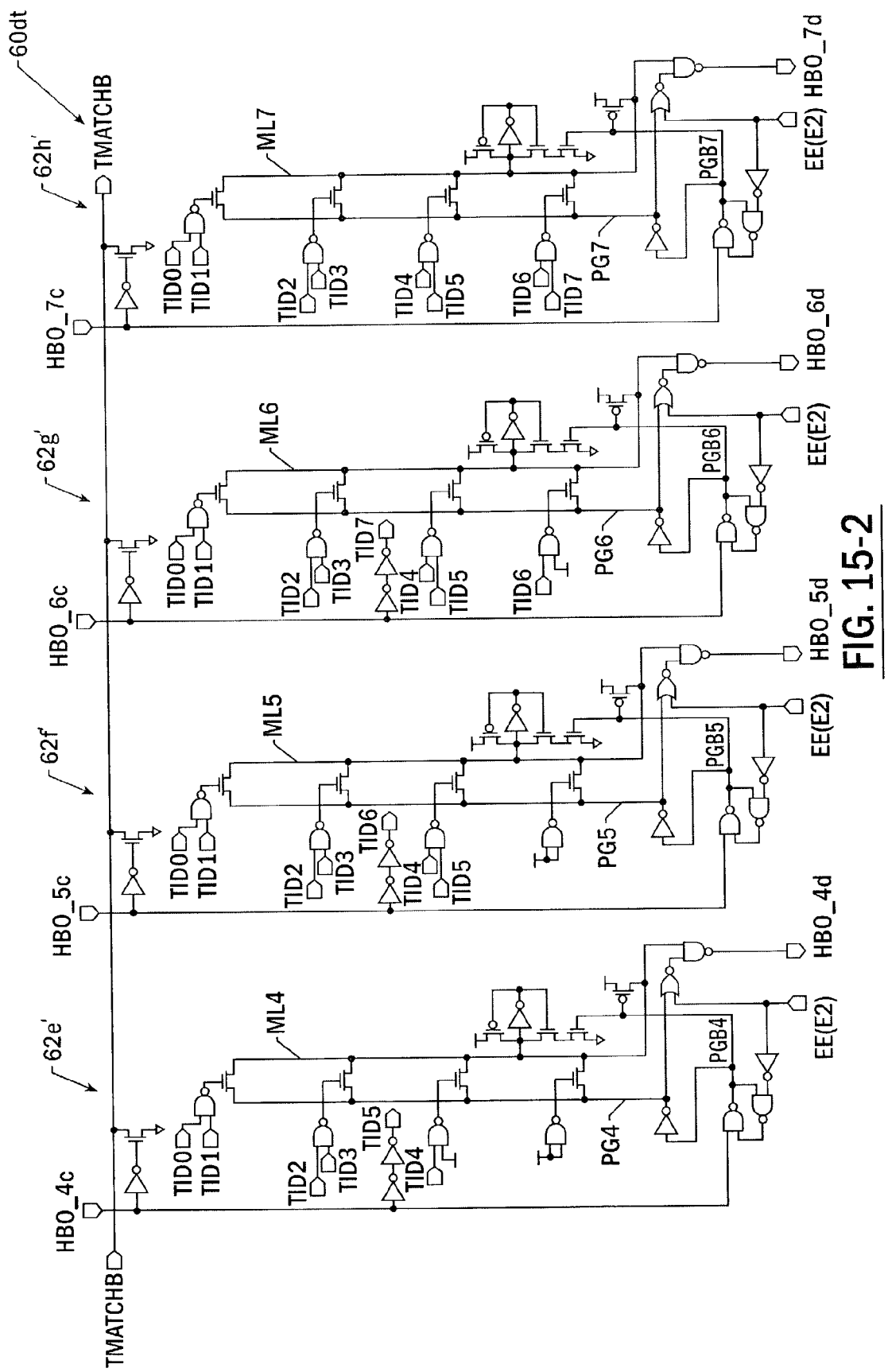

Like the self-timed signal generator 84$a$ of FIG. 9A, the self-timed signal generator 84$a'$ of FIG. 11 generates a plurality of enable signals AE–EE in response to timing signals AT, BT and CT. These timing signals are generated by a capture circuit (not shown) associated with the second segment 80$b$ of the soft/hard priority resolution circuit 80. The self-timed signal generator 84$a'$ passes top ID signal TID0 and bottom ID signal BID0 generated by the repeater 88 to corresponding inputs of the illustrated leftmost priority circuit 82$a$_0'. This priority circuit 82$a$_0' is one of eight priority circuits that are coupled to SEGMENT 1 and SEGMENT 5 within the bank 70. As identified in TABLE 7, these two segments generate eight "top" hit signals (HIT8–HIT15) and eight "bottom" hit signals (HIT40–HIT47). Accordingly, the illustrated priority circuit 82$a$_0' is receives hit signals (HIT8 and HIT40) from CAM array block 8 within SEGMENT 1 and CAM array block 40 within SEGMENT 5. The signal generator 84$a'$ also passes the hierarchical control signals AH[6:0], BH[0:6] and CH[0: 6] from corresponding outputs of the repeater 88 to inputs of the priority circuit 82$a$_0'. As described more fully hereinbelow, the bottom and top hard priority resolution stages of FIG. 8 that are within the priority circuit 82$a$_0' of FIG. 11 are illustrated by FIG. 14 and FIG. 15, respectively.

The operation of the repeater 88 of FIG. 11 in facilitating a left-to-right staged priority competition within the soft/hard priority resolution circuit 80 will now be more fully described with reference to the hierarchical block diagram of FIG. 12 and the repeater driver "repdr" of FIG. 13. The reference to "left-to-right" is merely illustrative of the left-to-right staging of the resolution circuit 80 in the illustrated embodiment and should not be construed in a limiting manner with respect to the following claims.

Figure 12:
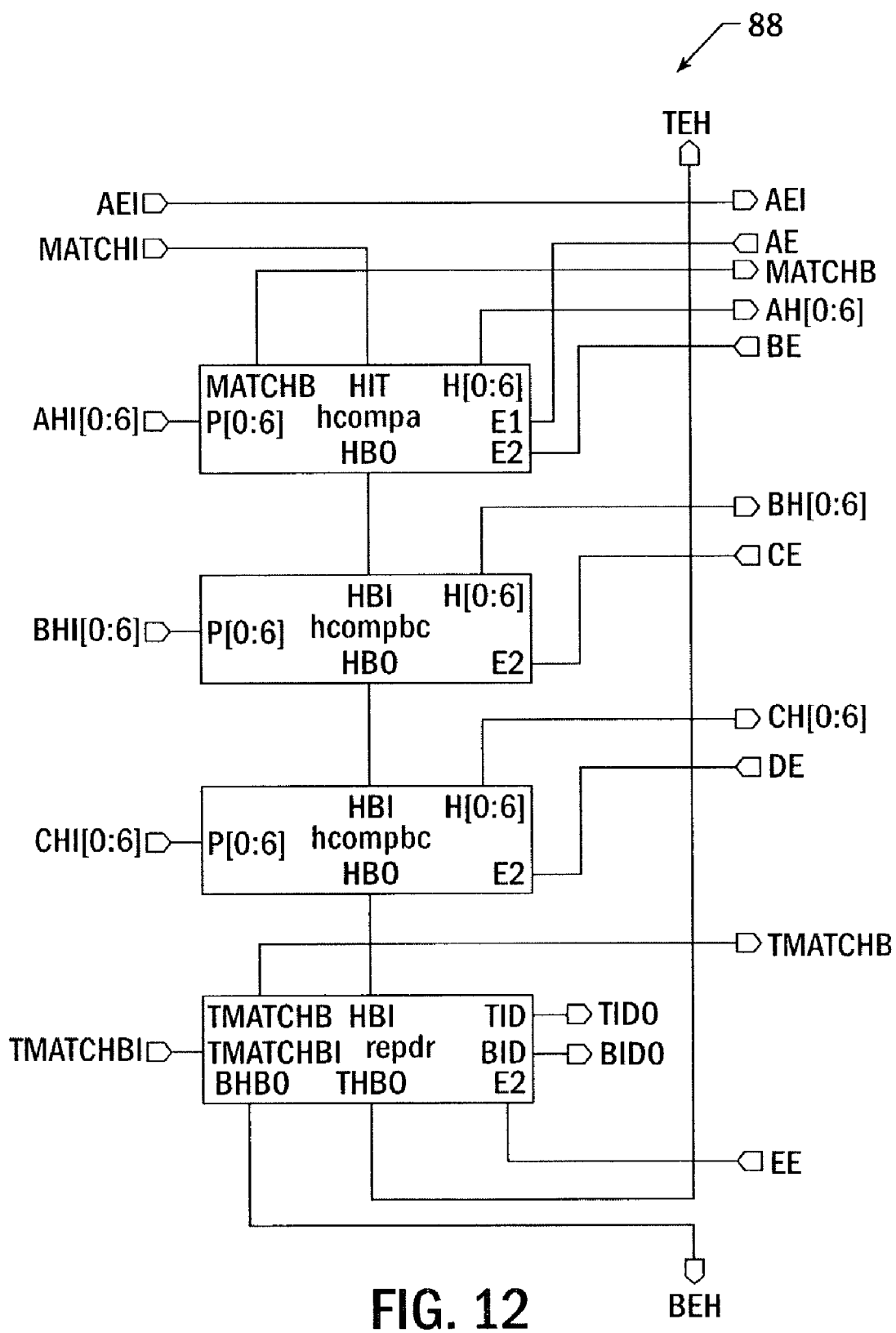
FIG. 12 is a block diagram of a repeater circuit that performs soft/hard priority resolution operations within the second segment of the soft/hard priority resolution circuit.

The hierarchical block diagram of the repeater in FIG. 12 shows three soft priority resolution stages: "hcompa," "hcompbc," and "hcompbc." These three stages operate in a manner identical to the MSB, ISB and LSB stages shown on the right hand side of FIG. 8. However, the programmable soft priority signals TAP[6:0], TBP[0:6] and TCB[6:0], which are provided by the soft priority registers 52' in FIG. 8, are replaced by the hierarchical control signals AHI[0:6], BHI[0:6] and CHI[6:0]. These hierarchical control signals represent the highest soft priority of an active hit signal generated by a CAM array block within SEGMENTS 0 and 4 of the bank 70 of FIG. 7. The bottom block in FIG. 12 is illustrated as the repeater driver "repdr" of FIG. 13. This bottom block "repdr" need not be used if a final hard priority resolution stage is not necessary because a constraint on programming soft priorities for the CAM array block is present.

The input match signal MATCHI in FIG. 12 is an active high signal that designates the presence of at least one active hit signal within SEGMENTS 0 and 4 during a search operation. The complementary top match signal TMATCHBI received by the repeater driver "repdr" is an active low signal that designates whether an active hit signal having a highest soft priority in the first segment 80a was generated by the higher hard priority top SEGMENT 0 (TMATCHBI=0) or lower hard priority bottom SEGMENT 4 (TMATCHBI=1). The repeater driver "repdr" also generates a top ID signal TID0 (=TDH[0]) and a bottom ID signal BID0 (=BDH[0]). These top and bottom ID signals are provided to the fourth stages 60tb and 60db within the priority circuit 82a_0' illustrated by FIG. 11. Each of the eight columns of the fourth stage 60tb illustrated by FIG. 15 is similar to the fourth stage "hcompd" illustrated on the right hand side of FIG. 8 and each of the eight columns of the fourth stage 60db illustrated by FIG. 14 is similar to the fourth stage "hcompdb" illustrated on the left hand side of FIG. 8.

The repeater 88 of FIGS. 11–12 operates to repeat signals in a manner that enables a staged priority competition to occur between the priority of a highest priority active hit signal generated by SEGMENTS 0 and 4 and the priorities of any and all active hit signals generated by SEGMENTS 1 and 5. The hit signals (HIT8–15 and HIT40–47) generated by the CAM array blocks within SEGMENTS 1 and 5 of the bank 70 are resolved by eight side-by-side priority circuits that include the illustrated leftmost priority circuit 82a_0' within the second segment 80b of the soft/hard priority resolution circuit 80. In the illustrated embodiment, the staged priority competition is a staged left-to-right competition between the top segments of CAM array blocks (SEGMENTS 0–3) that are arranged left-to-right in descending hard priority order and the bottom segments of CAM array blocks (SEGMENTS 4–7) that are also arranged left-to-right in descending hard priority order. This left-to-right order may also replaced by a right-to-left, top-to-bottom or bottom-to-top order in other embodiments, for example.

The significance of these top and bottom ID signals TID0 and BID0, which are generated at the outputs TID and BID of the repeater driver "repdr" of FIG. 12, will now be more fully described with reference to the detailed electrical schematic of the repeater driver that is illustrated by FIG. 13 and FIGS. 14–15. The input signal HBI to the repeater driver "repdr", which is an active low signal, designates whether the highest priority active hit signal resolved by the first segment 80a of the soft/hard priority resolution circuit 80 of FIG. 9B has a soft priority that is at least as high as or lower relative to an active hit signal(s) having a highest soft priority resolved by the soft priority stages within the second segment 80b of the soft/hard priority resolution circuit 80. If the input HBI to the repeater driver "repdr" is low, then an active hit signal generated by SEGMENT 0 or SEGMENT 4 within the bank 70 has a soft priority that is greater than or at least equal to the soft priority of a highest priority active hit signal generated by SEGMENT 1 or SEGMENT 5. Stated alternatively, if input signal HBI from the LSB stage (block "hcompbc") in FIG. 12 is low, then at least one active hit signal generated by CAM array blocks 0–7 and 32–39 has a soft priority that is greater than or at least equal to a highest priority active hit signal generated by CAM array blocks 8–15 and 40–47 in SEGMENT 1 and SEGMENT 5.

The repeater driver "repdr" evaluates the input signal HBI and the complementary top match signal TMATCHBI together. A number of examples will now be provided to fully described the operation of the repeater driver. In a first example, if HBI=TMATCHBI=0, then an active hit signal generated by top SEGMENT 0 in FIG. 7 has a higher overall priority (soft and hard) than any active hit signal generated by top SEGMENT 1 or bottom SEGMENTS 4 and 5. In this example, the repeater driver "repdr" will operate to pull the signal line TMATCHB low and drive both the outputs TID and BID low to active levels. As described more fully hereinbelow, this action will disable the stages 60db and 60dt illustrated by FIGS. 14–15. Then, upon transition of the enable signal E2 from high to low, an output signal BHB0, which is an active low signal, will be switched high and an output signal THB0, which is also an active low signal, will be switched low. As illustrated by FIG. 12, these output signals BHB0 and THB0 are provided as bottom and top enable signals BEH and TEH. As an example, if CAM array block 0 and CAM array block 39 both have a highest priority hit, then both enable signals ENB0 and ENB39 will go active and operate to send row (and index information) information from the blocks 0 and 39 through two distinct sets of global output lines (top and bottom). Using the TMATCHB signal, the first segment repeater recognizes that information on the bottom global output lines (shared by CAM array blocks 32–39) is no longer needed, so enable BEH (in FIG. 12) is inactive and enable signal TEH (in FIG. 12) is active to allow block 0–7's global output information to continue on to segment 1.

In a second example, if HBI=1 and TMATCHBI=X (1 or 0), then none of the active hit signals generated by top SEGMENT 0 or bottom SEGMENT 4 has a highest soft priority relative to the active hit signals generated by top SEGMENT 1 or bottom SEGMENT 5. Accordingly, any and all active hit signals generated by SEGMENT 0 or SEGMENT 4 can be ignored as a highest priority candidate in the staged left-to-right priority competition. In this example, the repeater driver "repdr" will not operate to pull signal line TMATCHB low and both the outputs TID and BID will be held high at inactive levels (i.e., TID0=TDH[0]=BID0=BDH[0]=1). Output signals BHBO and THBO will also be held high at inactive levels.

In a third and final example, if HBI=0 and TMATCHBI=1, then the highest priority active hit signal resolved by the first segment 80a of the soft/hard priority resolution circuit 80 was generated by the bottom SEGMENT 4. Moreover, the soft priority of this active hit signal from bottom SEGMENT 4 is at least as high as the soft priority of an active hit signal generated by top SEGMENT 1 or bottom SEGMENT 5. In this example, the repeater driver "repdr" does not operate to pull down signal line TMATCHB and the output TID is held high at an inactive level and the output BID is held low at an active level to disable the fourth stage 60db of FIG. 14. Then, upon transition of the enable signal E2 from high to low, output signal BHB0 will be switched to an active low level and output signal THB0 will be held at an inactive high level. In this third example, if the active hit signal from the bottom SEGMENT 4 has a soft priority that is higher than all of the active hit signals generated by SEGMENT 1 and SEGMENT 5, it will win this second stage of the left-to-right priority competition which is resolved by the second segment 80b of the soft/hard priority resolution circuit 80. In contrast, if the active hit signal from the bottom SEGMENT 4 has a soft priority that ties one (or more) of the active hit signals generated by SEGMENT 1 and SEGMENT 5, then the second segment 80b of the soft/hard priority resolution circuit 80 will perform additional operations to resolve the left-to-right priority competition within the second segment 80b. This priority resolution involves determining whether the active hit signal generated by bottom SEGMENT 4 has to compete against an active hit signal generated by top SEGMENT 2, in which case the active hit signal of SEGMENT 4 loses the priority competition, or has to compete against an active hit signal generated by bottom SEGMENT 5, in which case it wins the priority competition at the second stage. As will now be described, this determination of a winner at the second stage is performed by the fourth and final stages 60dt and 60db of the hierarchical priority resolution circuit 82a_0'.

These fourth "hard priority" resolution stages 60dt and 60db are illustrated by FIGS. 14–15. In particular, FIG. 14 illustrates a fourth stage 60db that can be used in conjunction with bottom SEGMENTS 5–7 of the bank 70 and FIG. 15 illustrates a fourth stage 60dt that can be used in conjunction with top SEGMENTS 1–3 of the bank 70. Accordingly, in the second segment 80b of the soft/hard priority resolution circuit 80 of FIG. 7, one pair of fourth stages 60db and 60dt is provided to process sixteen signals. Similarly, in each of the third and fourth segments (not shown) of the soft/hard priority resolution circuit 80 of FIG. 7, a respective pair of fourth stages 60db and 60dt is used.

Moreover, the fourth stage 60db of FIG. 14 is similar to the fourth stage of FIG. 6D and the fourth stage 60dt of FIG. 15 is similar to the fourth stage of FIG. 10. Nonetheless, the fourth "bottom" stage 60db of FIG. 14 and the fourth "top" stage 60dt are responsive to the bottom ID signal BID0 and the top ID signal TID0, respectively, which are generated by the repeater driver "repdr" of FIG. 13. Thus, when the bottom ID signal BID0 (BDH[0]) is active low, the fourth stage 60db of FIG. 14 is rendered inactive because each of the illustrated match lines (ML0–ML7) are electrically shorted to respective pseudo-ground lines (PG0–PG7). When the fourth stage 60db is rendered inactive, all active hit signals generated by the corresponding bottom segment (e.g., SEGMENT 5) of CAM array blocks will not be processed by the final fourth stage 60db. Accordingly, output signal lines HBO_0d–HBO_7d shown in FIG. 14 will be held at inactive high levels. Likewise, when the top ID signal TID0 (TDH[0]) is active low, the fourth stage 60dt of FIG. 15 is rendered inactive. Whenever the top ID signal TID0 is active low, the bottom ID signal BID0 will also be held at an active low level as described above with respect to FIG. 13. Thus, whenever the fourth top stage 60dt of FIG. 15 is rendered inactive, the fourth bottom stage 60db of FIG. 14 is rendered inactive as well and all active hit signals generated by the corresponding top and bottom segments (e.g., SEGMENTS 1 and 5) will not be processed to completion by the final fourth stages 60db and 60dt. Accordingly, all output signal lines HBO_0d–HBO_7d shown in FIGS. 14 and 15 will be held at inactive high levels and any and all active hit signals generated by SEGMENT 1 and SEGMENT 5 will lose the soft priority competition within the second stage 80b of the soft/hard priority resolution circuit 80.

Accordingly, CAM devices according to some embodiments of the present invention include first and second segments of CAM array blocks (e.g., SEGMENT 0 and SEGMENT 1) and a soft/hard priority resolution circuit 80 that is configured to resolve a first soft/hard priority competition between a first plurality of active hit signals generated by the first segment of CAM array blocks and is further configured to rely on an outcome of the first soft priority competition when resolving a second soft/hard priority competition between a second plurality of active hit signals generated by the second segment of CAM array blocks. Each of the plurality of segments of CAM array blocks may also be treated as including multiple segments (e.g., top and bottom segments) of CAM array blocks that share a respective segment of the soft/hard priority resolution circuit.

In still further embodiments, first and second segments of CAM array blocks and provided along with a soft priority resolution circuit. This soft priority resolution circuit is configured to resolve a first soft priority competition between a first plurality of active hit signals generated by the first segment of CAM array blocks and is further configured to rely on an outcome of the first soft priority competition when resolving a second soft priority competition between a second plurality of active hit signals generated by the second segment of CAM array blocks. This soft priority resolution circuit may or may not operate as part of a soft/hard priority resolution circuit having hard priority resolution stages therein.

Figure 16B:
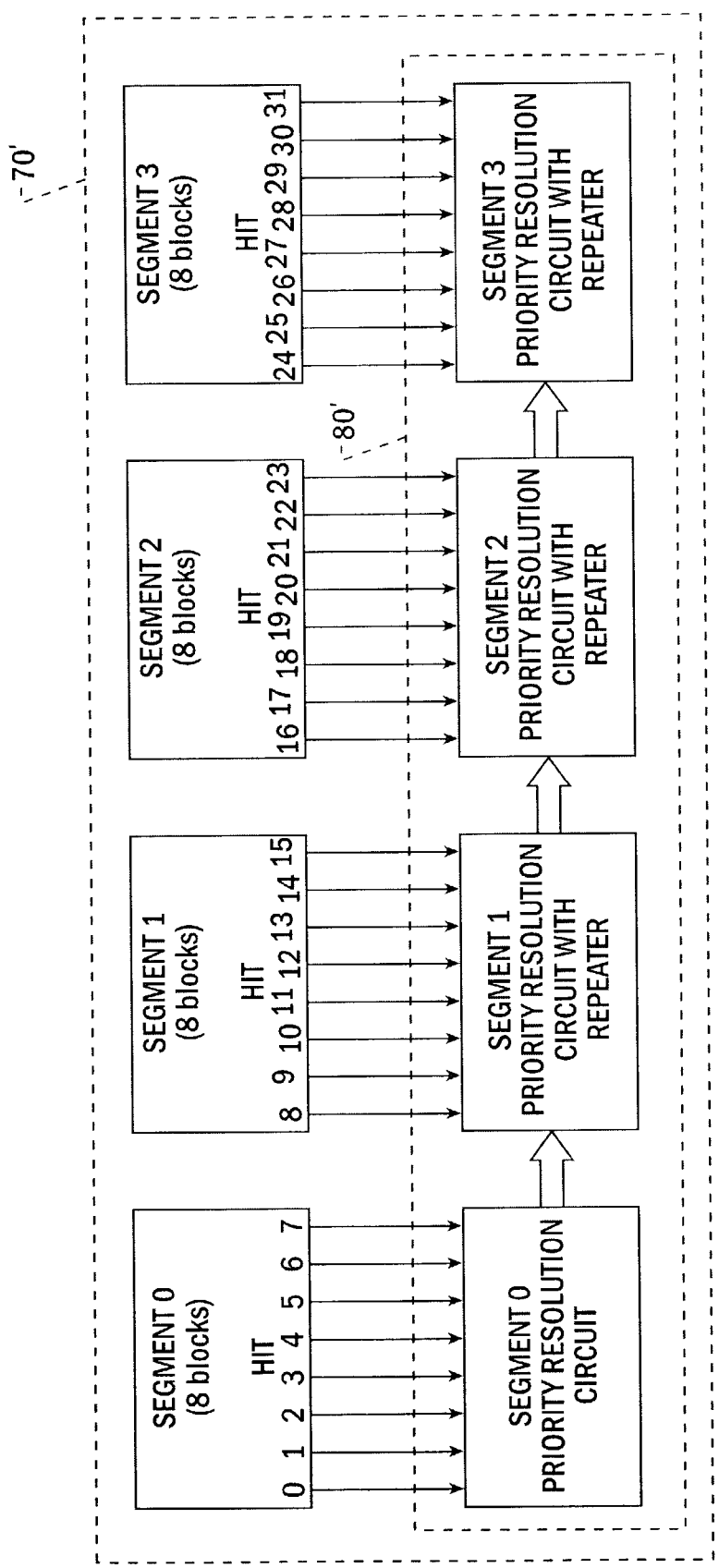
FIG. 16B is a block diagram of another CAM array bank according to embodiments of the present invention.

These embodiments of the present invention are illustrated by the above-referenced referenced figures and by FIGS. 16A–16B. In particular, FIG. 16A illustrates a bank 70 of CAM array blocks that are arranged into a plurality of segments (SEGMENT0–7). (See, e.g., FIG. 7). These CAM array blocks generate hit signals (shown as HIT0–HIT63). Some of these hit signals may be made active in response to a search operation and thereby indicate the presence of at least one matching entry within a respective CAM array block. The hit signals are provided to respective segments 80a–80d of the soft/hard (or exclusively soft) priority resolution circuit 80. The priority resolution operations may commence in SEGMENT 0 of the priority resolution circuit 80a and then transition in a segment-by-segment manner through the second, third and fourth segments (SEGMENTS 1–3) of the priority resolution circuit 80 during consecutive clock cycles. The bank 70' of FIG. 16B is similar to the bank 70 of FIG. 16A, however, the bottom CAM array blocks within SEGMENTS 4–7 are omitted. Other configurations of these circuits are also possible, as will be appreciated by those skilled in the art who have the benefit of this detailed disclosure.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A content addressable memory (CAM) device, comprising:
   a first plurality of CAM array blocks configured to generate a first plurality of active hit signals in parallel in response to a search operation;
   a second plurality of CAM array blocks configured to generate a second plurality of active hit signals in parallel in response to the search operation;
   a first priority resolution circuit configured to resolve a first soft and hard priority competition between the first plurality of active hit signals; and
   a second priority resolution circuit configured to resolve a second soft and hard priority competition between the second plurality of active hit signals in a manner that relies on an outcome of the first soft and hard priority competition to identify whether any of the second plurality of active hit signals has a higher priority than a highest priority one of the first plurality of active hit signals;

wherein said first priority resolution circuit is responsive to a first plurality of soft priority signals and is configured to generate a first plurality of hierarchical control signals in response to the first soft and hard priority competition;

wherein said second priority resolution circuit is responsive to a second plurality of soft priority signals; and wherein at least some of the second plurality of soft priority signals are derived from the first plurality of hierarchical control signals.

2. The CAM device of claim 1, wherein said second priority resolution circuit comprises a repeater circuit configured to receive the first plurality of hierarchical control signals.

3. The CAM device of claim 2, wherein the repeater circuit is responsive to a match signal that indicates a detection of at least one matching entry in said first plurality of CAM array blocks in response to the search operation.

4. The CAM device of claim 1, wherein said second priority resolution circuit comprises a repeater circuit responsive to a match signal that indicates a detection of at least one matching entry in said first plurality of CAM array blocks during the search operation.

5. The CAM device of claim 1, wherein said first plurality of CAM array blocks comprises:

a first segment of CAM array blocks disposed adjacent a first side of said first priority resolution circuit; and a second segment of CAM array blocks disposed adjacent a second side of said first priority resolution circuit.

6. The CAM device of claim 5, wherein the first and second sides are opposite each other.

7. The CAM device of claim 1, wherein said second priority resolution circuit comprises:

a repeater circuit configured to generate an ID signal; and a hard priority resolution stage that is responsive to the ID signal and is configured to be disabled when the ID signal is active.

8. The CAM device of claim 6, wherein said second priority resolution circuit comprises:

a repeater circuit configured to generate an ID signal; and a hard priority resolution stage that is responsive to the ID signal and is configured to be disabled when the ID signal is active.

9. The CAM device of claim 1, wherein said second priority resolution circuit comprises:

a repeater circuit configured to receive a first plurality of hierarchical control signals from said first priority resolution circuit; and a plurality of priority circuits electrically coupled to said repeater circuit by a second plurality of hierarchical control signal lines.

10. The CAM device of claim 9, wherein said repeater circuit comprises a first multi-staged soft priority resolution circuit.

11. The CAM device of claim 10, wherein a first of said plurality of priority circuits comprises a second multi-stage soft priority resolution circuit.

12. The CAM device of claim 11, wherein said repeater circuit is configured to generate an ID signal; and wherein the first of said plurality of priority circuits comprises a hard priority resolution stage that is responsive to the ID signal and is configured to be disabled when the ID signal is active.

13. A content addressable memory (CAM) device, comprising:

first and second segments of CAM array blocks;

a priority resolution circuit that is configured to resolve a first soft and hard priority competition between a first plurality of active hit signals generated in parallel by said first segment of CAM array blocks and is further configured to rely on an outcome of the first soft and hard priority competition when resolving a second soft and hard priority competition between a second plurality of active hit signals generated in parallel by said second segment of CAM array blocks;

wherein said priority resolution circuit is responsive to first and second pluralities of soft priority signals and is configured to generate a first plurality of hierarchical control signals in response to the first priority competition; and wherein at least some of the second plurality of soft priority signals are derived from the first plurality of hierarchical control signals.

14. The CAM device of claim 13, wherein said priority resolution circuit comprises a repeater circuit configured to receive the first plurality of hierarchical control signals.

15. The CAM device of claim 14, wherein the repeater circuit is responsive to a match signal that indicates a detection of at least one matching entry in said first segment of CAM array blocks in response to the search operation.

16. The CAM device of claim 13, wherein said priority resolution circuit comprises a repeater circuit responsive to a match signal that indicates a detection of at least one matching entry in said first segment of CAM array blocks during the search operation.

17. The CAM device of claim 13, wherein said priority resolution circuit comprises:

a repeater circuit configured to generate an ID signal; and a hard priority resolution stage that is responsive to the ID signal and is configured to be disabled when the ID signal is active.

* * * * *